United States Patent
Chan et al.

(10) Patent No.: US 10,665,697 B2
(45) Date of Patent: May 26, 2020

(54) SEMICONDUCTOR DEVICE AND METHOD

(71) Applicant: Taiwan Semiconductor Manufacturing Company, Ltd., Hsinchu (TW)

(72) Inventors: Chia-Ling Chan, New Taipei (TW); Liang-Yin Chen, Hsinchu (TW); Wei-Ting Chien, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/009,726

(22) Filed: Jun. 15, 2018

(65) Prior Publication Data
US 2019/0386118 A1    Dec. 19, 2019

(51) Int. Cl.
| | |
|---|---|
| H01L 21/32 | (2006.01) |
| H01L 29/66 | (2006.01) |
| H01L 29/78 | (2006.01) |
| H01L 21/308 | (2006.01) |
| H01L 21/324 | (2006.01) |
| H01L 21/02 | (2006.01) |
| H01L 21/306 | (2006.01) |
| H01L 21/265 | (2006.01) |

(52) U.S. Cl.
CPC .. *H01L 29/66795* (2013.01); *H01L 21/02532* (2013.01); *H01L 21/26513* (2013.01); *H01L 21/308* (2013.01); *H01L 21/30604* (2013.01); *H01L 21/324* (2013.01); *H01L 29/66492* (2013.01); *H01L 29/7834* (2013.01); *H01L 29/7856* (2013.01)

(58) Field of Classification Search
CPC combination set(s) only.
See application file for complete search history.

(56) References Cited

U.S. PATENT DOCUMENTS

| | | |
|---|---|---|
| 5,362,982 A | 11/1994 | Hirase et al. |
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |

(Continued)

*Primary Examiner* — Fernando L Toledo
*Assistant Examiner* — Valerie N Newton
(74) *Attorney, Agent, or Firm* — Slater Matsil, LLP

(57) ABSTRACT

In an embodiment, a device includes: a fin on a substrate, fin having a Si portion proximate the substrate and a SiGe portion distal the substrate; a gate stack over a channel region of the fin; a source/drain region adjacent the gate stack; a first doped region in the SiGe portion of the fin, the first doped region disposed between the channel region and the source/drain region, the first doped region having a uniform concentration of a dopant; and a second doped region in the SiGe portion of the fin, the second doped region disposed under the source/drain region, the second doped region having a graded concentration of the dopant increasing in a direction extending from a top of the fin to a bottom of the fin.

20 Claims, 50 Drawing Sheets

(56) References Cited

U.S. PATENT DOCUMENTS

| | | |
|---|---|---|
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2013/0285153 A1 | 10/2013 | Lee et al. |
| 2014/0183600 A1 | 7/2014 | Huang et al. |
| 2014/0197458 A1 | 7/2014 | Ching et al. |
| 2014/0264590 A1 | 9/2014 | Yu et al. |
| 2014/0264592 A1* | 9/2014 | Oxland ............... H01L 29/785 257/347 |
| 2015/0263003 A1 | 9/2015 | Lee et al. |

* cited by examiner

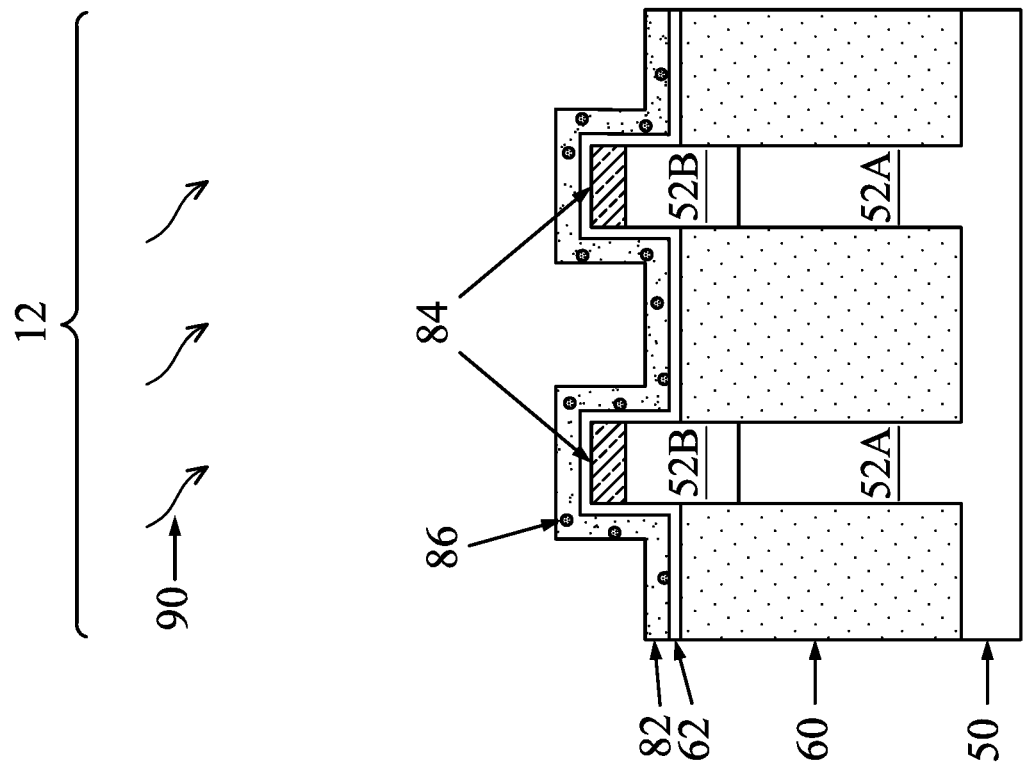
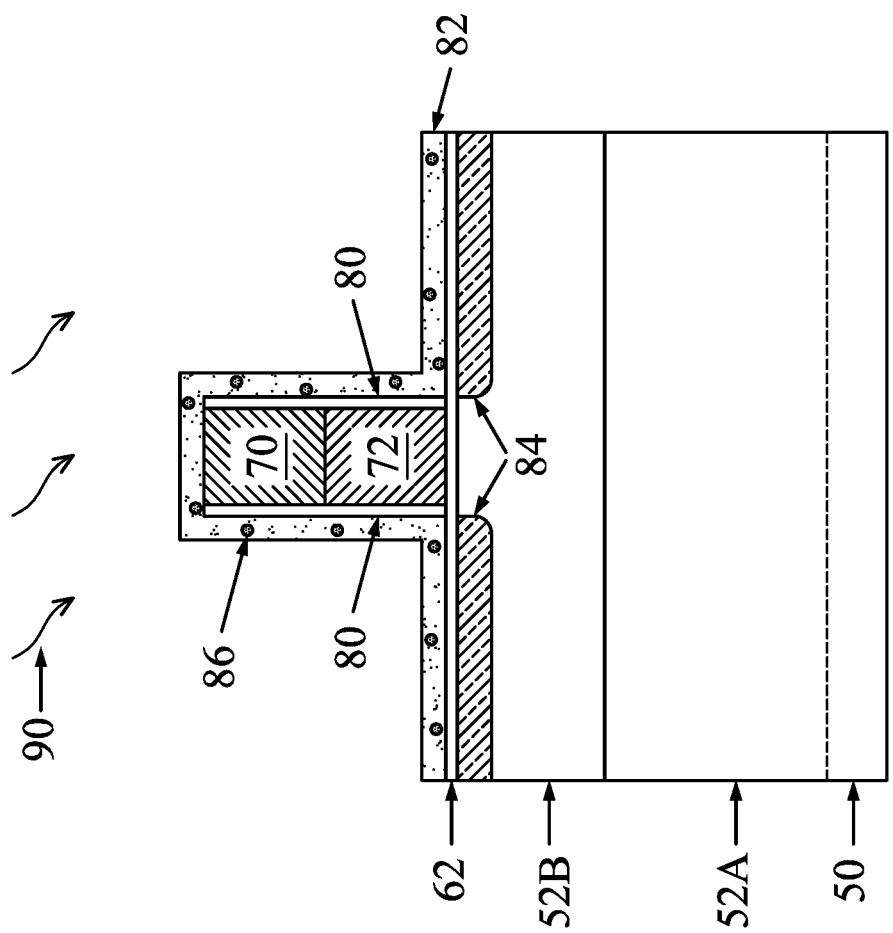
Figure 14C
Figure 14B

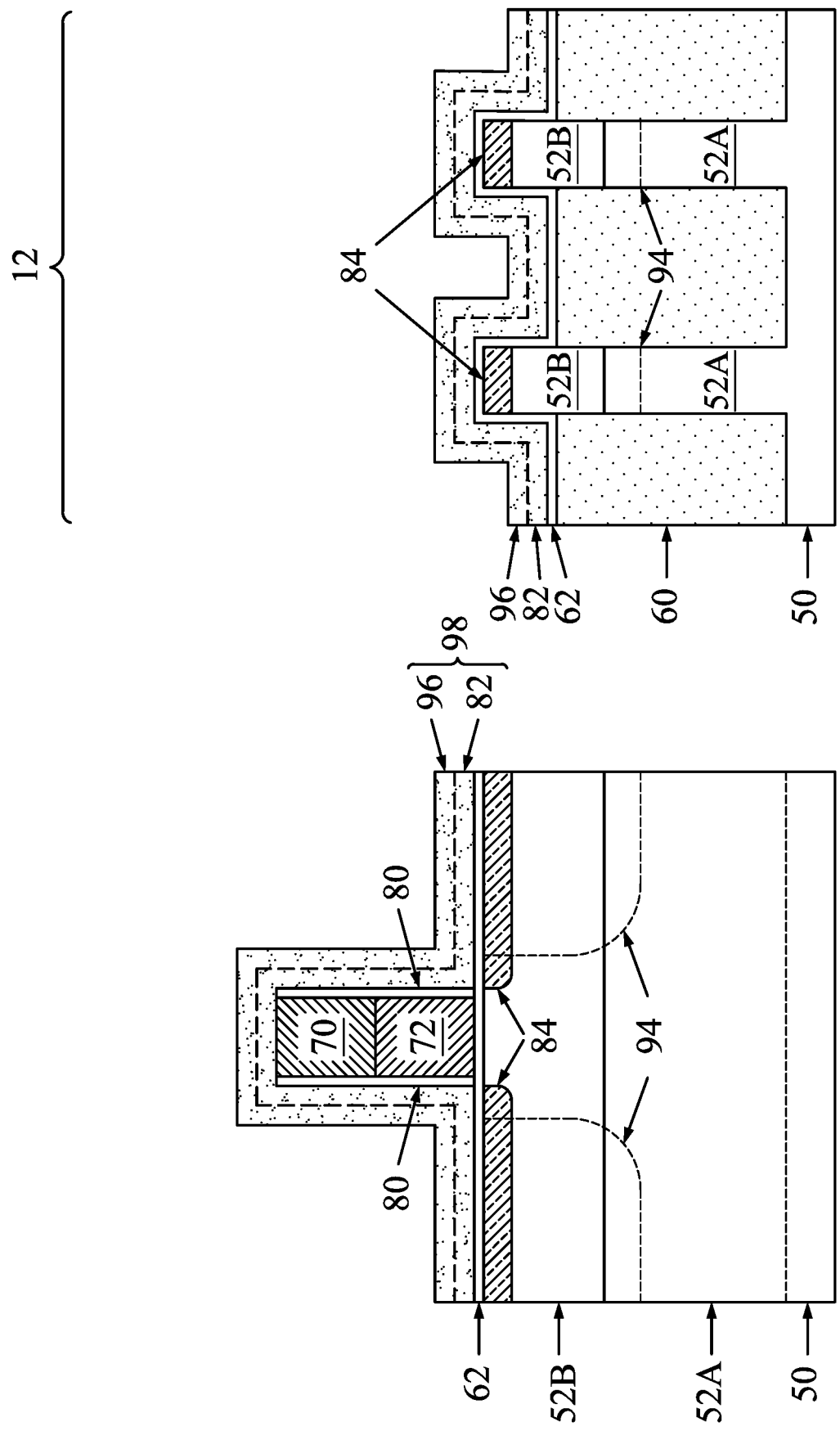

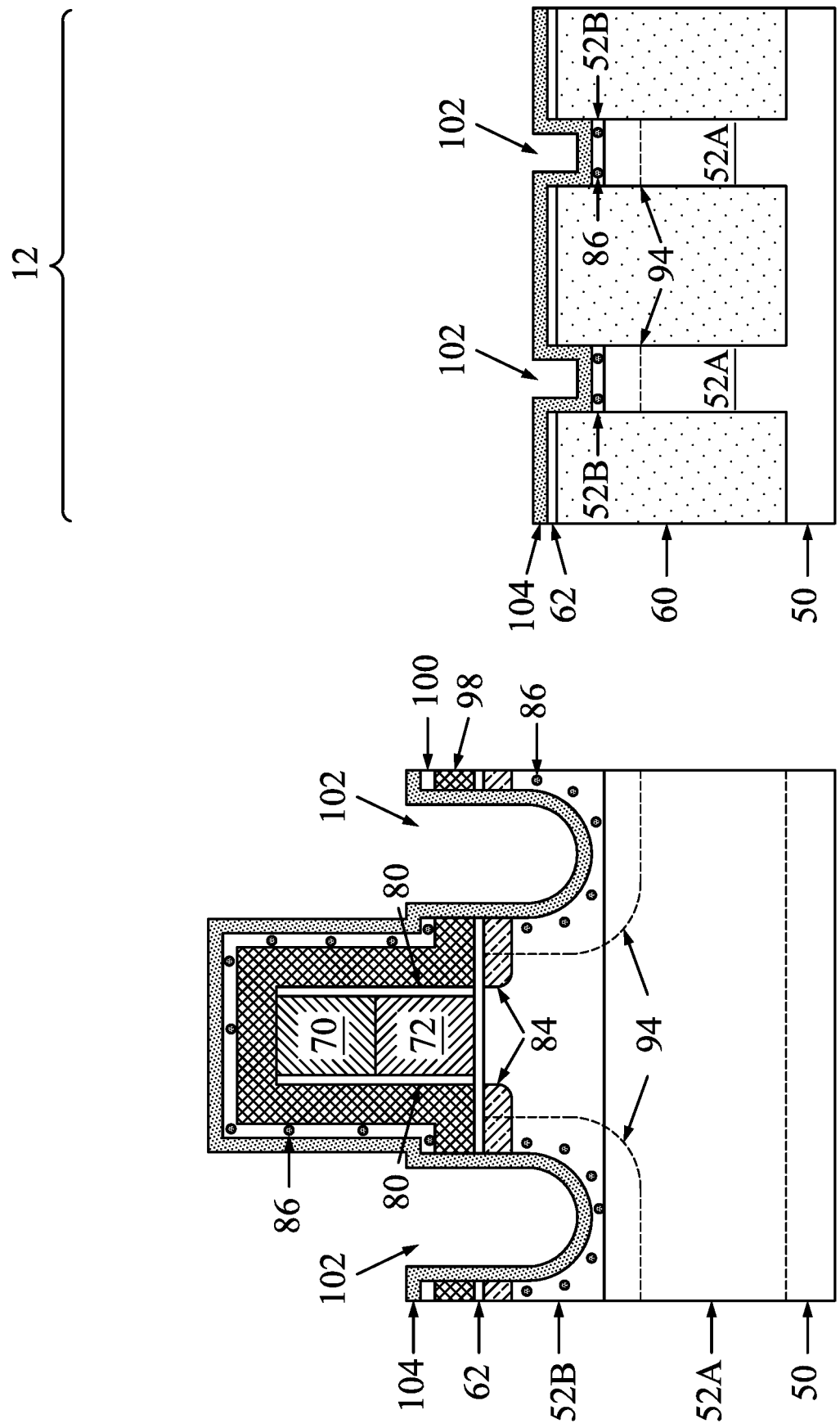

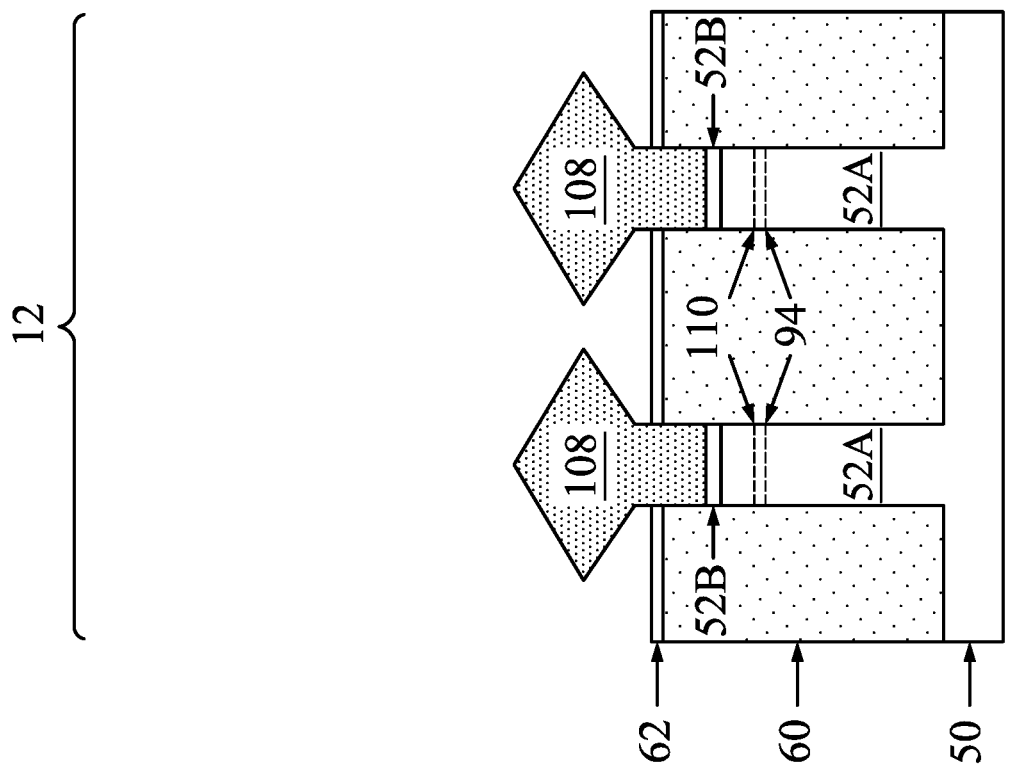
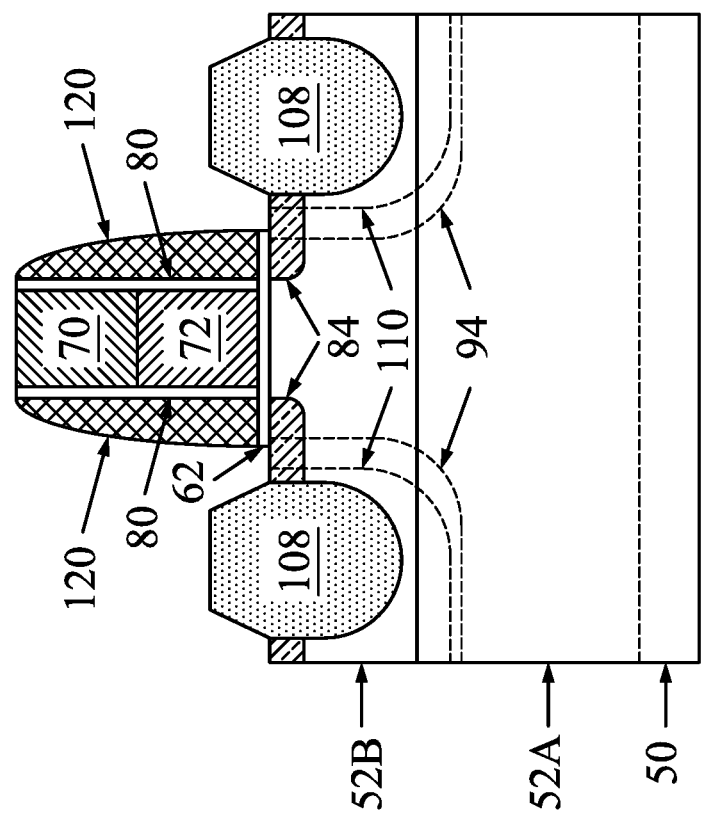
Figure 23C
Figure 23B

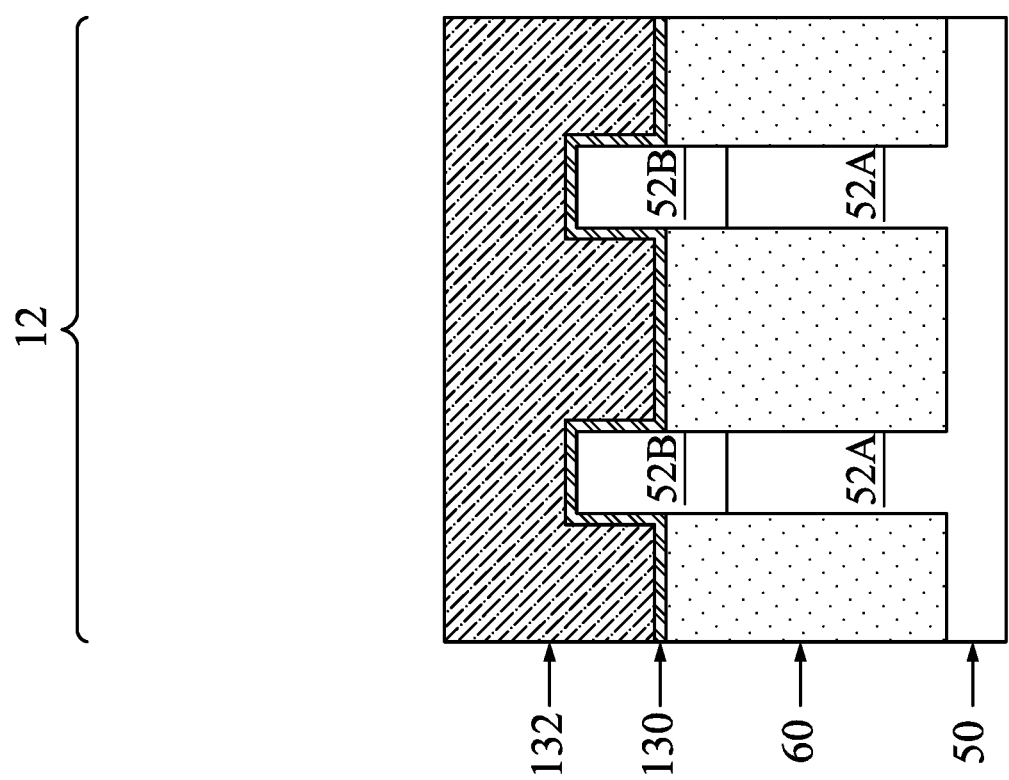

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
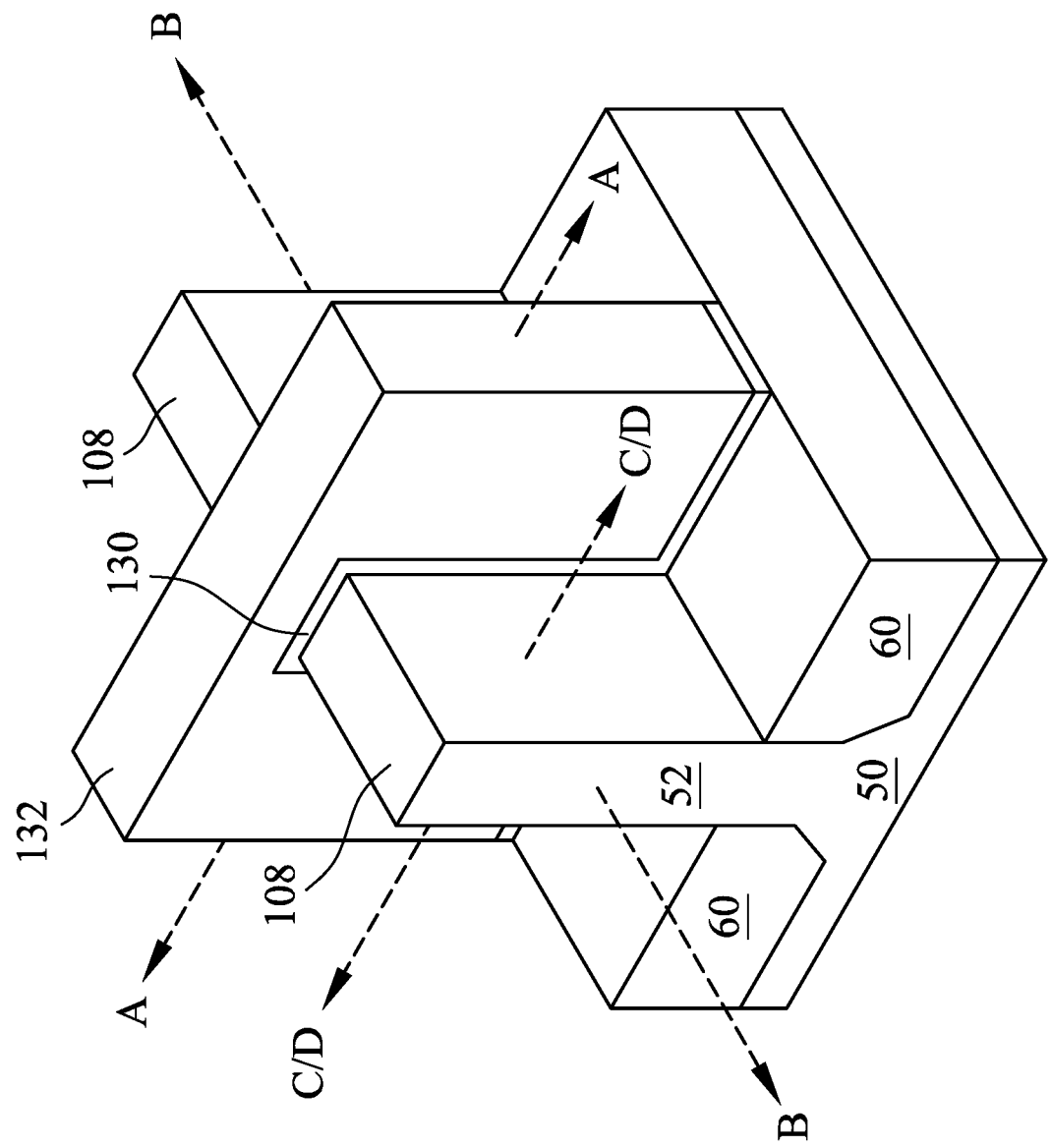
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a gate spacer layer is formed over a fin and gate stack. Lightly doped source/drain (LDD) regions are formed in the fin. Dopants are implanted in the gate spacer layer. An anneal is performed to drive the dopants into the fin, under the LDD regions. As a result of driving in dopants, portions of the fin adjacent the channel region thus have a uniform dopant distribution, which may reduce junction leakage of the resulting FinFET device. Recesses for source/drain regions are formed through the gate spacer layer and in the fin. More dopants are implanted in the exposed portions of the fin, and an epitaxy is performed to grow source/drain regions. The epitaxy includes a heating step that drives more dopants into the fin, under the source/drain regions. Portions of the fin under the source/drain regions thus have a graded dopant distribution, which may reduce power consumption of the resulting FinFET device.

FIG. 1 illustrates an example of a FinFET in a three-dimensional view, in accordance with some embodiments. The FinFET comprises a fin 52 on a substrate 50. Shallow trench isolation (STI) regions 60 are formed on the substrate 50, and the fin 52 protrudes above and from between neighboring STI regions 60. A gate dielectric layer 130 is along sidewalls and over a top surface of the fin 52, and a gate electrode 132 is over the gate dielectric layer 130. Source/drain regions 108 are disposed in opposite sides of the fin 52 with respect to the gate dielectric layer 130 and gate electrode 132. FIG. 1 further illustrates reference cross-sections that are used in later figures. Cross-section A-A is across a channel, gate dielectric layer 130, and gate electrode 132 of the FinFET. Cross-section B-B is perpendicular to cross-section A-A and is along a longitudinal axis of the fin 52 and in a direction of, for example, a current flow between the source/drain regions 108. Cross-section C/D-C/D is parallel to cross-section A-A and extends through a source/drain region 108 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2-7 are cross-sectional views of intermediate stages in the manufacturing of FinFETs, in accordance with some embodiments. FIGS. 2 through 7 are shown along reference cross-section A-A illustrated in FIG. 1, except for multiple fins/FinFETs.

Figure 2:
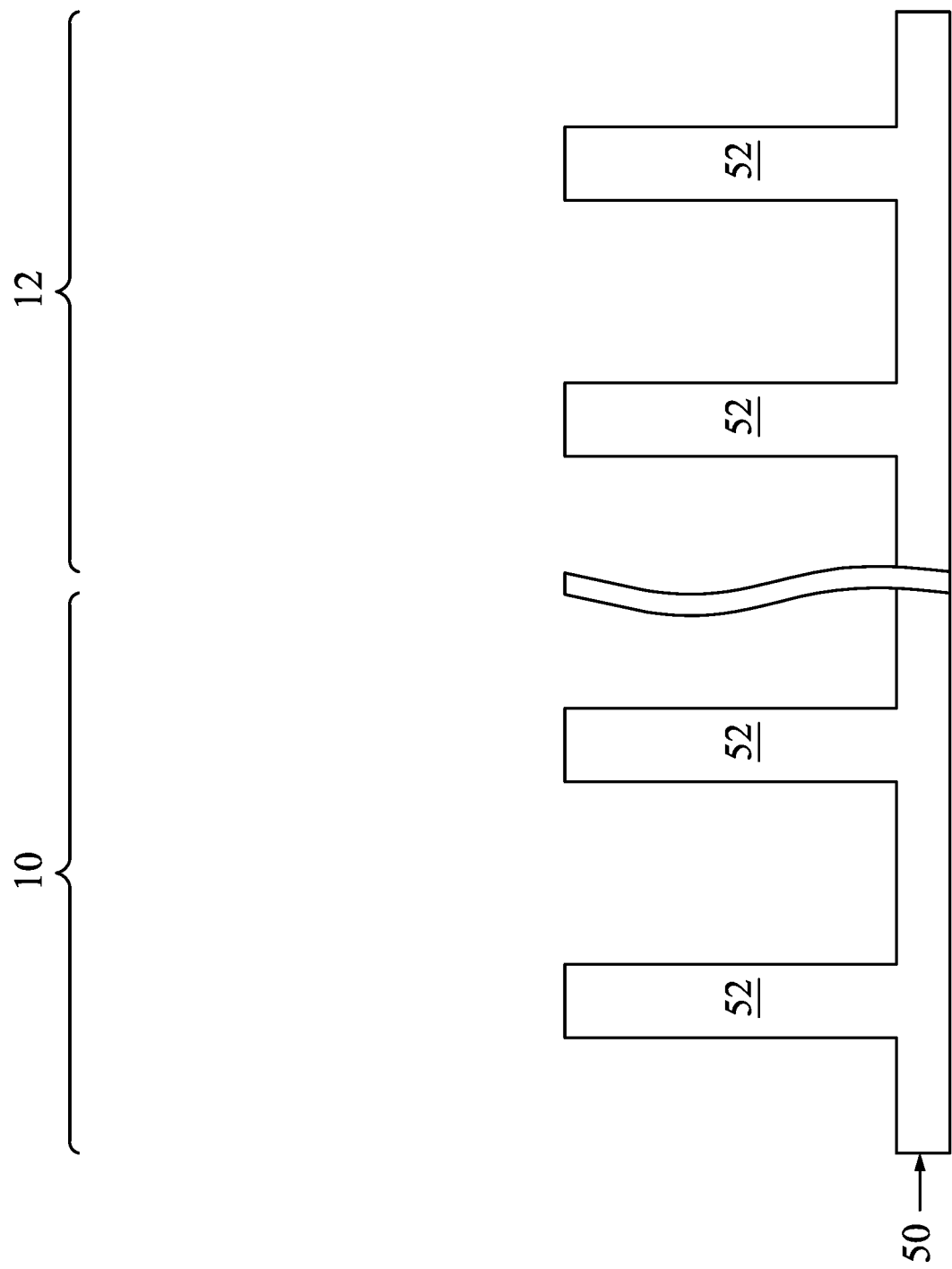
FIGS. 2 through 28C are cross-sectional views of intermediate stages in the manufacturing of FinFETs, in accordance with some embodiments.

In FIG. 2, fins 52 are formed in a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In a particular embodiment, the substrate 50 is a silicon substrate.

The substrate 50 has a region 10 and a region 12. The region 10 can be for forming n-type devices, such as NMOS transistors, e.g., n-type FinFETs. The region 12 can be for forming p-type devices, such as PMOS transistors, e.g., p-type FinFETs. The region 10 may be physically separated from the region 12 (as illustrated by a divider), and any number of device features (e.g., other active devices, doped regions, isolation structures, etc.) may be disposed between the region 10 and the region 12. In some embodiments, both the region 10 and the region 12 are used to form the same type of devices, such as both regions being for n-type devices or p-type devices.

The fins 52 are semiconductor strips and may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 3:
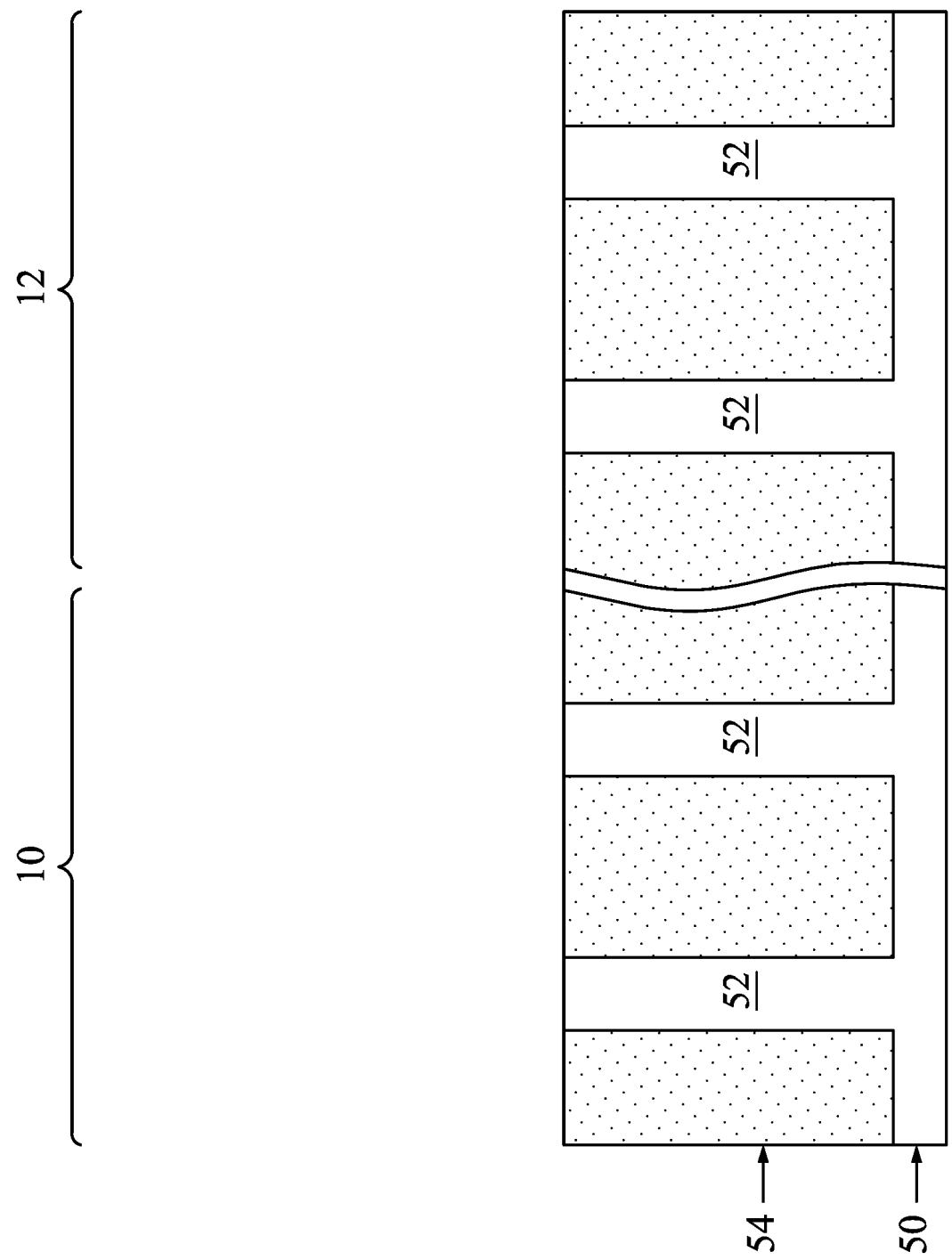

In FIG. 3, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess portions of the insulation material 54 covers the fins 52. A planarization process is then applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process.

Figure 4:
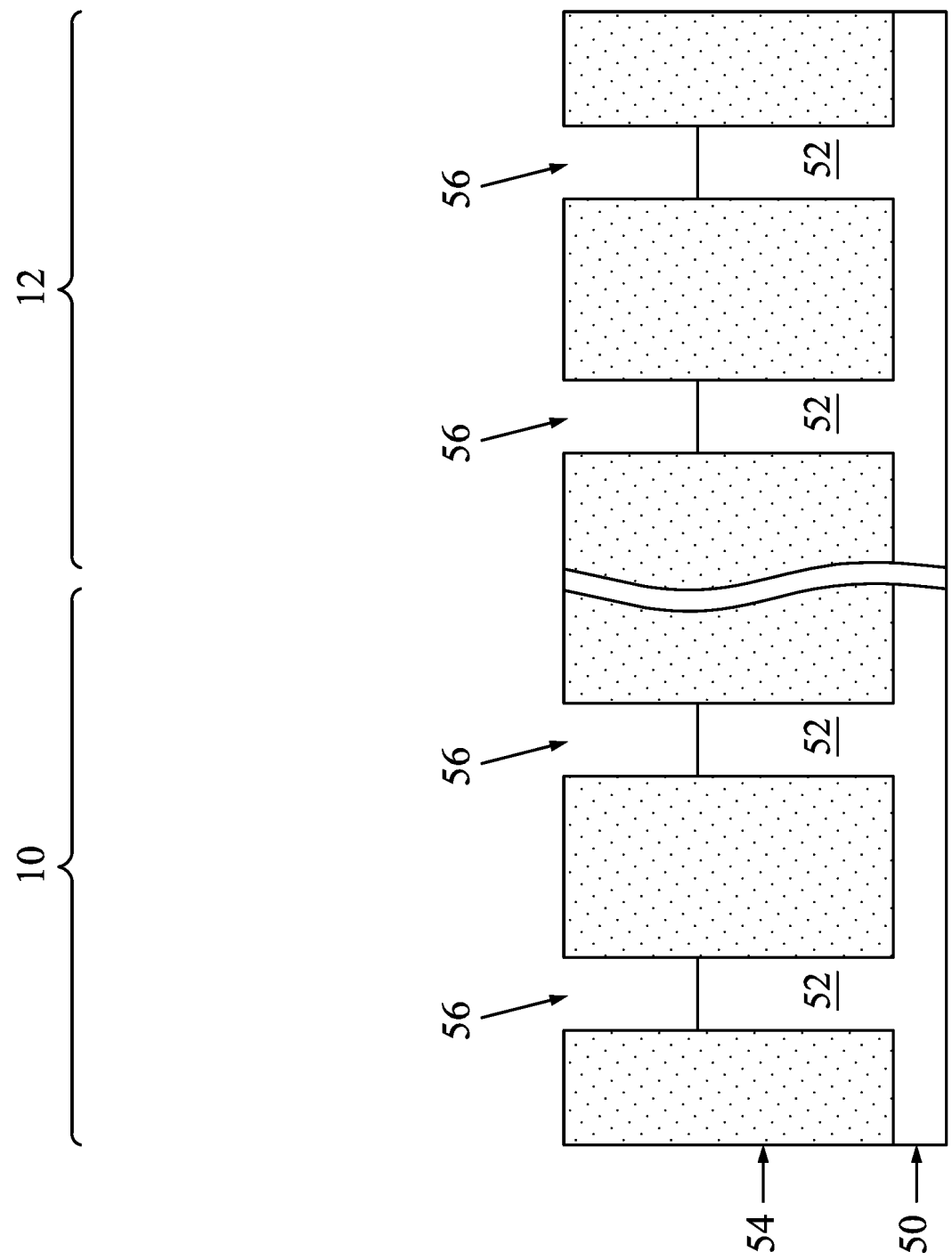

In FIG. 4, the fins 52 are etched to form recesses 56. During the etching, at least the upper portions of the fins 52 are removed. The etching may be any acceptable etch process, such as a wet or dry etch. The etch may be anisotropic.

Figure 5:
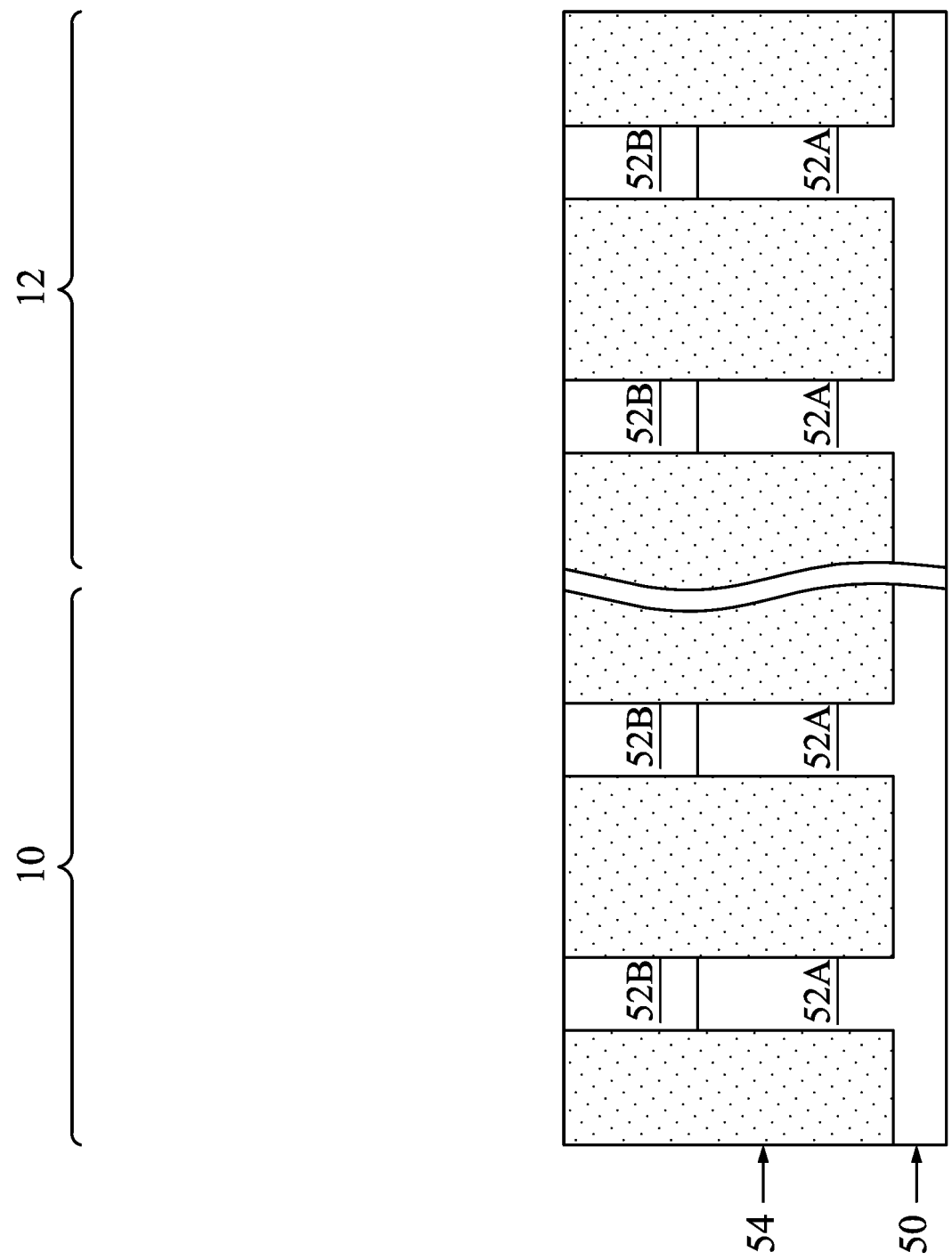

In FIG. 5, the fins 52 are epitaxially regrown in the recesses 56. After the growth, the fins 52 include first portions 52A and second portions 52B. The first portions 52A are formed of a different semiconductor material than the second portions 52B. In some embodiments, the second portions 52B are formed from silicon germanium ($Si_xGe_{1-x}$, where x can be in the range of 0 to 1), silicon carbide, pure or substantially pure germanium, a III-V compound semiconductor, a II-VI compound semiconductor, or the like. In a particular embodiment, the second portions 52B are SiGe. Further, the second portions 52B may have a lattice constant greater than, substantially equal to, or smaller than, the lattice constant of the first portions 52A. An optional planarization process may be performed on the fins 52 such that top surfaces of the fins 52 and insulation material 54 are level.

Figure 6:
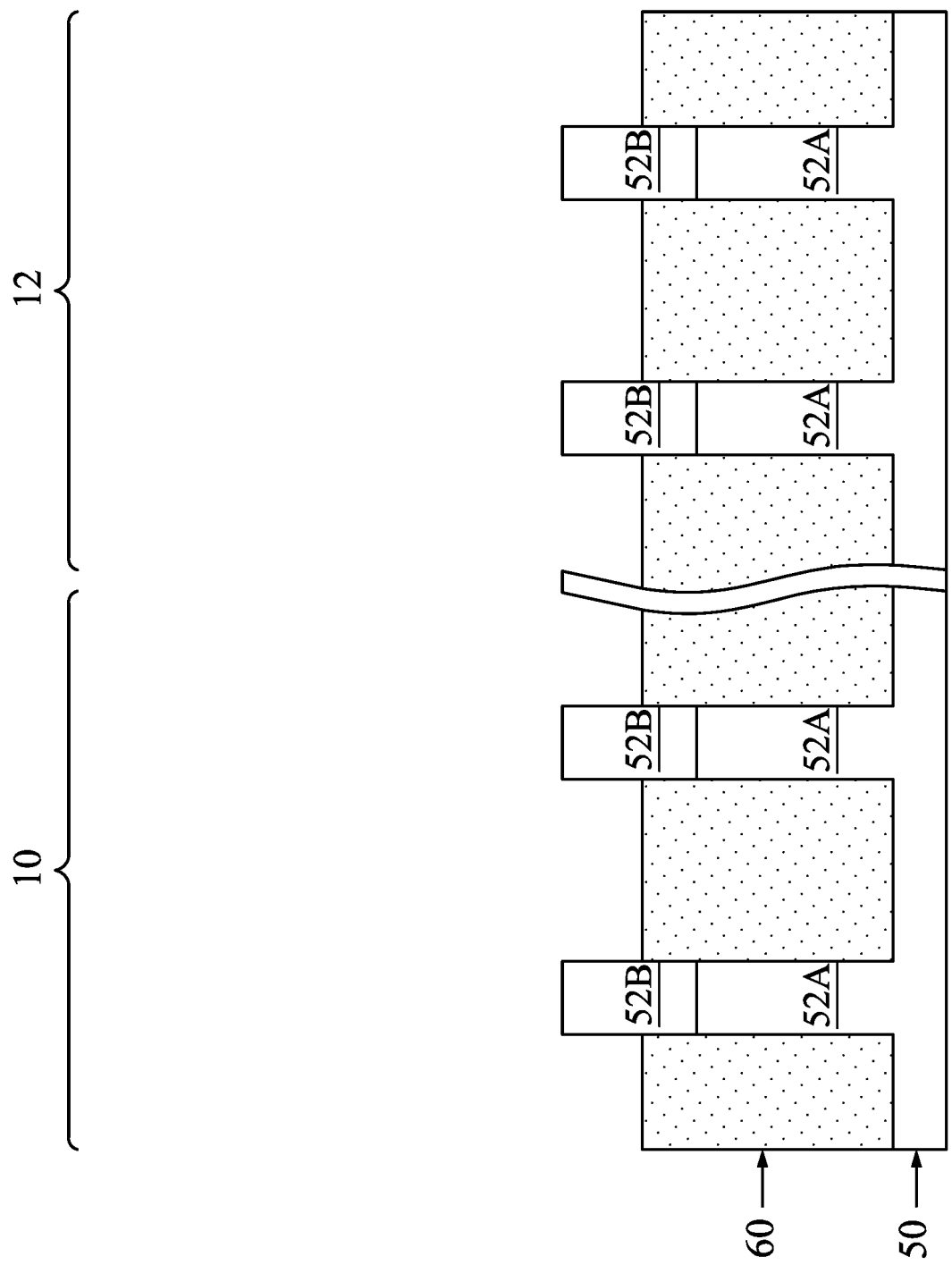

In FIG. 6, the insulation material 54 is recessed to form STI regions 60. The insulation material 54 is recessed such that the fins 52 in the region 10 and in the region 12 protrude from between neighboring STI regions 60. Further, the top surfaces of the STI regions 60 may have a flat surface as illustrated, a convex surface, a concave surface (such as dishing), or a combination thereof. The top surfaces of the STI regions 60 may be formed flat, convex, and/or concave by an appropriate etch. The STI regions 60 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

After formation, appropriate doped regions (sometimes referred to as well regions) may be formed in the fins 52 and/or the substrate 50. In some embodiments, a P-type doped region may be formed in the region 10, and an N-type doped region may be formed in the region 12. In some embodiments, only P-type or only N-type doped regions are formed in both the region 10 and the region 12. In the embodiments with different types of doped regions, the different implant steps for the region 10 and the region 12 may be achieved using a photoresist or other masks. For example, a photoresist may be formed over the fins 52 and the STI regions 60 in the region 10. The photoresist is patterned to expose the region 12 of the substrate 50, such as a PMOS region. The photoresist can be formed by using a spin-on technique and can be patterned using acceptable photolithography techniques. Once the photoresist is patterned, an n-type impurity implant is performed in the region 12, and the photoresist may act as a mask to substantially prevent n-type impurities from being implanted into the region 10, such as an NMOS region. The n-type impurities may be phosphorus, arsenic, or the like implanted in the region to a concentration of equal to or less than $10^{18}$ $cm^{-3}$, such as from about $10^{17}$ $cm^{-3}$ to about $10^{18}$ $cm^{-3}$. After the implant, the photoresist is removed, such as by an acceptable ashing process. Following the implanting of the region 12, a photoresist is formed over the fins 52 and the STI regions 60 in the region 12. The photoresist is patterned to expose the region 10 of the substrate 50, such as the NMOS region. The photoresist can be formed by using a spin-on technique and can be patterned using acceptable photolithography techniques. Once the photoresist is patterned, a p-type impurity implant may be performed in the region 10, and the photoresist may act as a mask to substantially prevent p-type impurities from being implanted into the region 12, such as the PMOS region. The p-type impurities may be boron, $BF_2$, or the like implanted in the region to a concentration of equal to or less than $10^{18}$ $cm^{-3}$, such as from about $10^{17}$ $cm^{-3}$ to about $10^{18}$ $cm^{-3}$. After the implant, the photoresist may be removed, such as by an acceptable ashing process. After the implants of the region 10 and the region 12, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
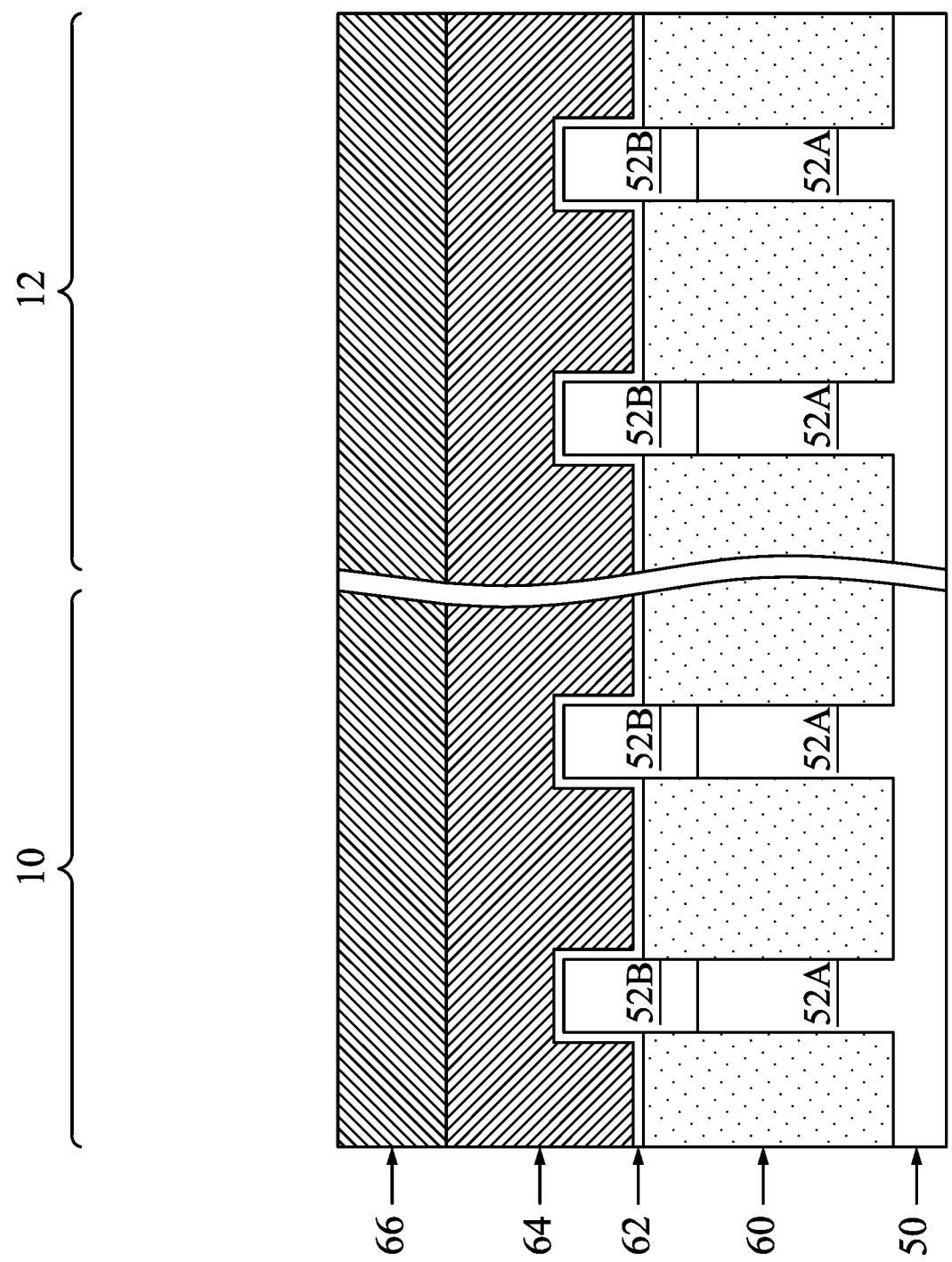

In FIG. 7, a dummy gate dielectric layer 62 is formed over the fins 52. The dummy gate dielectric layer 62 may be, for example, silicon oxide, silicon nitride, a combination thereof, or the like, and may be deposited or thermally grown according to acceptable techniques. A dummy gate layer 64 is formed over the dummy gate dielectric layer 62, and a mask layer 66 is formed over the dummy gate layer 64. The dummy gate layer 64 may be deposited over the dummy gate dielectric layer 62 and then planarized, such as by a CMP. The dummy gate layer 64 may be a conductive material and may be selected from a group including poly-crystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 64 may be deposited by physical vapor deposition (PVD), CVD, sputter deposition, or other techniques known and used in the art for depositing conductive materials. The dummy gate layer 64 may be made of other materials that have a high etching selectivity from the etching of isolation regions. The mask layer 66 may be deposited over the dummy gate layer 64. The mask layer 66 may include, for example, SiN, SiON, or the like. In this example, a single dummy gate layer 64 and a single mask layer 66 are formed across the region 10 and the region 12. In some embodiments, separate dummy gate layers may be formed in the region 10 and the region 12, and separate mask layers may be formed in the region 10 and the region 12.

FIGS. 8A through 28C are cross-sectional views of intermediate stages in the manufacturing of FinFETs, in accordance with some embodiments. Figures ending with an "A" designation are shown along reference cross-section A-A illustrated in FIG. 1, except for multiple fins/FinFETs. Figures ending with a "B" designation are shown along reference cross-section B-B illustrated in FIG. 1, except for multiple fins/FinFETs. Figures ending with a "C" or "D" designation are shown along reference cross-section C/D-C/D illustrated in FIG. 1, except for multiple fins/FinFETs. FIGS. 8A through 28C illustrate a process in the region 12 for forming p-type devices. During the process, the region 10 may be covered by a mask such as a photoresist. It should be appreciated that similar steps may be performed, with appropriate variations, in the region 10 to form n-type devices. The n-type devices in the region 10 may be formed before or after the p-type devices in the region 12.

Figure 8A:
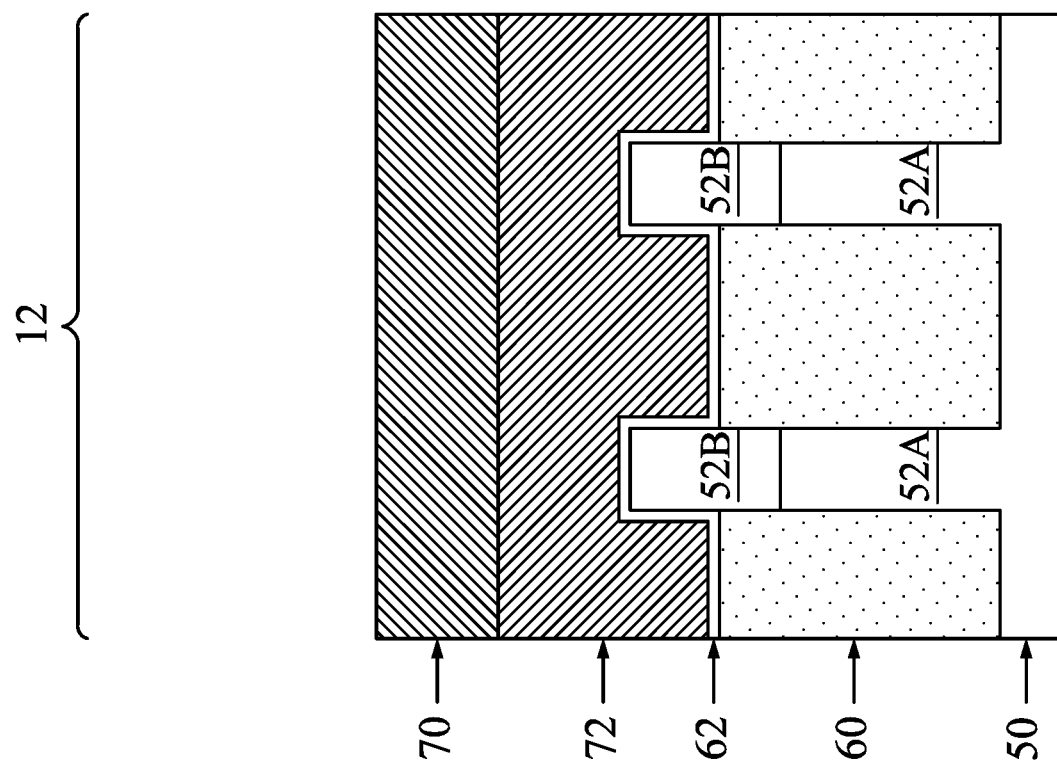
Figure 8C:
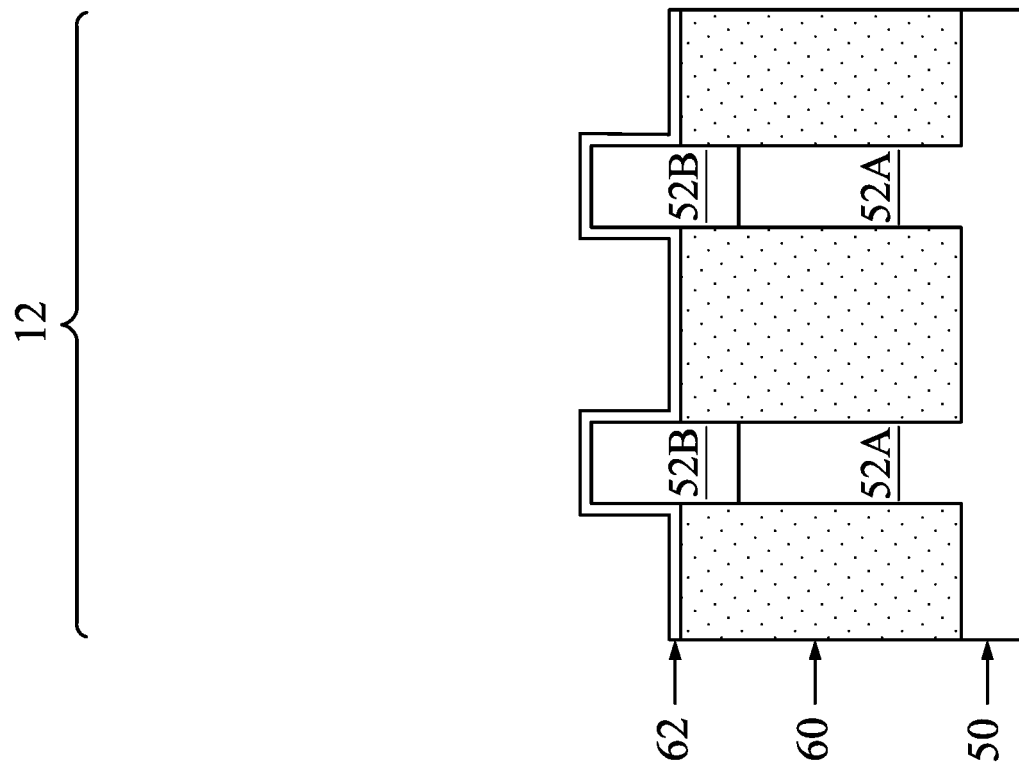
Figure 8B:
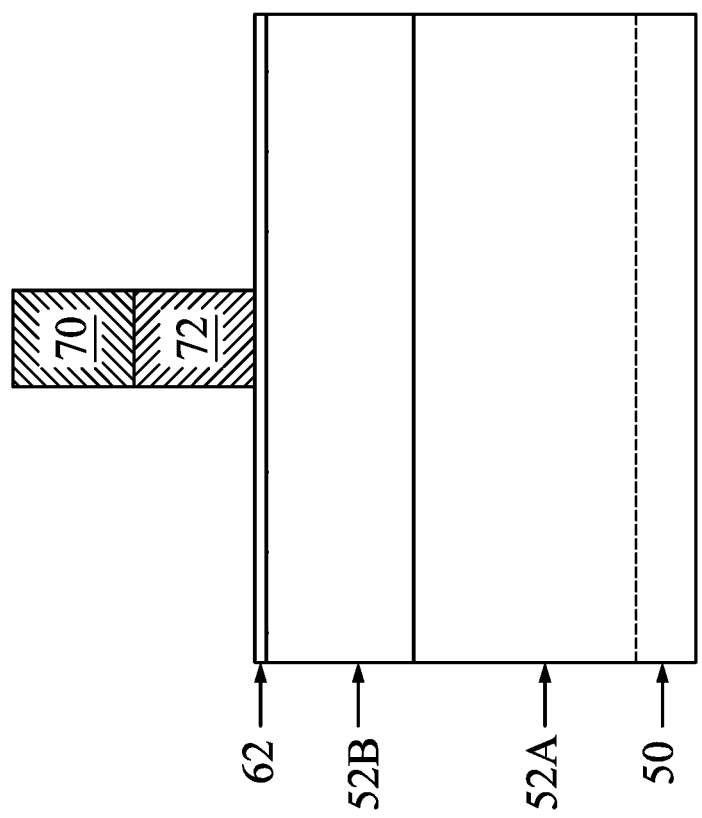

In FIGS. 8A through 8C, the mask layer 66 is patterned using acceptable photolithography and etching techniques to form masks 70. The pattern of the masks 70 then may be transferred to the dummy gate layer 64 by an acceptable etching technique to form dummy gates 72. The dummy gates 72 cover respective channel regions of the fins 52. The pattern of the masks 70 may be used to physically separate each of the dummy gates 72 from adjacent dummy gates. The dummy gates 72 may have a lengthwise direction substantially perpendicular to the lengthwise direction of respective epitaxial fins.

Figure 9A:
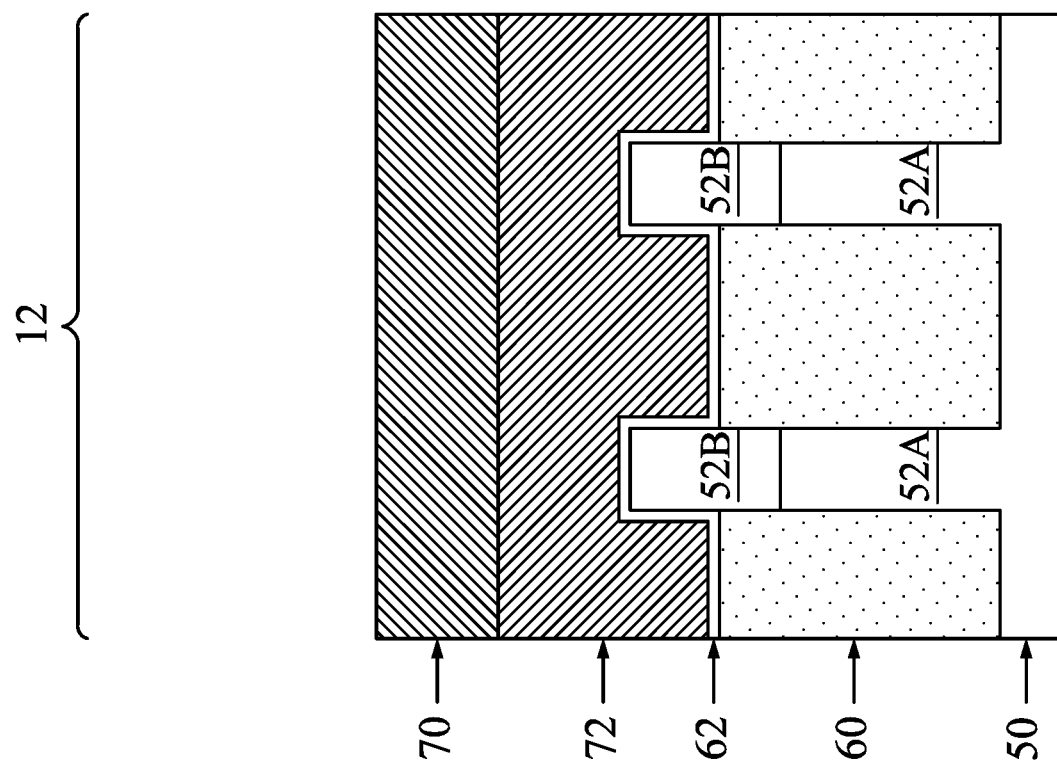
Figure 9C:
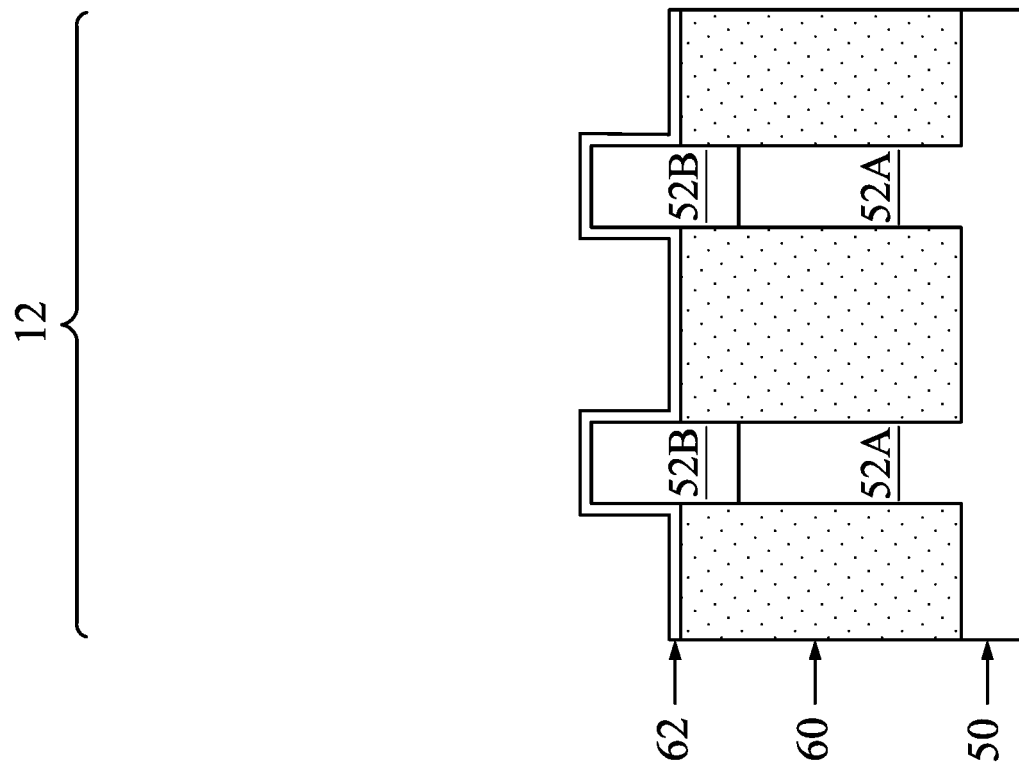
Figure 9B:
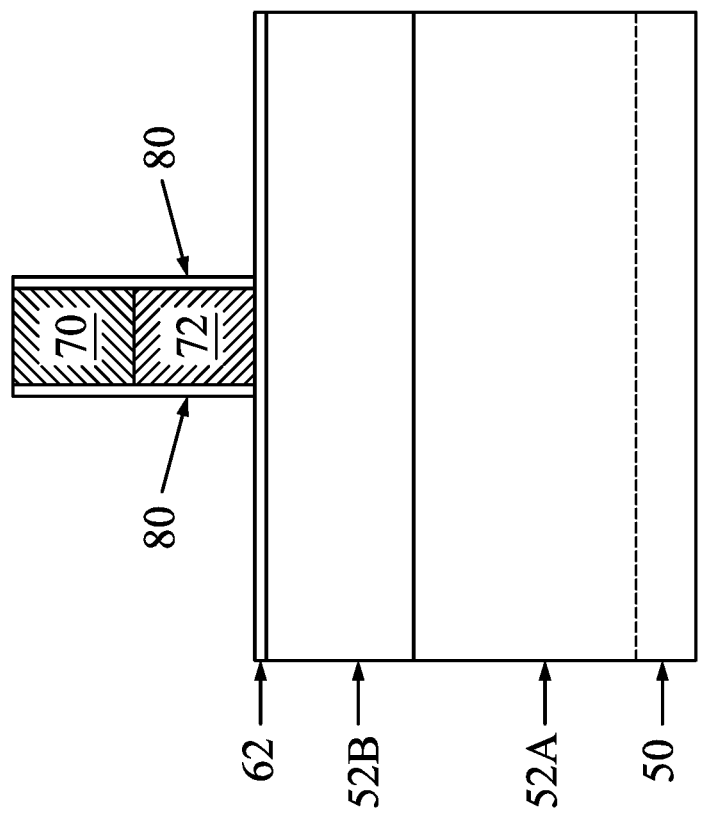

In FIGS. 9A through 9C, gate seal spacers 80 can be formed on exposed surfaces of the dummy gates 72 and/or the fins 52. A thermal oxidation or a deposition followed by an anisotropic etch may form the gate seal spacers 80. In some embodiments, the gate seal spacer may be formed of a nitride, such as silicon nitride, silicon oxynitride, silicon carbide, silicon carbonitride, the like, or a combination thereof. The gate seal spacers 80 seal the sidewalls of subsequently formed gate stacks, and may act as additional gate spacing layers.

Figure 10A:
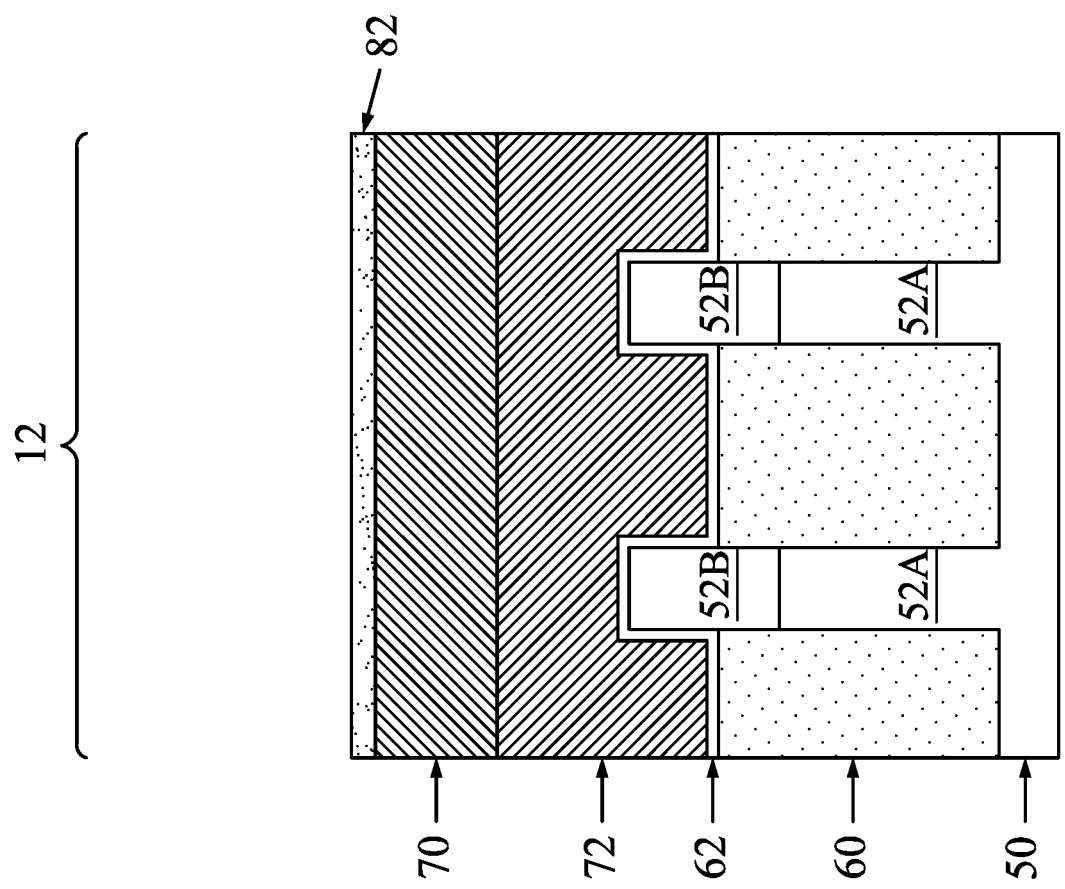
Figure 10C:
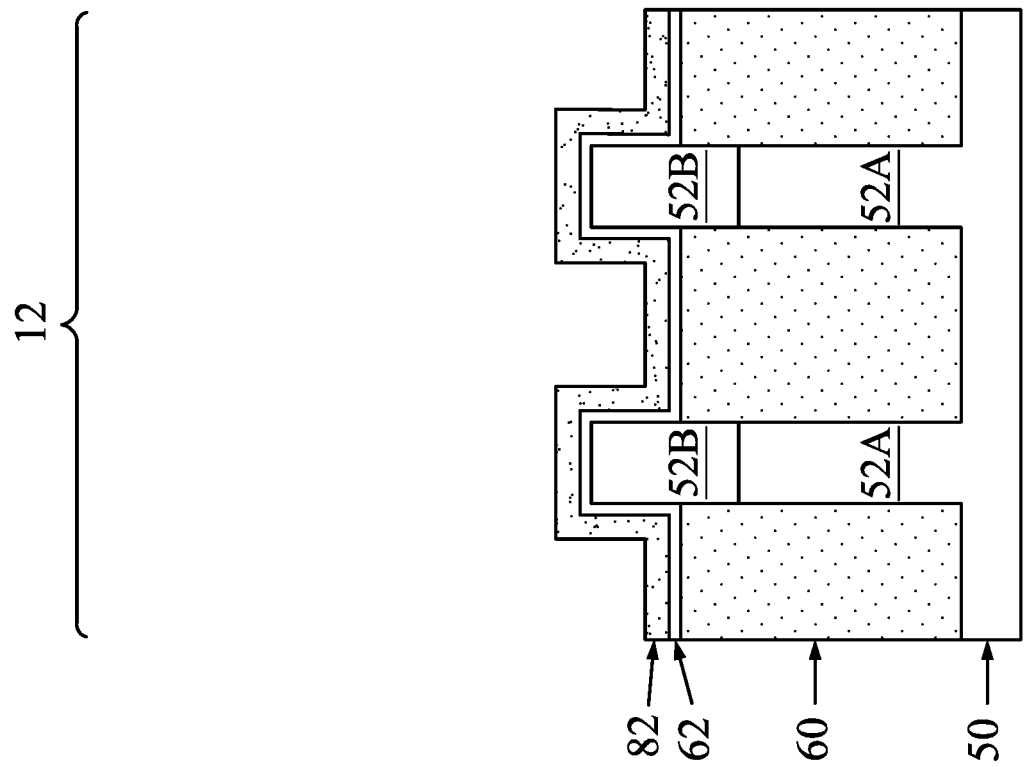
Figure 10B:
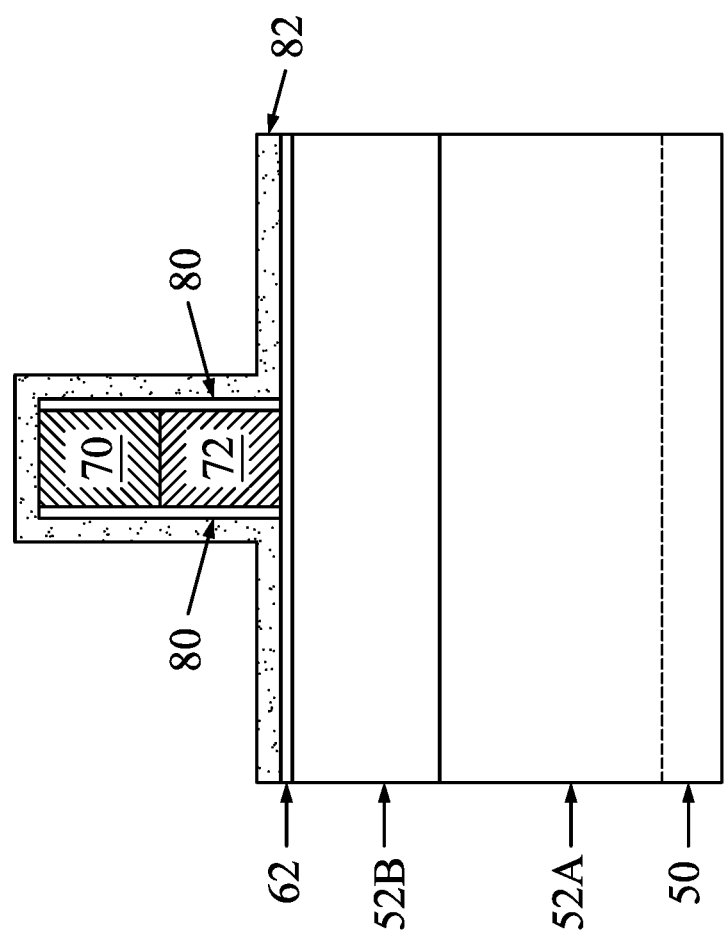

In FIGS. 10A through 10C, a first gate spacer layer 82 is conformally deposited over the fins 52 and dummy gates 72. The first gate spacer layer 82 is formed from a dielectric material such as silicon oxide, silicon nitride, SiCN, a combination thereof, or the like.

Figure 11A:
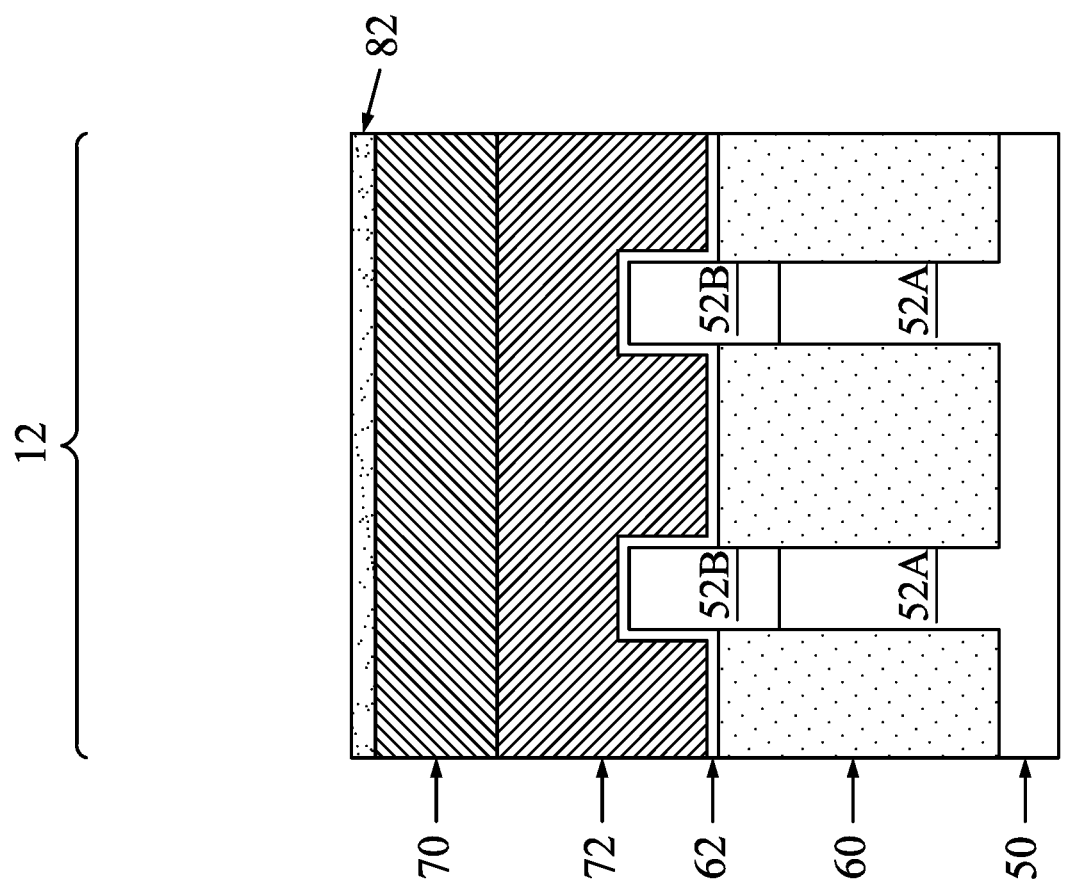
Figure 11C:
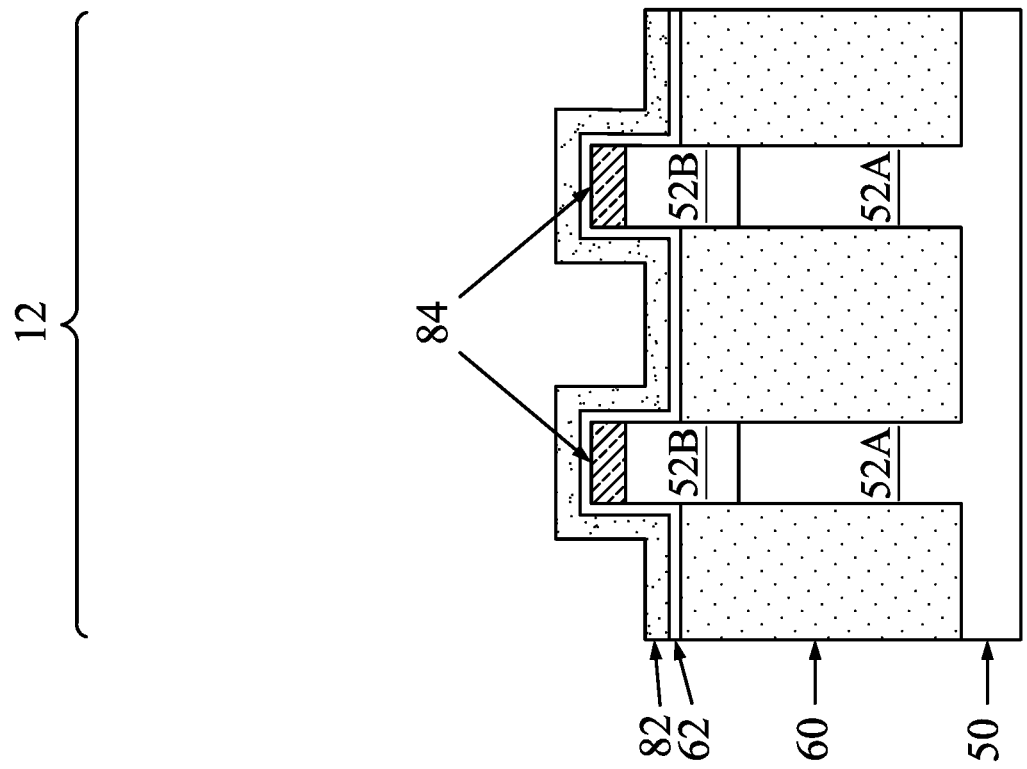
Figure 11B:
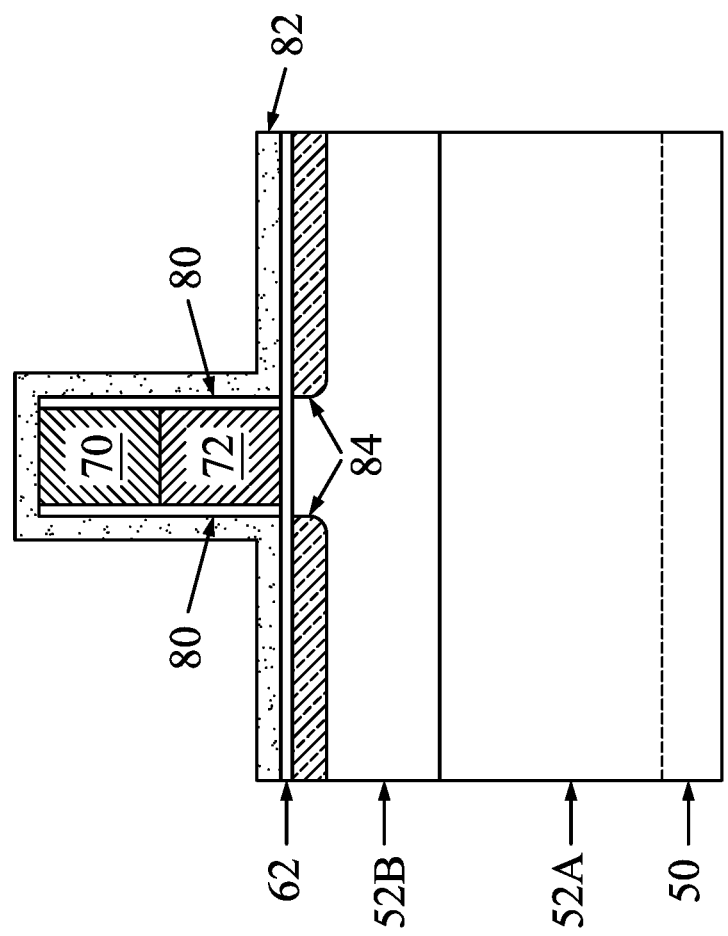

In FIGS. 11A through 11C, lightly doped source/drain (LDD) regions 84 are formed in the second portions 52B of the fins 52. Implants are performed to form the LDD regions 84. In particular, appropriate type (e.g., p-type) impurities may be implanted into the fins 52 in the region 12. The p-type impurities may be the any of the p-type impurities previously discussed. An anneal may be used to activate the implanted impurities. The lightly doped source/drain (LDD) regions 84 are substantially confined to the second portions 52B of the fins 52, and do not extend into the first portions 52A.

Figure 12A:
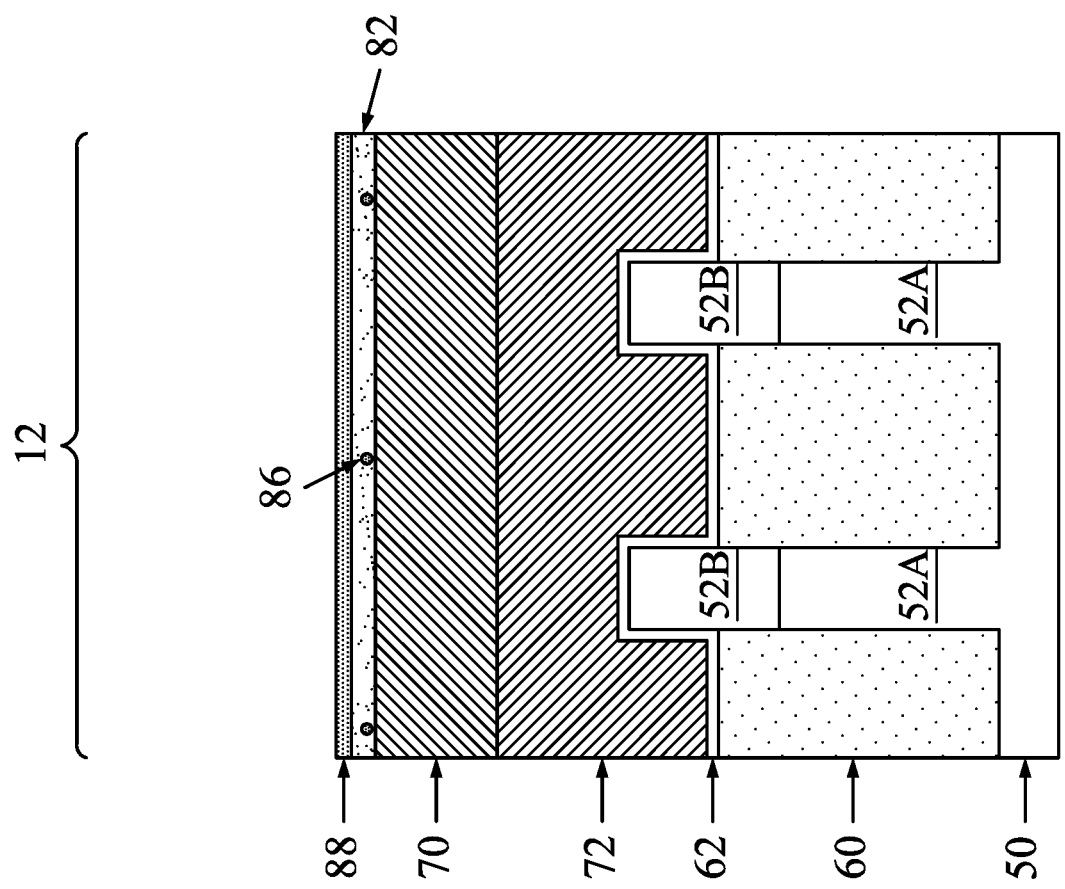
Figure 12C:
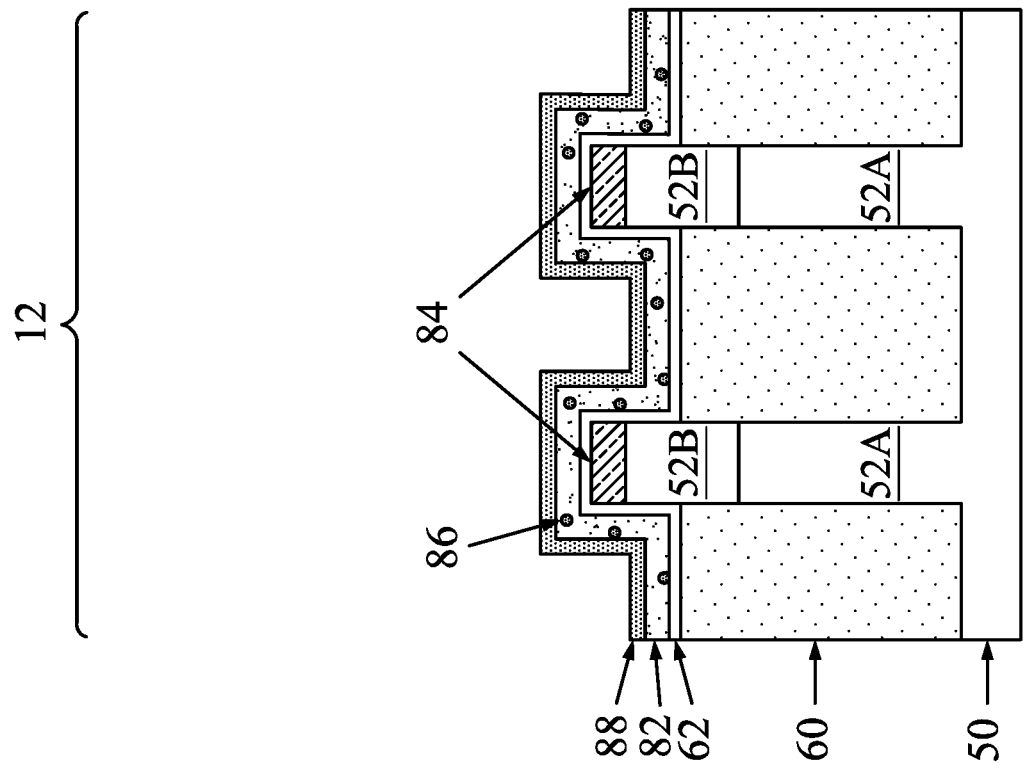
Figure 12B:
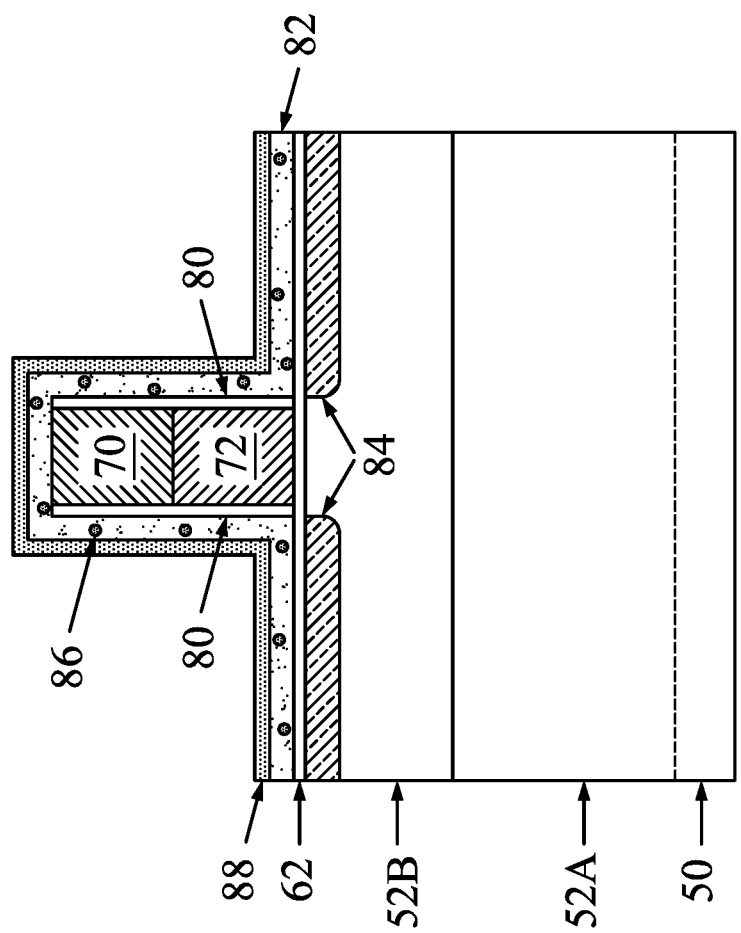

In FIGS. 12A through 12C, a first plasma doping process is performed to implant dopant particles 86 into the first gate spacer layer 82 and conformally form a first dopant layer 88 on the first gate spacer layer 82. The dopant of the first dopant layer 88 is an impurity of an appropriate type (e.g., p-type) for the device being formed, and may be the same impurity implanted when forming the LDD regions 84. In an embodiment, the dopant is boron. Doping the first gate spacer layer 82 with a dopant of the appropriate type may allow the fins 52 to be doped with the dopants in subsequent steps, improving the doping profile of the fins 52.

The plasma doping process may be performed as part of a CVD process such as RF CVD, plasma-enhanced CVD (PECVD), or the like. The plasma doping process uses a gas source including a first precursor gas, a second precursor gas, and an inert gas. The first precursor gas comprises a dopant, such as a P-type dopant, such as boron, aluminium, nitrogen, gallium, indium, the like, or combinations thereof. For example, the first precursor gas may be $AsH_3$, $B_2H_6$, $NF_3$, $N_2$, $O_2$, Ar, or the like. The second precursor gas may comprise any gas that reacts with the first precursor gas to perform a suitable CVD process. The inert gas may comprise xenon, helium, argon, neon, krypton, radon, the like, or combinations thereof. In the embodiment where the dopant is boron, the first precursor gas may be a gaseous boron source such as $B_2H_6$ or the like, the second precursor gas is $H_2$, and the inert gas is argon.

Figure 13:
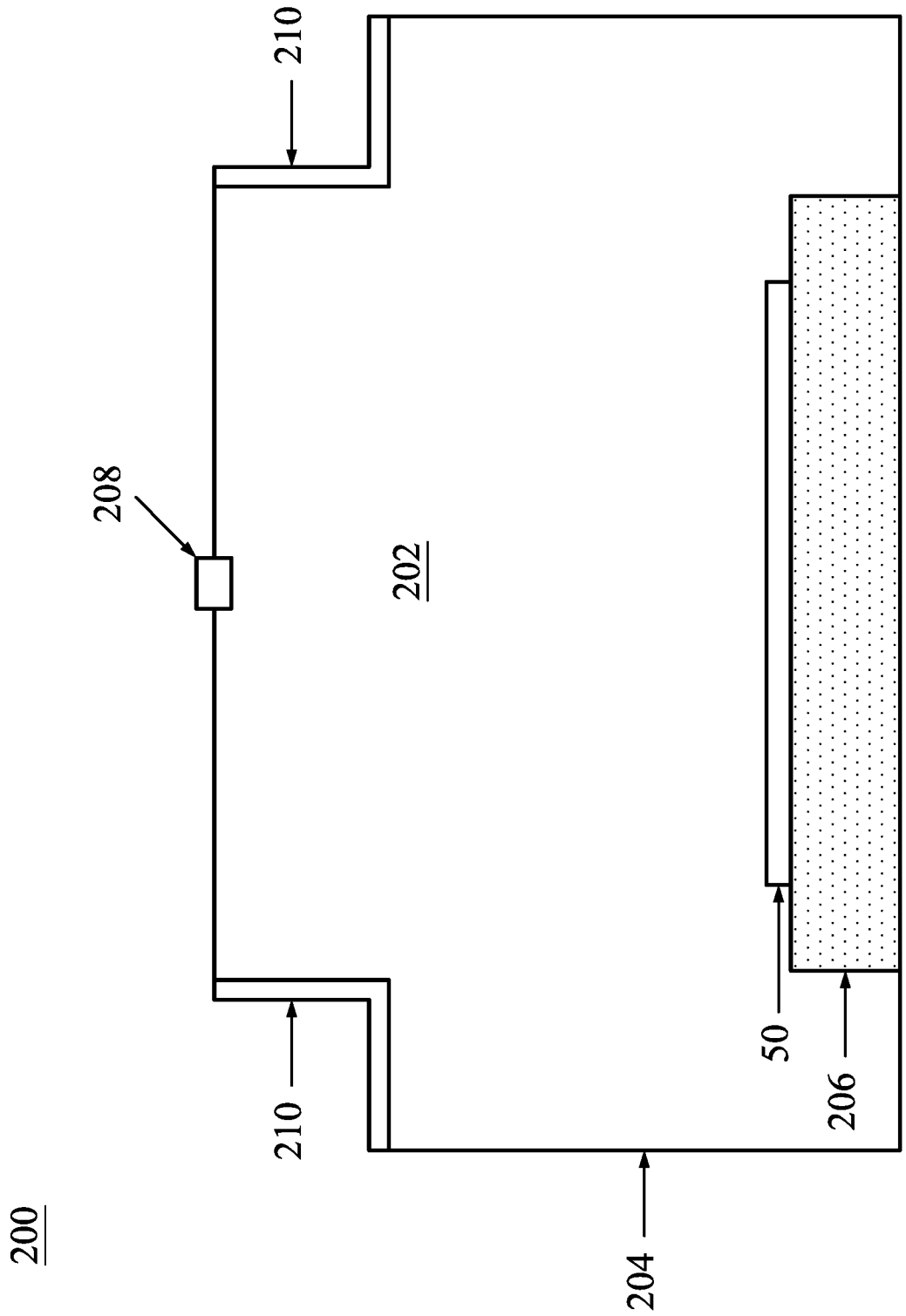

FIG. 13 illustrates a deposition system 200, in accordance with some embodiments. The deposition system 200 may be used to perform the plasma doping process to implant the dopant particles 86 into the first dopant layer 88 and form the first dopant layer 88 on the first gate spacer layer 82. The deposition system 200 includes a chamber 202 defined by a housing 204. A chuck 206 in the chamber 202 holds a wafer, such as a wafer including the substrate 50. A gas inlet 208 provides precursor gasses to the chamber 202. A plasma generator 210 generates plasma from the precursor gasses; the plasma generator 210 may be a transformer-coupled plasma generator, inductively coupled plasma system, magnetically enhanced reactive ion etching system, electron cyclotron resonance system, a remote plasma generator, or the like. During the plasma doping process, the deposition system 200 performs discharge and implantation in alternating repeating steps or pulses. The discharge steps form the first dopant layer 88 on the first gate spacer layer 82 in a manner similar to a CVD process, and the implanting steps implant the dopant particles 86 into the first dopant layer 88.

During the discharge steps, the first dopant layer 88 is formed on the first gate spacer layer 82. A gas source including the first precursor gas, second precursor gas, and inert gas is provided to the chamber 202 through the gas inlet 208. In embodiments where boron doping is performed, the gas source comprises from about 1% to about 10% of the first (e.g., boron-containing) precursor gas, from about 30% to about 60% of the second (e.g., $H_2$ containing) precursor gas, and from about 40% to about 60% of the inert (e.g., argon-containing) gas. In such embodiments, the first precursor gas is provided at a flow rate of from about 5 standard cubic centimeter per minute (sccm) to about 90 sccm; the second precursor gas is provided at a flow rate of from about 20 sccm to about 200 sccm; and the inert gas is provided at a flow rate of from about 20 sccm to about 200 sccm. The plasma generator 210 generates RF power that produces a plasma sheath in the chamber 202 from the gas source. In embodiments where boron is implanted, the plasma generator 210 generates RF power of from about 500 watts to about 1500 watts, and the generated plasma includes boron ions such as $B_2H_5^+$, $BH_3^+$, $B^+$, and the like. The ions descend to the surface of the wafer or substrate 50, where they are neutralized by free electrons to produce the first dopant layer 88. In embodiments where boron doping is performed, the first dopant layer 88 is a layer of boron, and a thickness of the first dopant layer 88 may be from about 2 nm to about 10 nm.

During the implanting steps, the dopant particles 86 are driven into the into the first gate spacer layer 82. A direct current (DC) bias voltage is generated between the plasma generator 210 and the chuck 206. The DC bias voltage is a high-voltage negative offset and is pulsed periodically such that the implanting step is performed periodically. The dopant particles 86 (e.g., boron ions) are accelerated across the plasma sheath by the DC bias voltage and implanted into the first gate spacer layer 82. Inert gas particles (e.g., argon) may collide with the dopant particles 86 and knock the dopant particles 86 deeper into the first gate spacer layer 82. For example, the inert gas particles may knock the dopant particles 86 through the formed first dopant layer 88 and into the first gate spacer layer 82. In embodiments where boron doping is performed, the DC bias voltage may be from about −0.2 V to about −10 kV, may be pulsed for a period of from about 20 μs to about 150 μs, and may be pulsed at a frequency of from about 0.5 kHz to about 10 kHz. In such embodiments, the resulting implantation energy of boron may be from about 0.5 KV to about 3 KV, such as about 2 KV, and a dosage of the implanted boron may be from about 5E13 atoms/cm$^2$ to about 2E16 atoms/cm$^2$, such as about 8E13 atoms/cm$^2$.

Figure 14A:
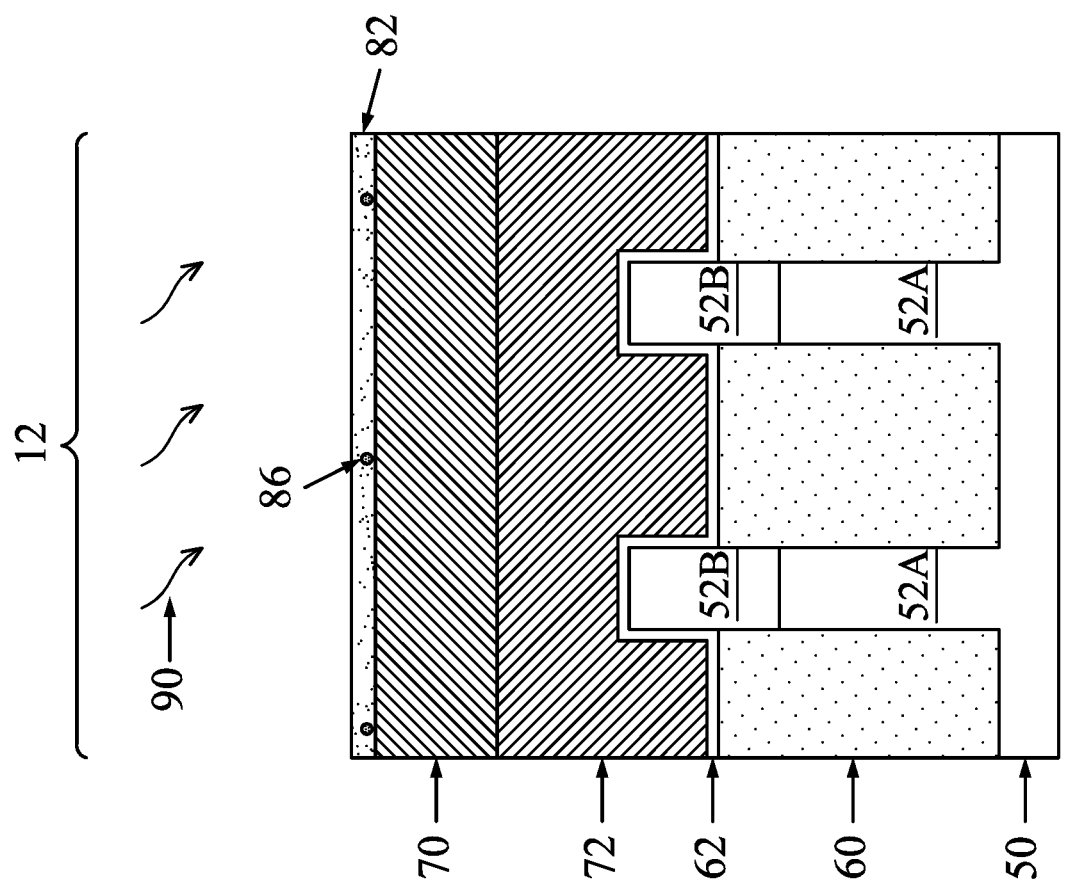

In FIGS. 14A through 14C, the first dopant layer 88 is removed with a first removal process 90. As such, only the dopant particles 86 in the first gate spacer layer 82 remain. The first removal process 90 may be a suitable etching process, such as a wet etch process. In some embodiments, the first removal process 90 is a wet etch process performed using a Sulfuric Peroxide Mixture (SPM), which is an acid including $H_2SO_4$, and $H_2O_2$. The SPM may further include a SC-1 cleaning solution, which is a mixture of $NH_4OH$, $H_2O_2$ and deionized water. The SPM has an etch selectivity between the first dopant layer 88 and first gate spacer layer 82, such that the SPM removes first dopant layer 88 without substantially attacking the first gate spacer layer 82. The wet etch process conditions (e.g., time, temperature) are controlled such that the wet etch process removes the first dopant layer 88 without substantially removing the dopant particles 86 in the first gate spacer layer 82. In an embodiment, a wet etch process is performed for a time interval of from about 30 seconds to about 120 seconds, using a high temperature SPM solution at a temperature of from about 90° C. to about 180° C.

Figure 15A:
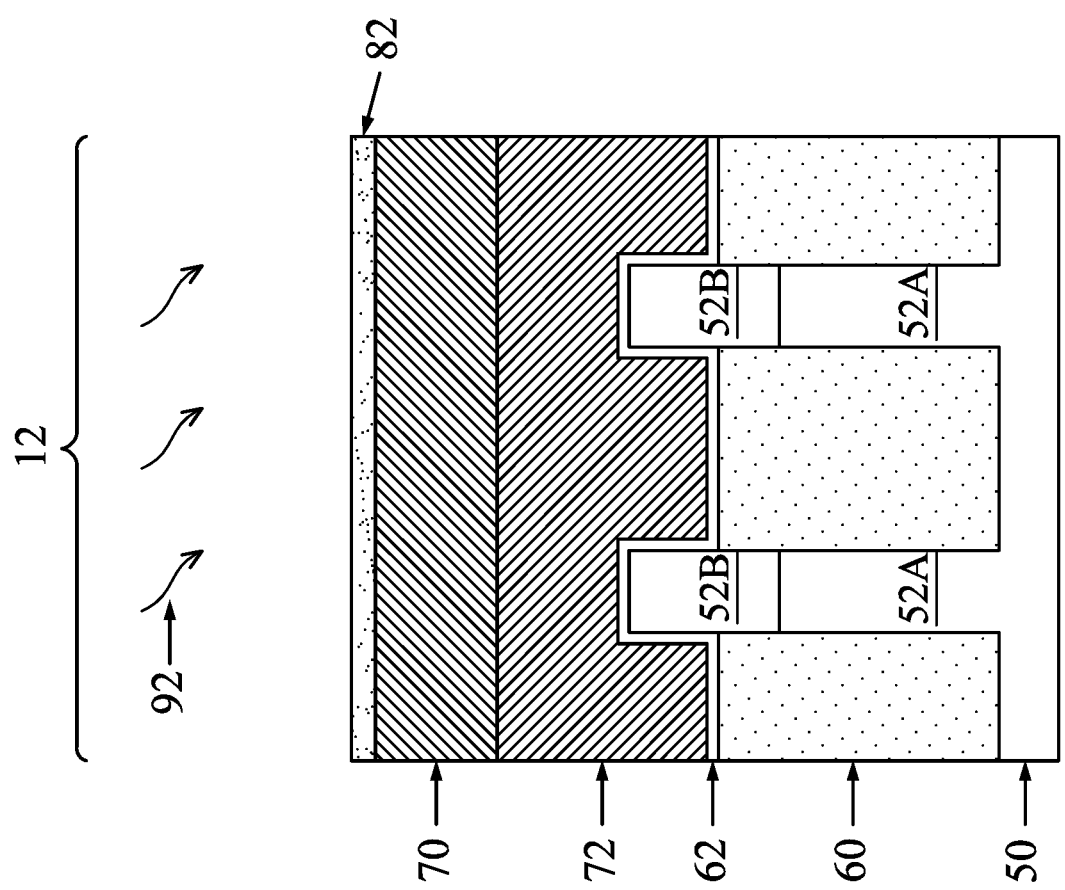
Figure 15C:
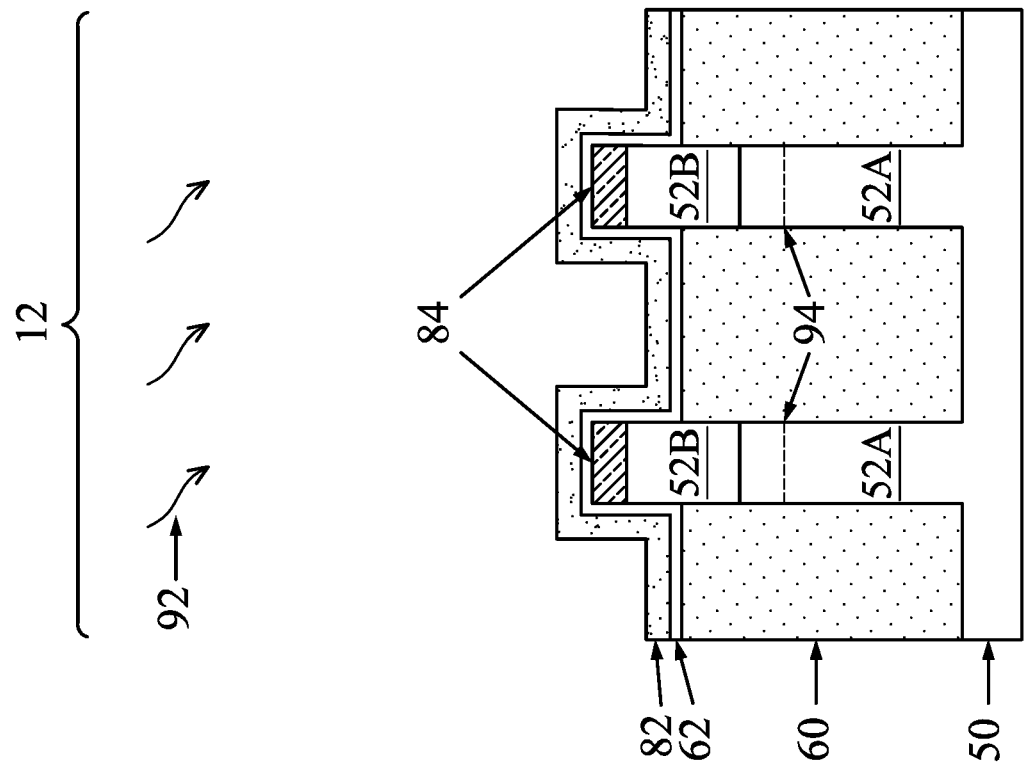
Figure 15B:
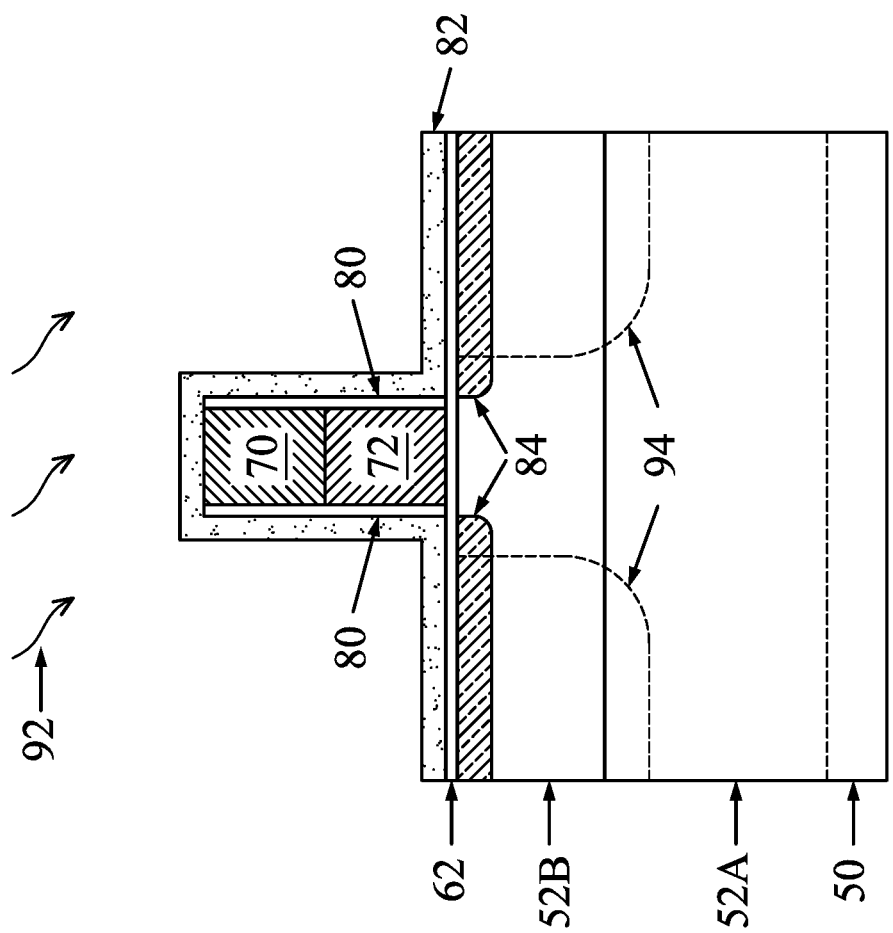

In FIGS. 15A through 15C, an anneal process 92 is performed to drive the dopant particles 86 embedded in the first gate spacer layer 82 into the fins 52, thereby forming first doped regions 94 in the first portions 52A and second portions 52B of the fins 52. The anneal process 92 also activates the implanted dopants. The first doped regions 94 are under the LDD regions 84; the masks 70 and dummy gates 72 prevent the first doped regions 94 from being formed in the channel regions of the fins 52. The first doped regions 94 have a substantially uniform concentration of the dopant throughout their thickness, and have a lower dopant concentration than the LDD regions 84. Notably, the thickness of the first doped region 94 is greater than or equal to the thickness of the second portion 52B of the fins 52. As a result, SiGe portions of the fins 52 outside of the channel regions are doped with the dopant. The anneal process 92 may be performed in a same chamber as the doping process, or may be performed in a different chamber than the chamber used in the doping process. In an embodiment, the anneal process 92 is a spike annealing process performed at a temperature of from about 800° C. to about 1200° C., such as about 950° C., for a time interval of from about 1 microsecond to about 5 seconds. In some embodiments, the ambient environment of the anneal process 92 may be selected to prevent outgassing of the dopant. For example, an ambient environment including from about 0% to about 5% $O_2$ and from about 95% to about 100% $N_2$ may be used.

Figure 16A:
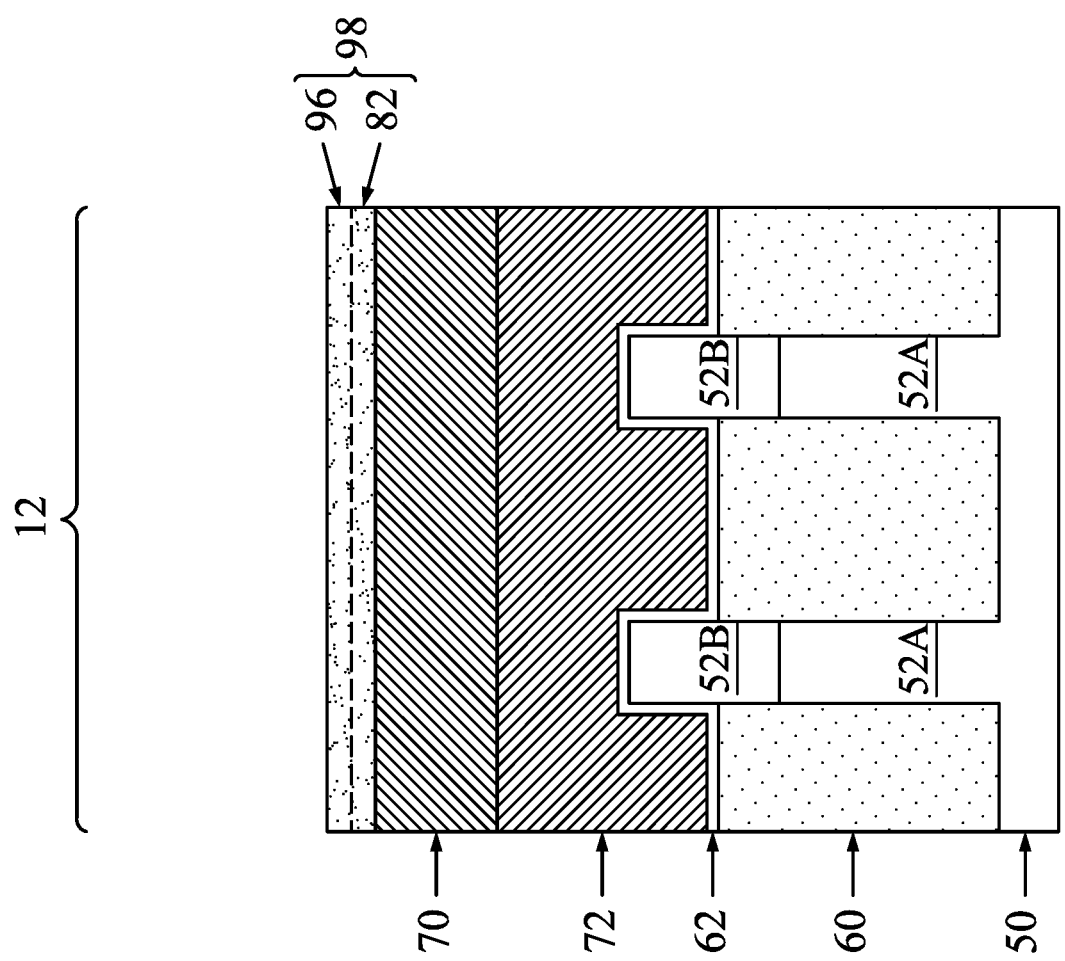

In FIGS. 16A through 16C, a second gate spacer layer 96 is conformally deposited over the first gate spacer layer 82. The second gate spacer layer 96 is formed from a dielectric material, and may be formed from the same material as the first gate spacer layer 82. The first and second gate spacer layers 82 and 96 are patterned in subsequent steps to form gate spacers, and are collectively referred to as a gate spacer layer 98. The gate spacer layer 98 may include more or fewer layers than shown.

Figure 17A:
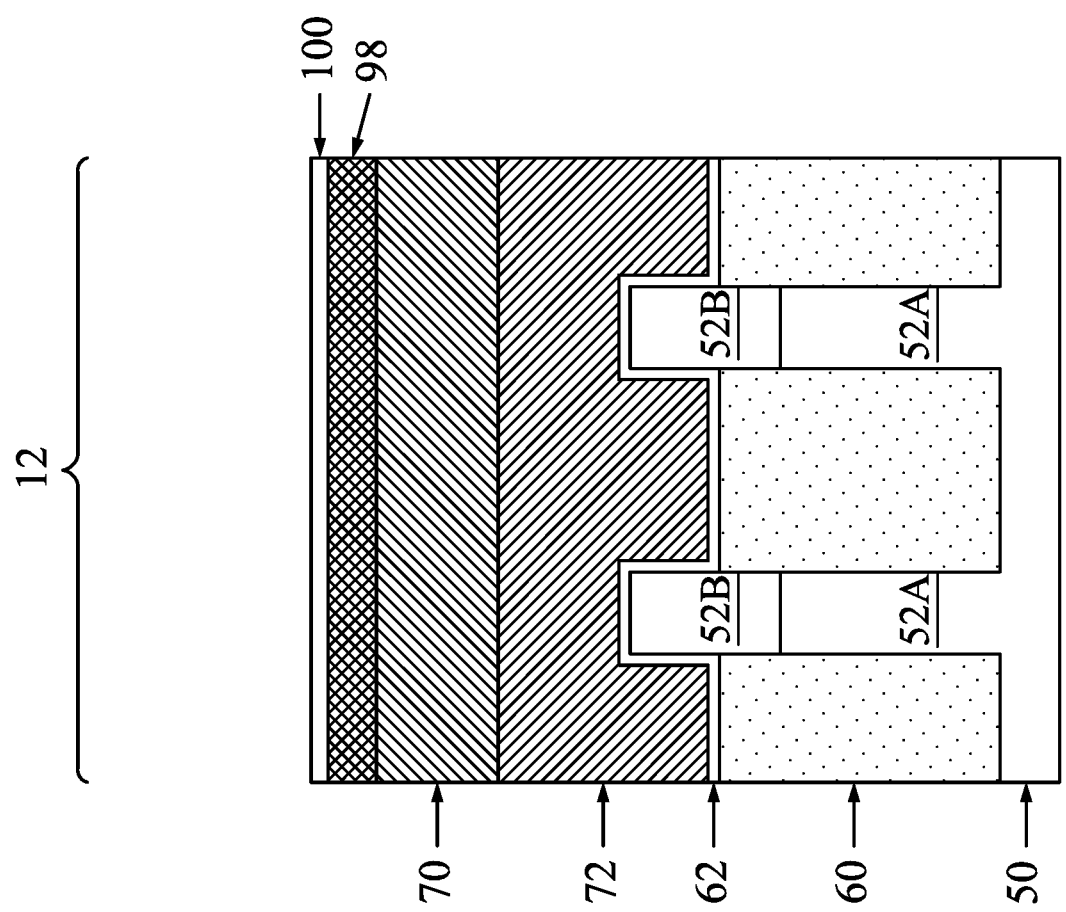
Figures 17B, 17C:
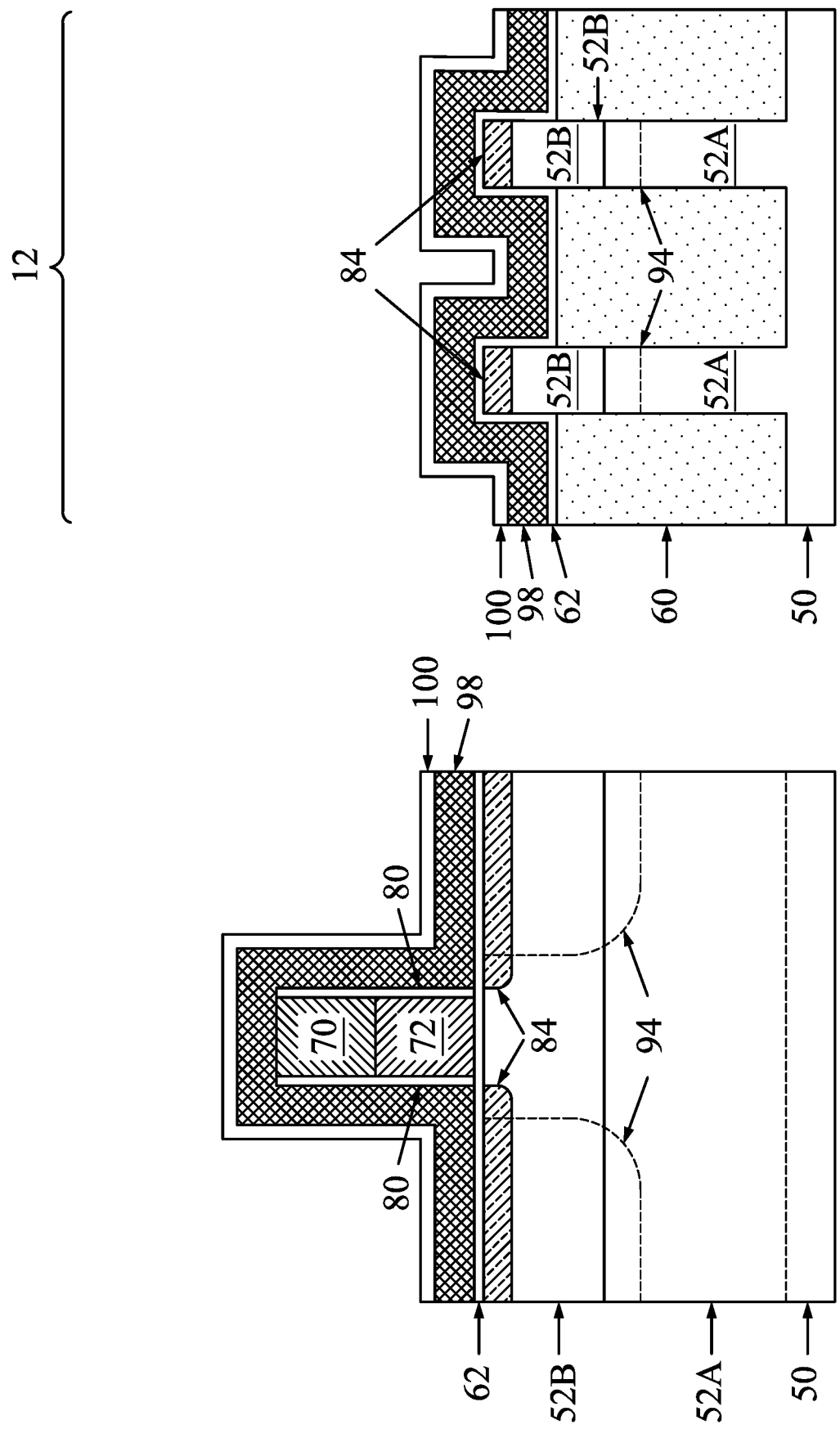

In FIGS. 17A through 17C, a mask layer 100 is conformally deposited over the gate spacer layer 98. The mask layer 100 may be formed from a dielectric material such as SiN, and may be formed by a deposition process. The mask layer 100 is used to protect the gate spacer layer 98 during subsequent implanting and epitaxy steps.

Figure 18A:
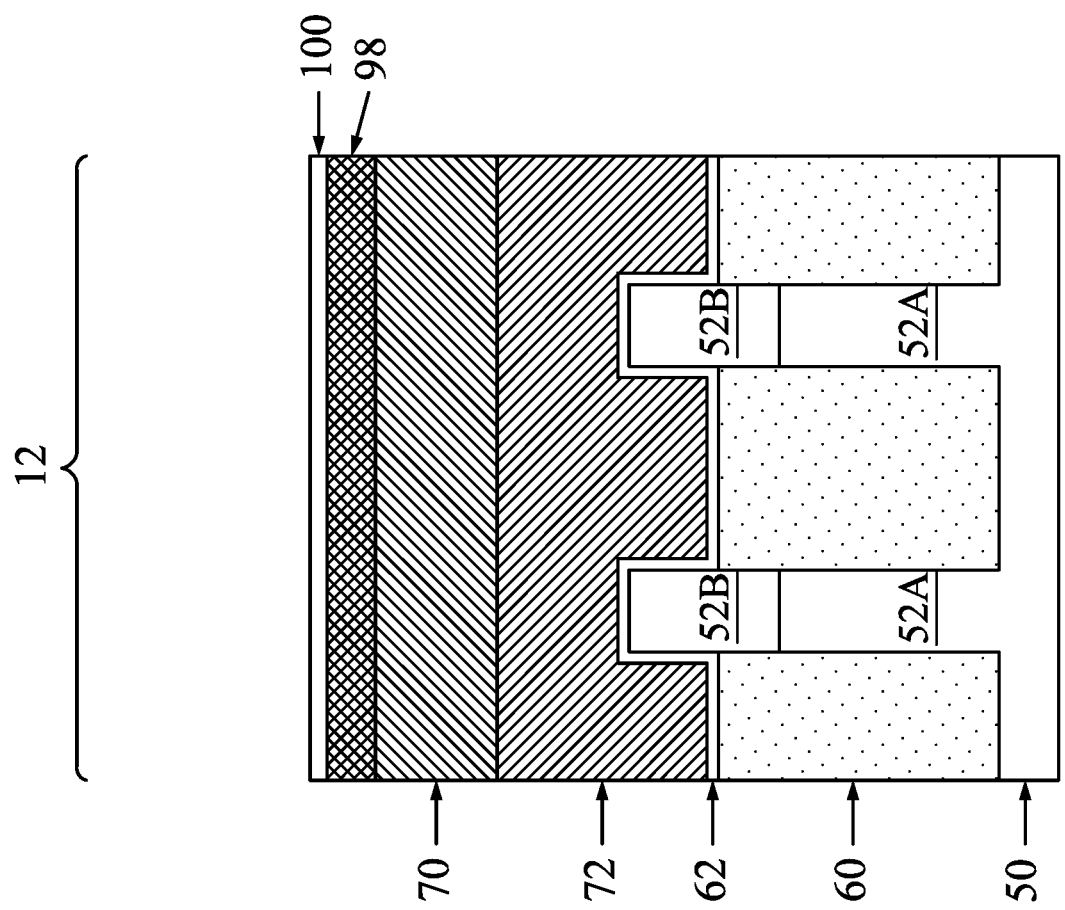
Figures 18B, 18C:
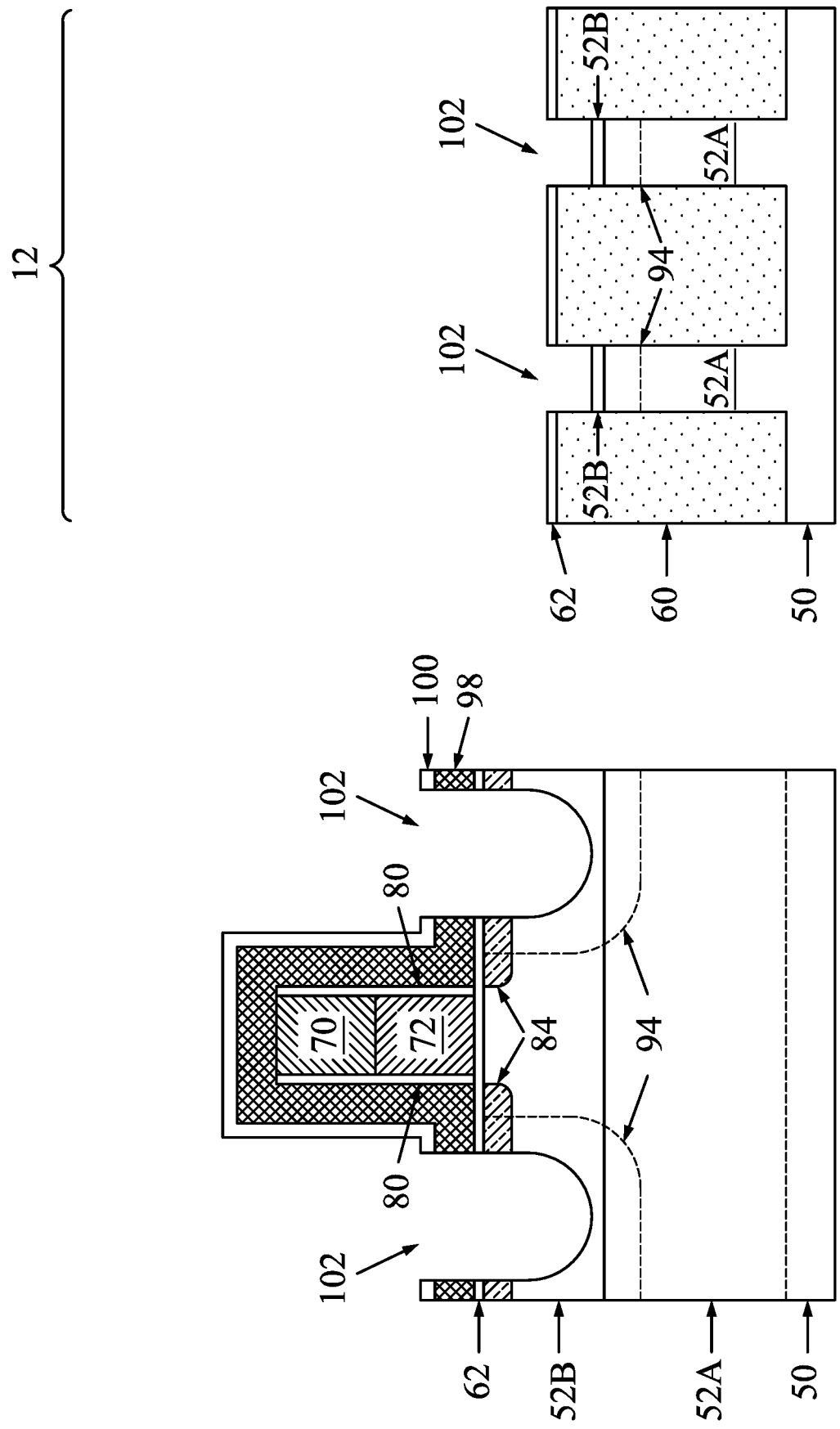

In FIGS. 18A through 18C, recesses 102 are formed in the fins 52. The recesses 102 are formed using acceptable photolithography and etching techniques, such as an anisotropic etch performed with a mask. The recesses 102 extend through the mask layer 100, gate spacer layer 98, and dummy gate dielectric layer 62, and extend into the fins 52. Notably, depths of the recesses 102 are greater than depths of the LDD regions 84 and less than depths of the first doped regions 94. Further, the recesses 102 may extend only partially into the second regions 52B of the fins 52, and may not extend into the first regions 52A.

Figure 19A:
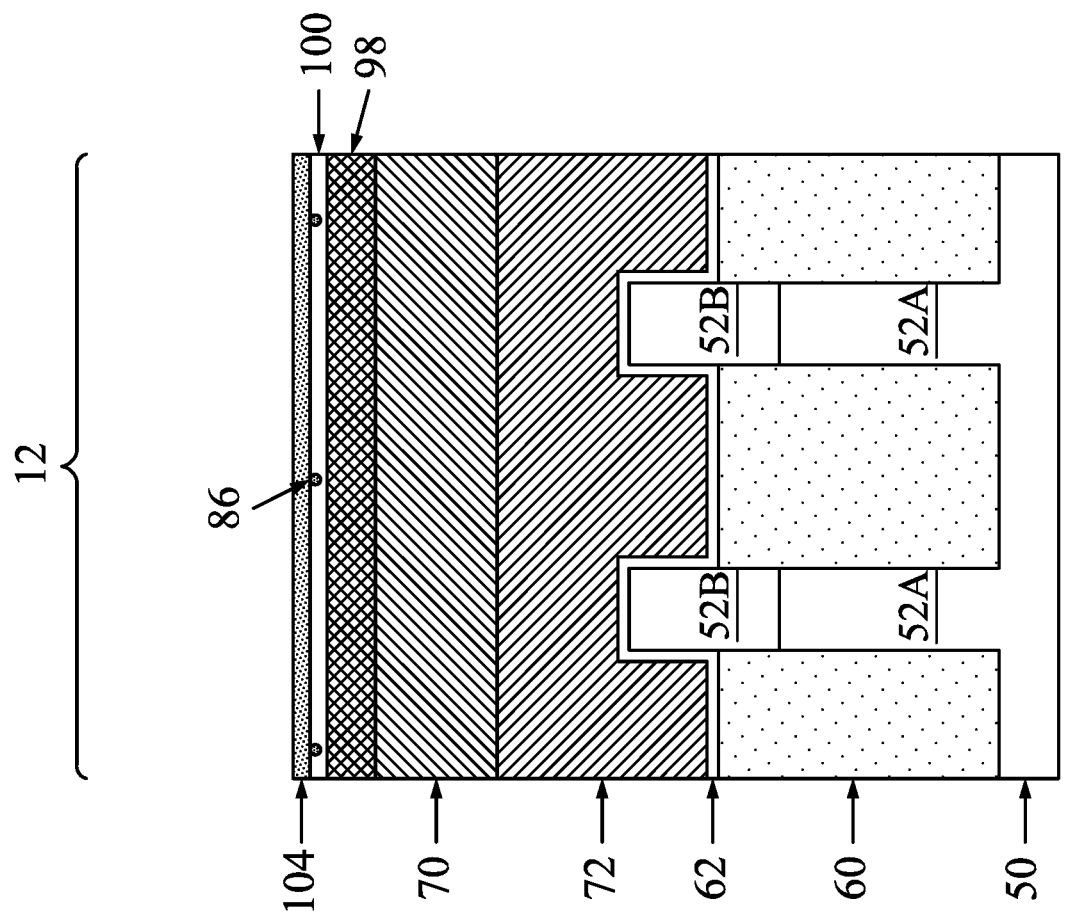

In FIGS. 19A through 19C, a second plasma doping process is performed to implant dopant particles 86 into the mask layer 100 and second portions 52B of the fins 52, and to conformally form a second dopant layer 104 on the mask layer 100 and in the recesses 102. The second plasma doping process may be similar to the first plasma doping process used to form the first dopant layer 88, but may be performed with different process conditions. In particular, when performing the second plasma doping process, the deposition system 200 may perform less discharge and more implantation. The amount of discharge and implantation may be controlled by varying the period of the DC bias voltage between the plasma generator 210 and the chuck 206 during deposition. For example, the period of the DC bias voltage during the second plasma doping process may be longer than during the first plasma doping process. In some embodiments, a majority or substantially all of the second plasma doping process comprises implantation, and the second dopant layer 104 is very small or is not formed.

Figure 20A:
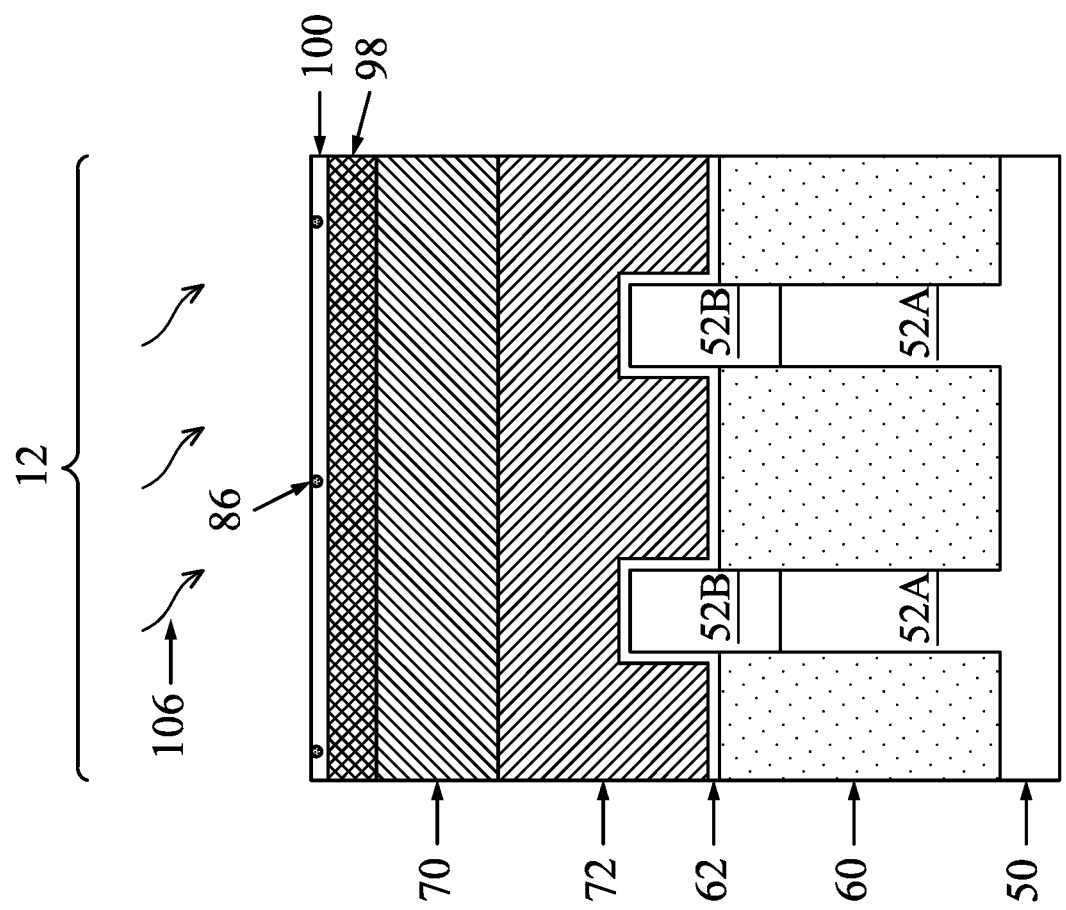
Figures 20B, 20C:
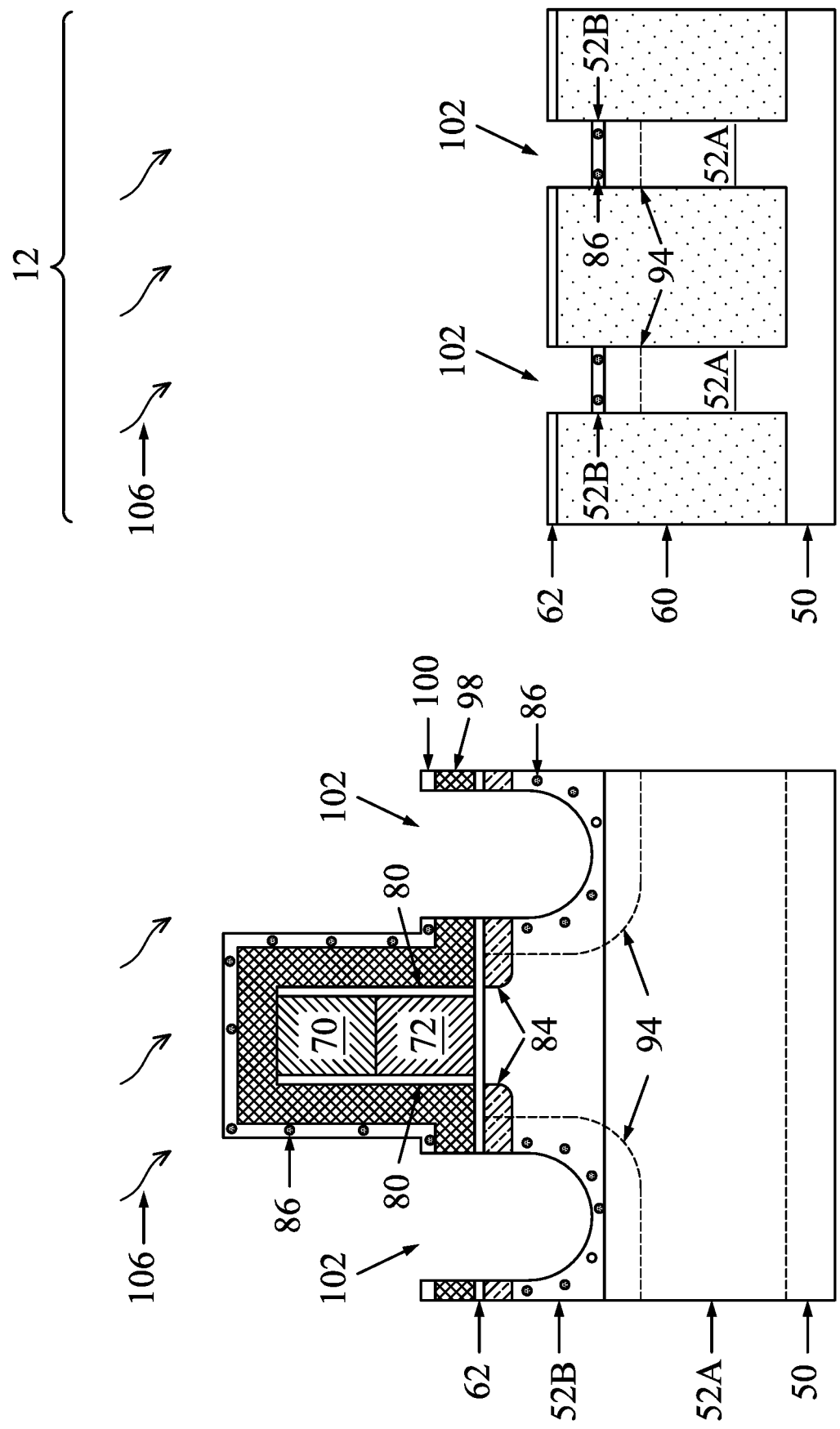

In FIGS. 20A through 20C, the second dopant layer 104 is removed with a second removal process 106. As such, only the dopant particles 86 in the mask layer 100 and fins 52 remain. The second removal process 106 may be similar to the first removal process 90 used to remove the first dopant layer 88.

In FIGS. 21A through 21D, epitaxial source/drain regions 108 are epitaxially grown in the recesses 102. The epitaxial source/drain regions 108 may include any acceptable material, such as appropriate for p-type FinFETs. For example, if the second portions 52B of the fins 52 are SiGe, the epitaxial source/drain regions 108 may include SiGeB, Ge, GeSn, or the like. The epitaxial source/drain regions 108 may also have surfaces raised from respective surfaces of the fins 52 and may have facets. The epitaxial source/drain regions 108 are formed in the fins 52 such that each dummy gate 72 is disposed between respective neighboring pairs of the epitaxial source/drain regions 108. In some embodiments, the epitaxial source/drain regions 108 may extend through the LDD regions 84. In some embodiments, the gate spacer layer 98 is used to separate the epitaxial source/drain regions 108 from the dummy gates 72 by an appropriate lateral distance so that the epitaxial source/drain regions 108 do not short out subsequently formed gates of the resulting FinFETs.

The epitaxial source/drain regions 108 are in situ doped during growth to form source/drain regions. The epitaxial source/drain regions 108 have the same doping type as the respective LDD regions 84, and may be doped with the same dopants or different dopants. The epitaxial source/drain regions 108 may have an impurity concentration of between about $10^{19}$ cm$^{-3}$ and about $10^{21}$ cm$^{-3}$. The impurities for source/drain regions may be any of the impurities previously discussed. Because the epitaxial source/drain regions 108 are in situ doped during growth, they are not doped by implantation.

Figure 21A:
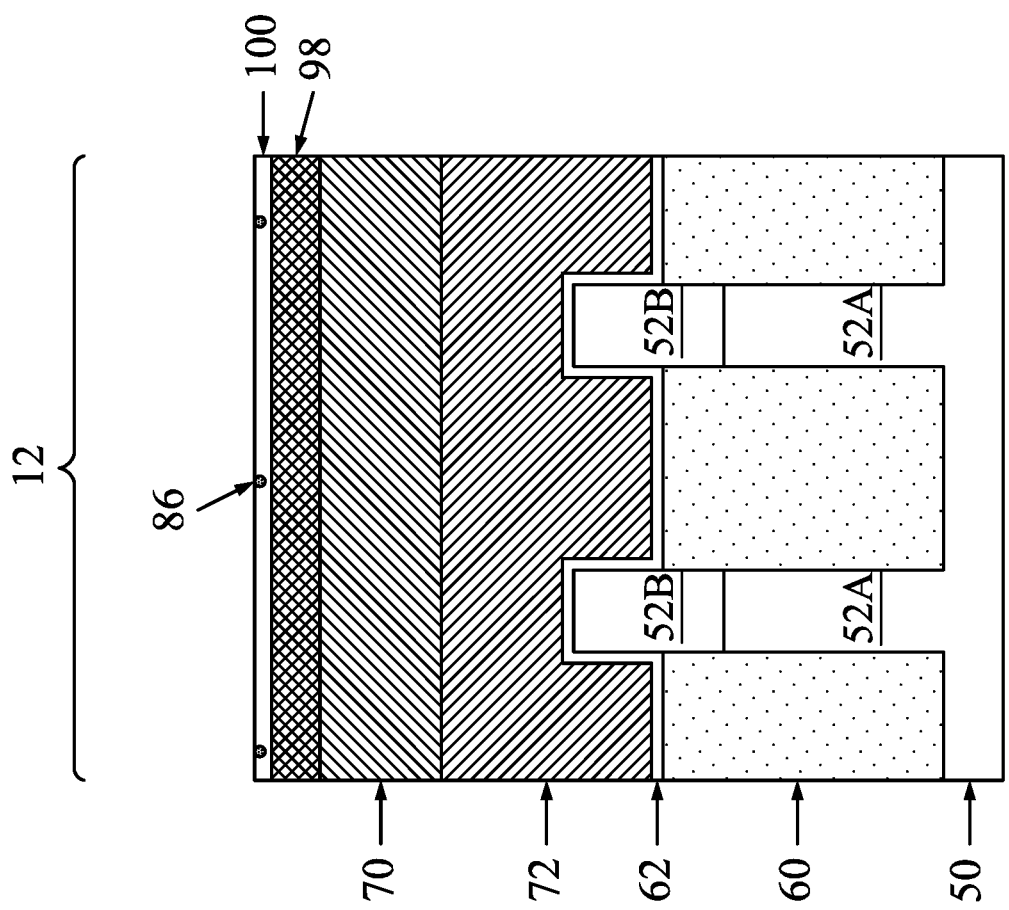
Figure 21C:
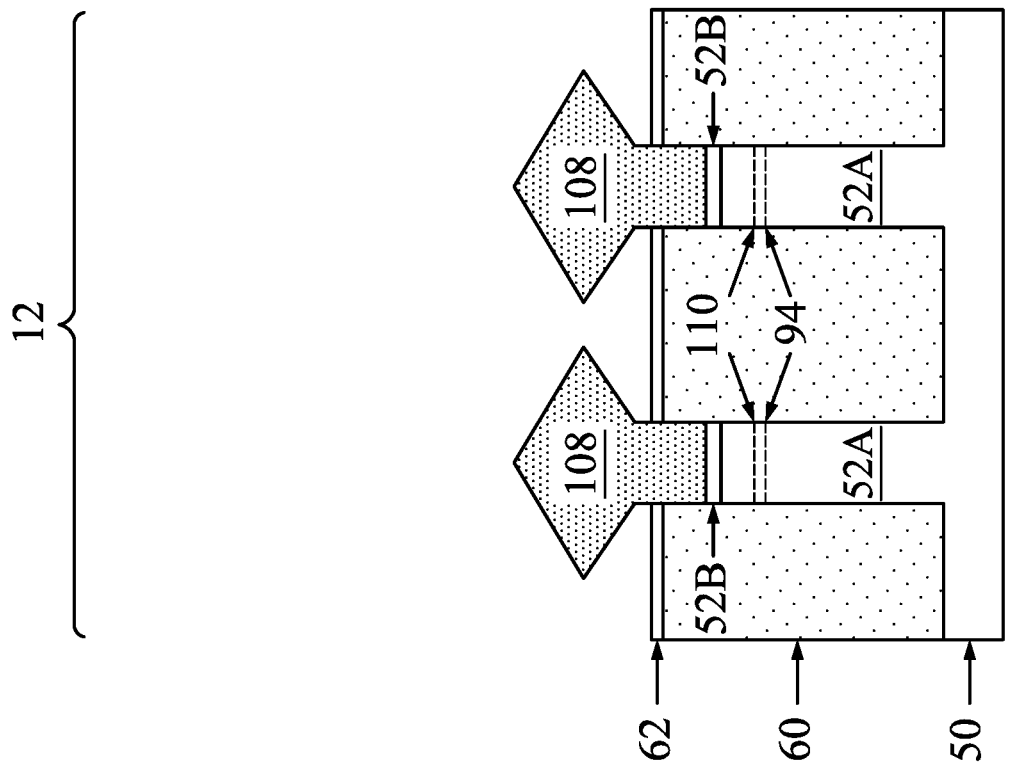
Figure 21B:
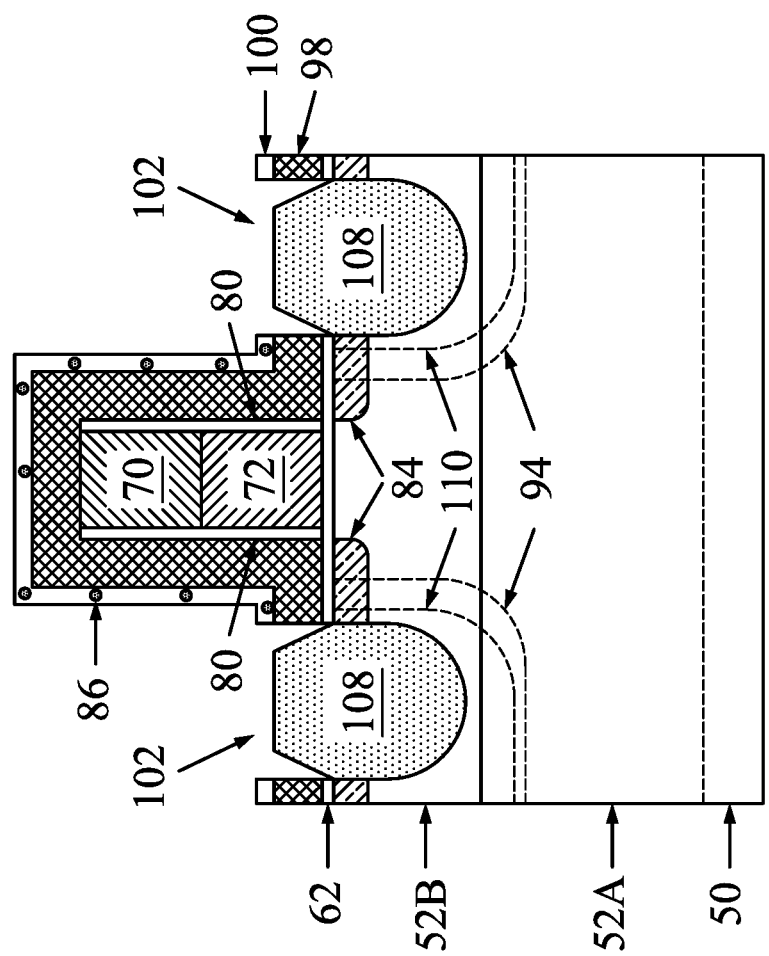
Figure 21D:
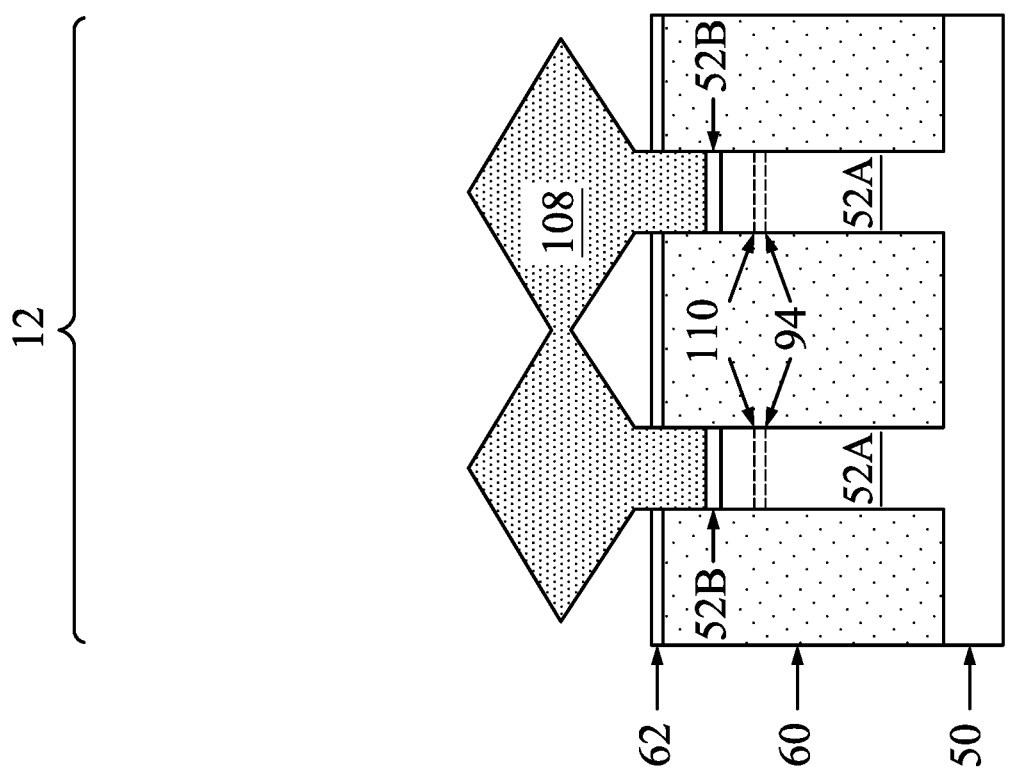

As a result of the epitaxy processes used to form the epitaxial source/drain regions 108, upper surfaces of the epitaxial source/drain regions have facets which expand laterally outward beyond a sidewalls of the fins 52. In some embodiments, adjacent epitaxial source/drain regions 108 remain separated after the epitaxy process is completed, as illustrated by the embodiment of FIG. 21B. In other embodiments, the facets cause adjacent epitaxial source/drain regions 108 of a same finFET to merge, as illustrated by the embodiment of FIG. 21C.

The epitaxial process used to form the epitaxial source/drain regions 108 includes performing one or more heating steps. The heating steps may include heating the fins 52 with an annealing process performed at a temperature of from about 650° C. to about 1200° C., for a time interval of from about 1 second to about 5 seconds. As a result of the heating steps, the dopant particles 86 in the second portions 52B of the fins 52 are activated, thereby forming second doped regions 110 in the fins 52. The second doped regions 110 have a higher dopant concentration than the first doped regions 94 and a lower dopant concentration than the LDD regions 84. Further, the second doped regions 110 have a graded concentration that decreases in a direction extending towards the substrate 50. As such, the second portions 52B of the fins 52 that overlap the first doped regions 94 have a uniform concentration, and the second portions 52B of the fins 52 that overlap the second doped regions 110 have a graded concentration.

Figure 22A:
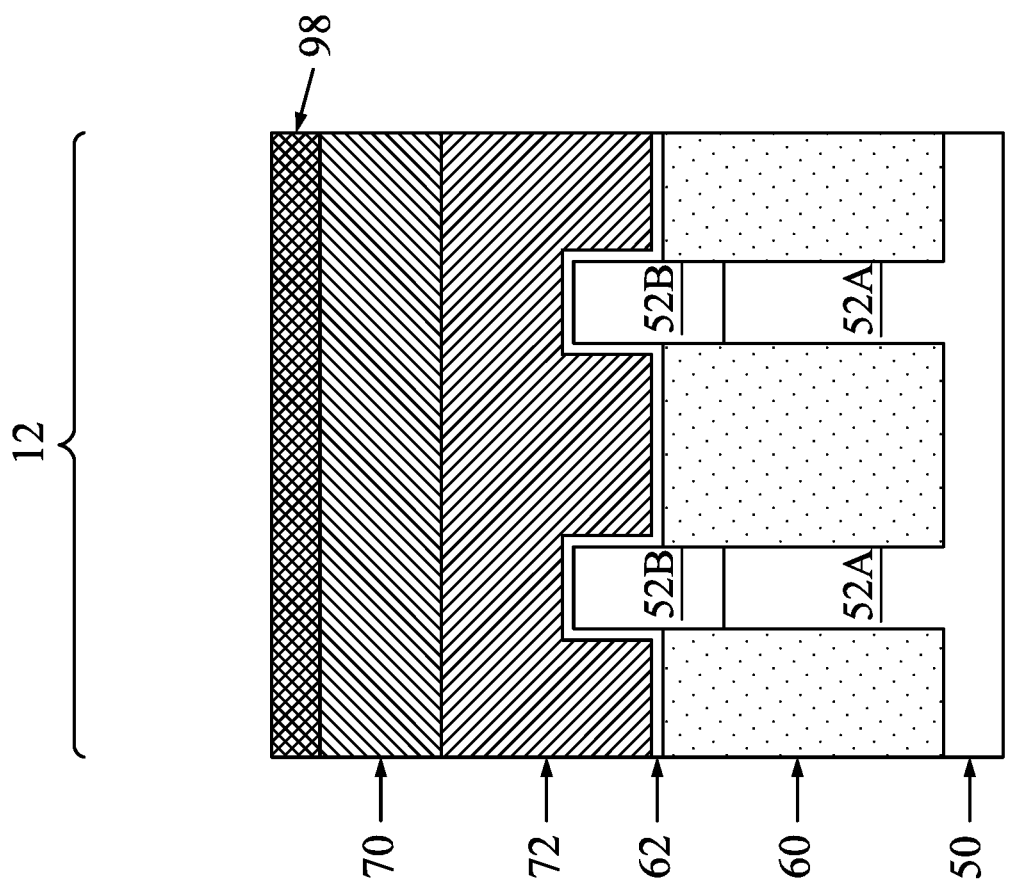
Figure 22C:
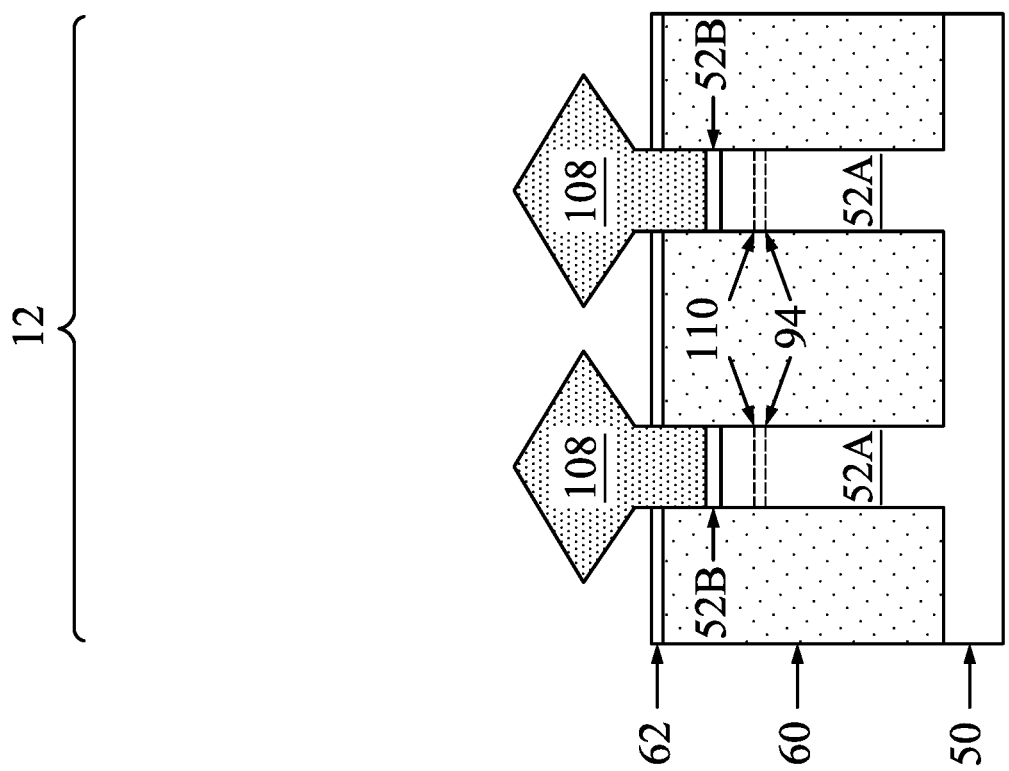
Figure 22B:
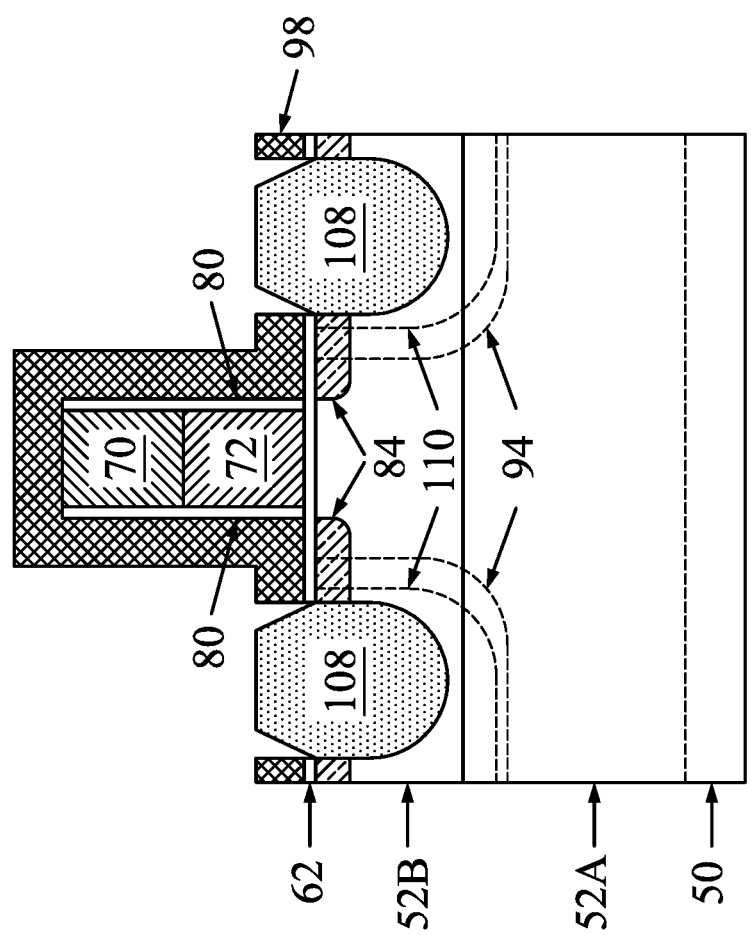

In FIGS. 22A through 22C, the mask layer 100 is removed. The mask layer 100 may be removed by an acceptable etching, such as a wet etch. Once the mask layer 100 is removed, formation of the source/drain regions 108 in the p-type region (e.g., the region 12) is completed. The steps described above may then be repeated to form the source/drain regions 108 in the n-type region (e.g., the region 10). The steps may be varied where appropriate. For example, the dopants used in the n-type region may be n-type dopants, such as arsenic.

Figure 23A:
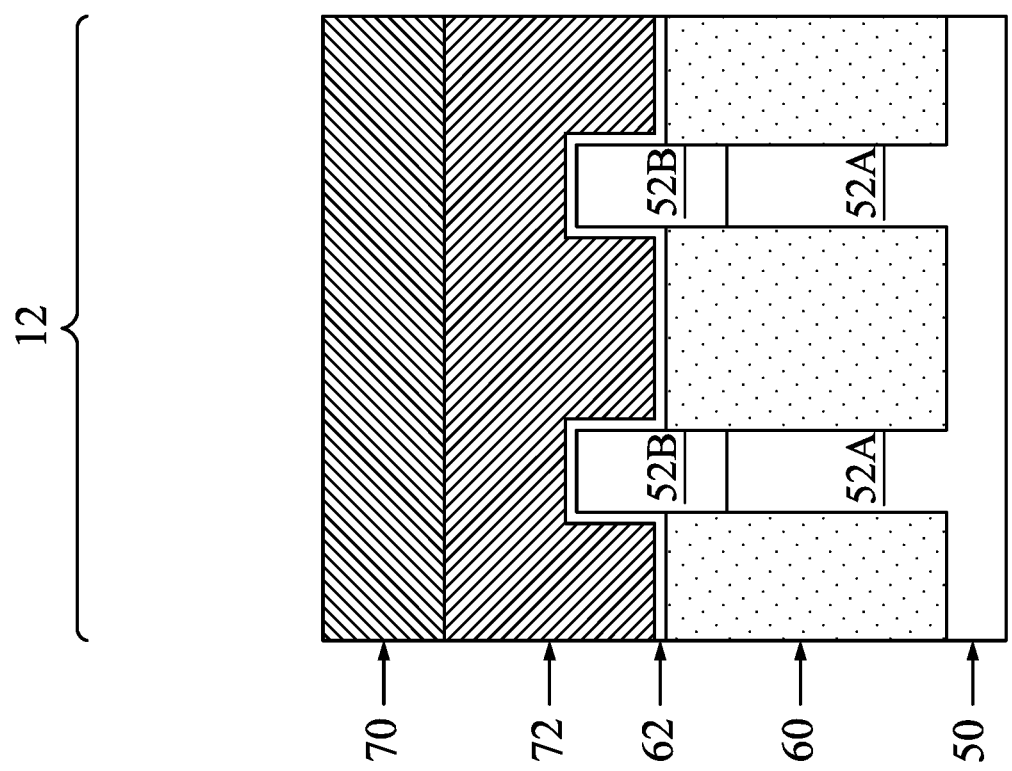

In FIG. 23A through 23C, gate spacers 120 are formed on the gate seal spacers 80, along sidewalls of the dummy gates 72, and over the LDD regions 84. The gate spacers 120 are formed by anisotropically etching the gate spacer layer 98. The etch may be selective to the material of the material of the gate spacer layer 98, such that the LDD regions 84 are not etched during the formation of the gate spacers 120.

Figure 24A:
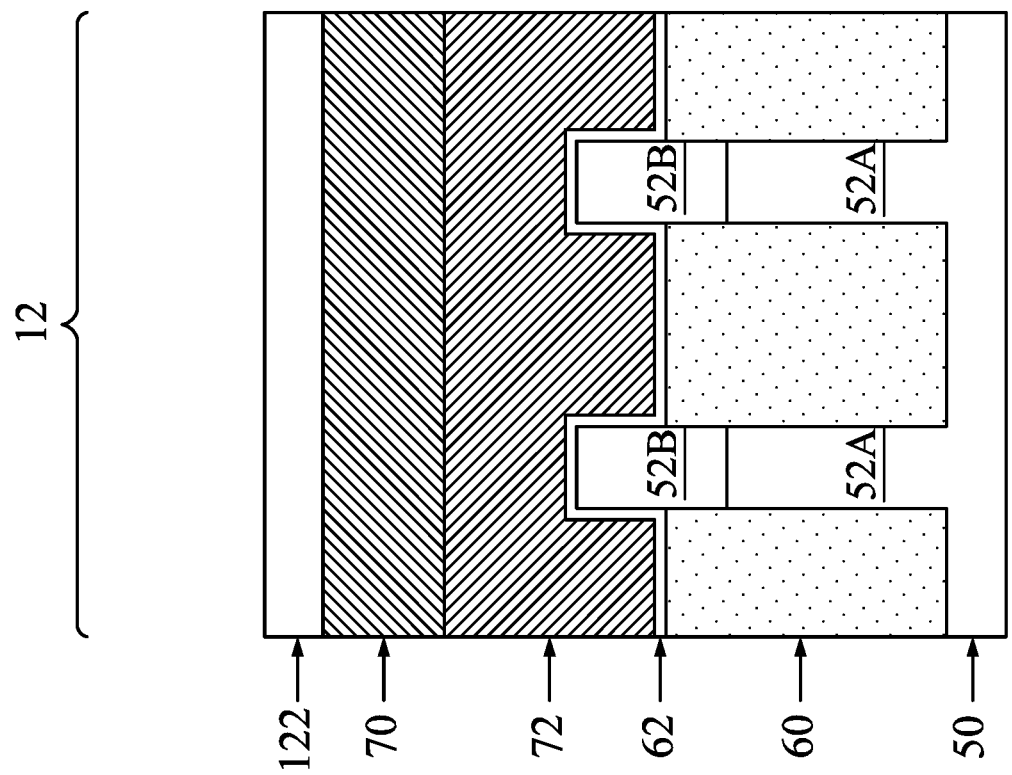
Figure 24C:
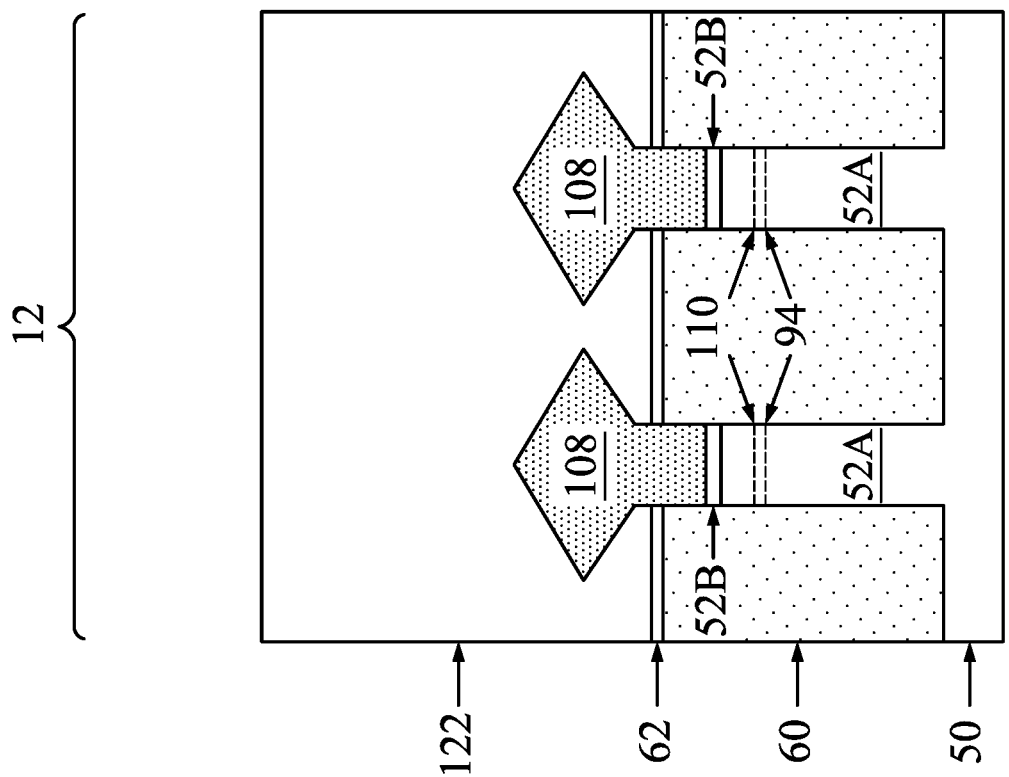
Figure 24B:
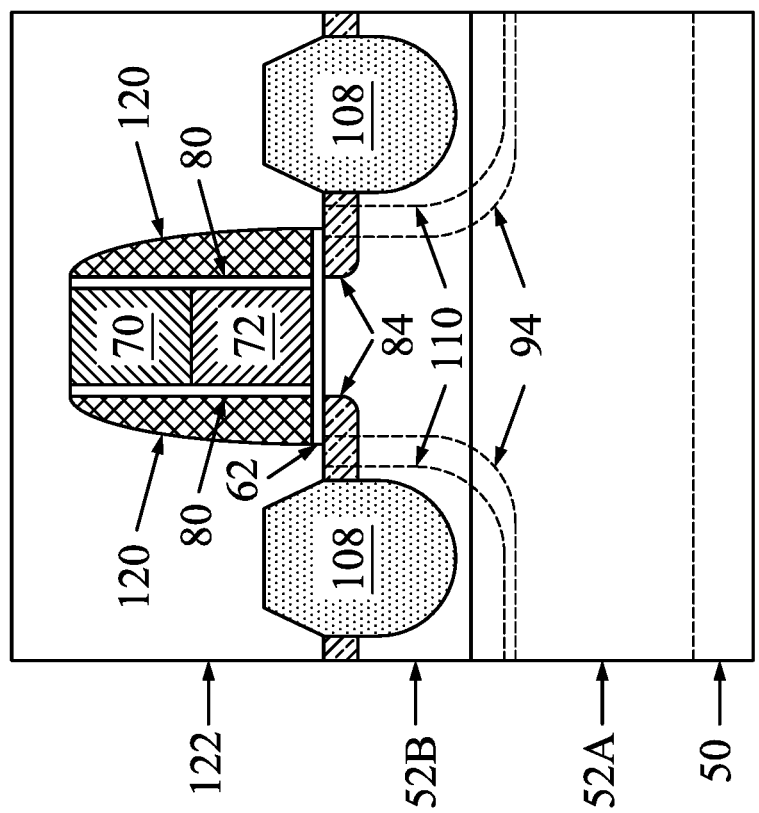

In FIGS. 24A through 24C, an inter-layer dielectric (ILD) 122 is deposited over the fins 52. The ILD 122 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation or semiconductor materials formed by any acceptable process may be used. In some embodiments, a contact etch stop layer (CESL), not illustrated, is disposed between the ILD 122 and the epitaxial source/drain regions 108, the gate spacers 120, the gate seal spacers 80, and the masks 70.

Figure 25A:
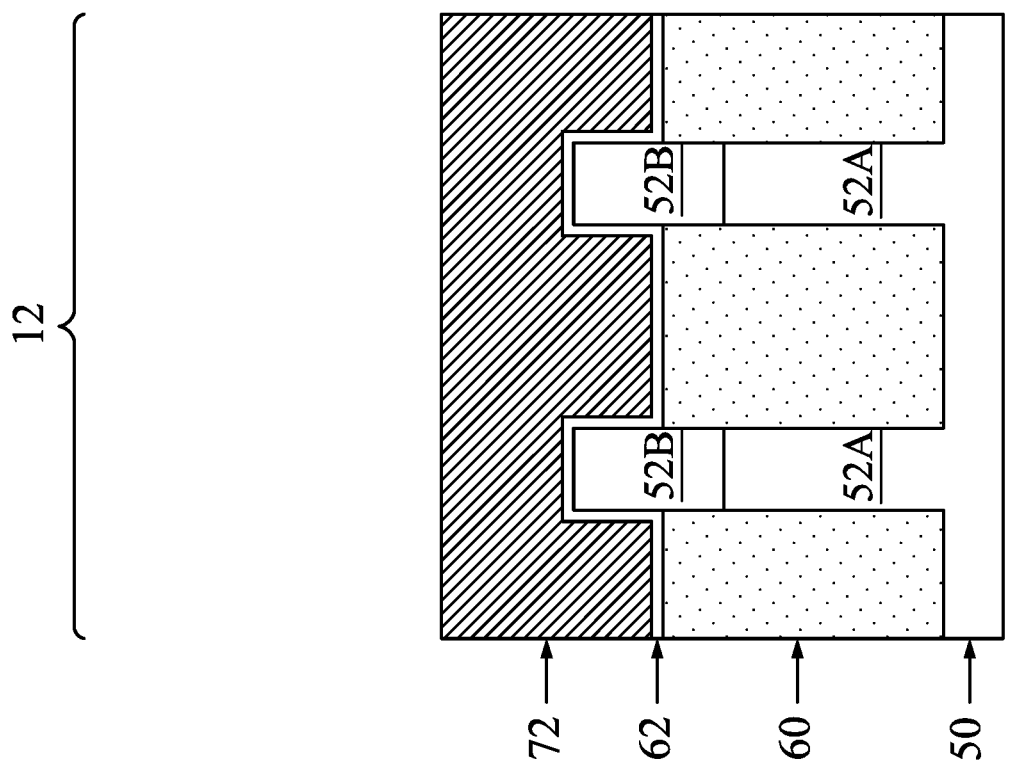
Figure 25C:
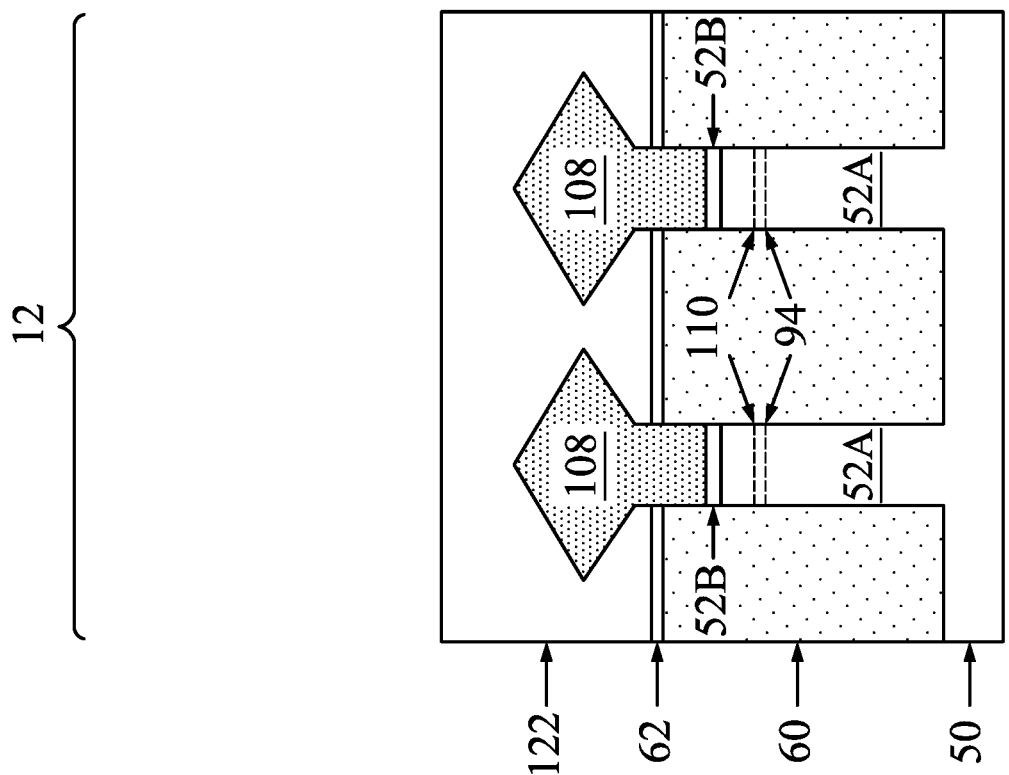
Figure 25B:
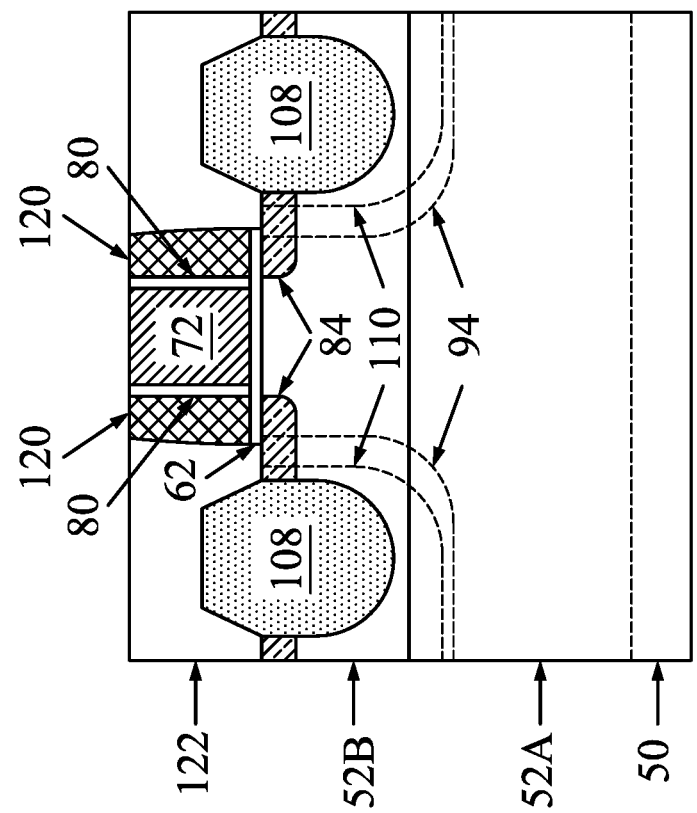

In FIGS. 25A through 25C, a planarization process, such as a CMP, may be performed to level the top surface of the ILD 122 with the top surfaces of the dummy gates 72. The planarization process may also remove the masks 70 on the dummy gates 72, and portions of the gate seal spacers 80 and the gate spacers 120 along sidewalls of the masks 70. After the planarization process, top surfaces of the dummy gates 72, the gate seal spacers 80, the gate spacers 120, and the ILD 122 are level. Accordingly, the top surfaces of the dummy gates 72 are exposed through the ILD 122.

Figure 26A:
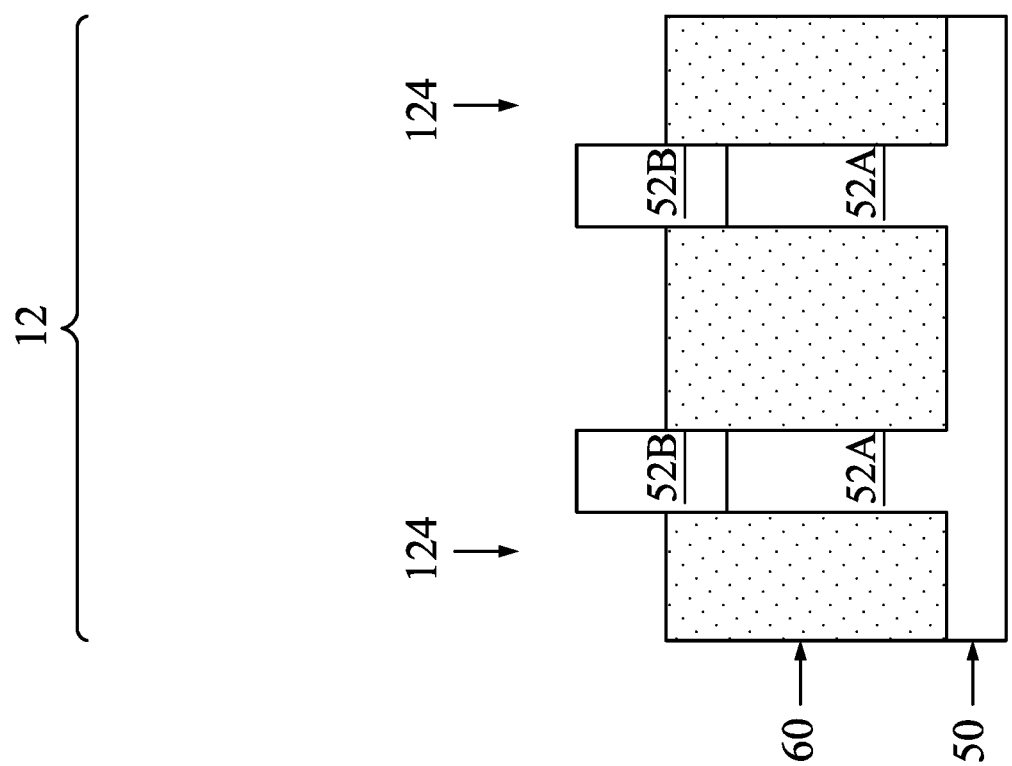
Figure 26C:
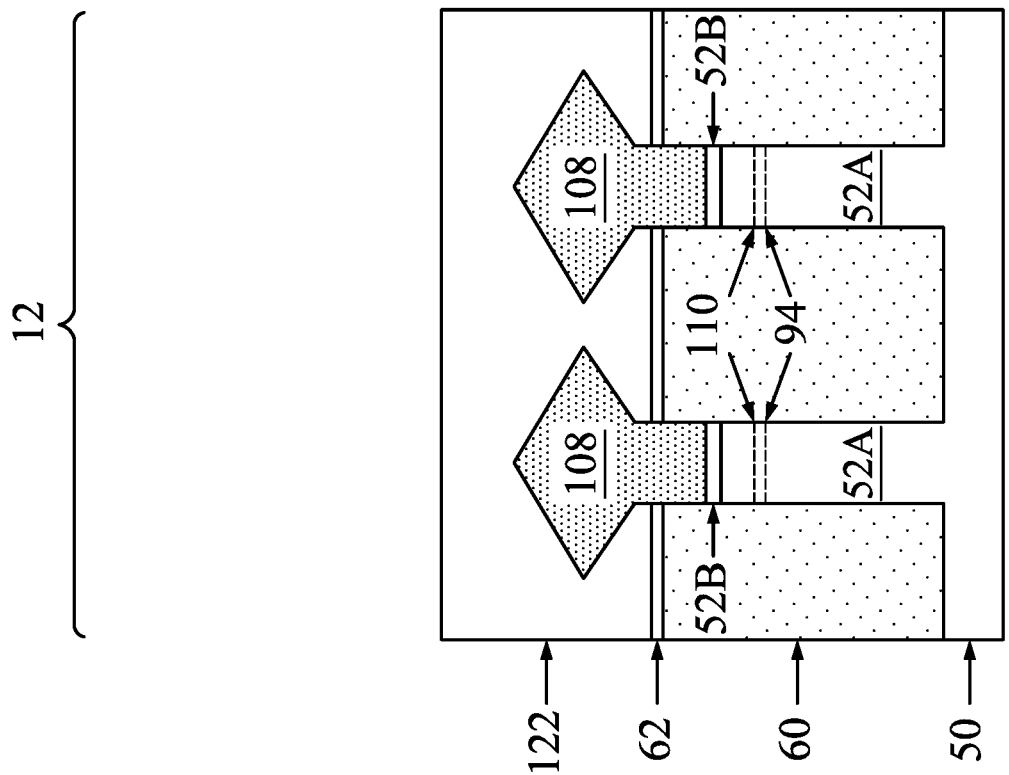
Figure 26B:
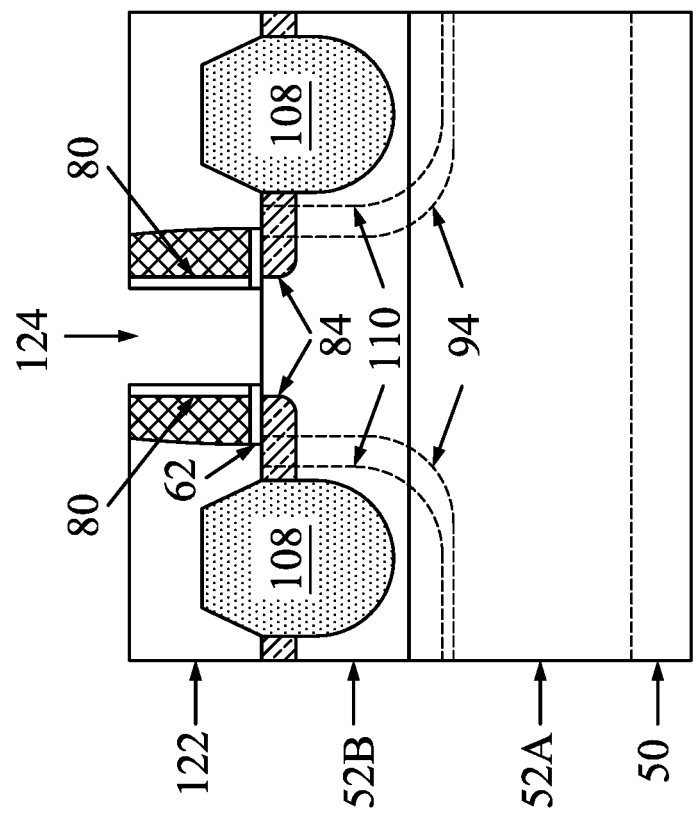

In FIGS. 26A through 26C, the dummy gates 72 and portions of the dummy gate dielectric layers 62 directly underlying the exposed dummy gates 72 are removed in an etching step(s), so that recesses 124 are formed. In some embodiments, the dummy gates 72 are removed by an anisotropic dry etch process. For example, the etching process may include a dry etch process using reaction gas(es) that selectively etch the dummy gates 72 without etching the ILD 122 or the gate spacers 120. Each recess 124 exposes a channel region of a respective fin 52. Each channel region is disposed between neighboring pairs of the epitaxial source/drain regions 108. During the removal, the dummy gate dielectric layers 62 may be used as an etch stop layer when the dummy gates 72 are etched. The dummy gate dielectric layers 62 may then be removed after the removal of the dummy gates 72.

Figure 27C:
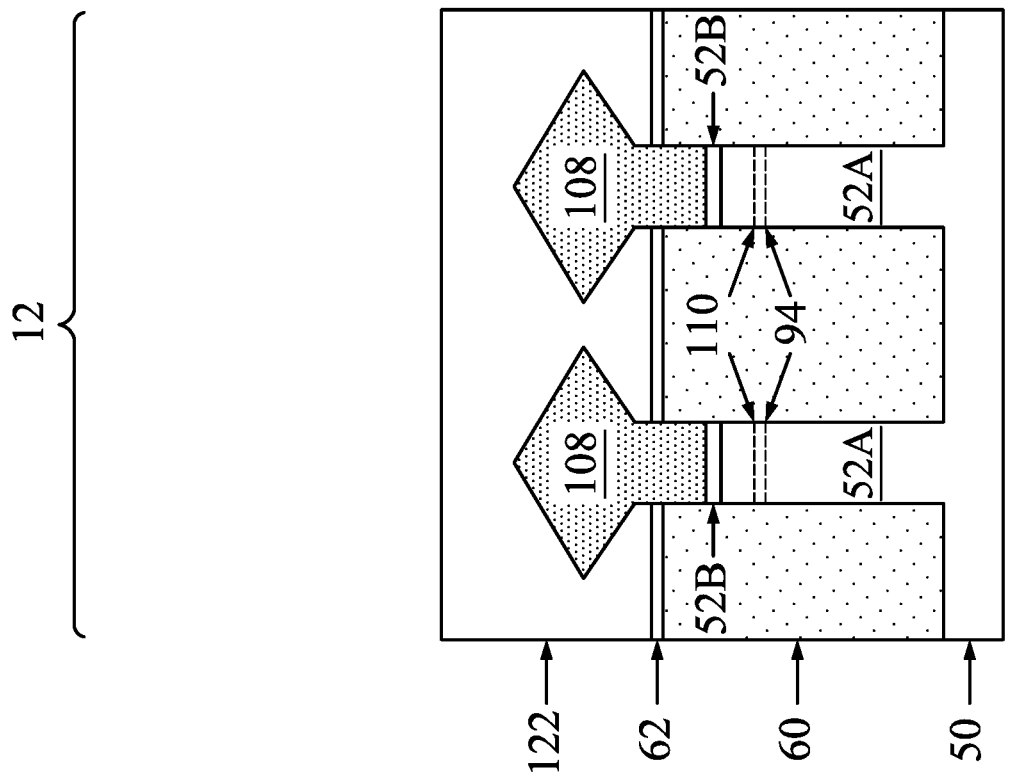
Figure 27B:
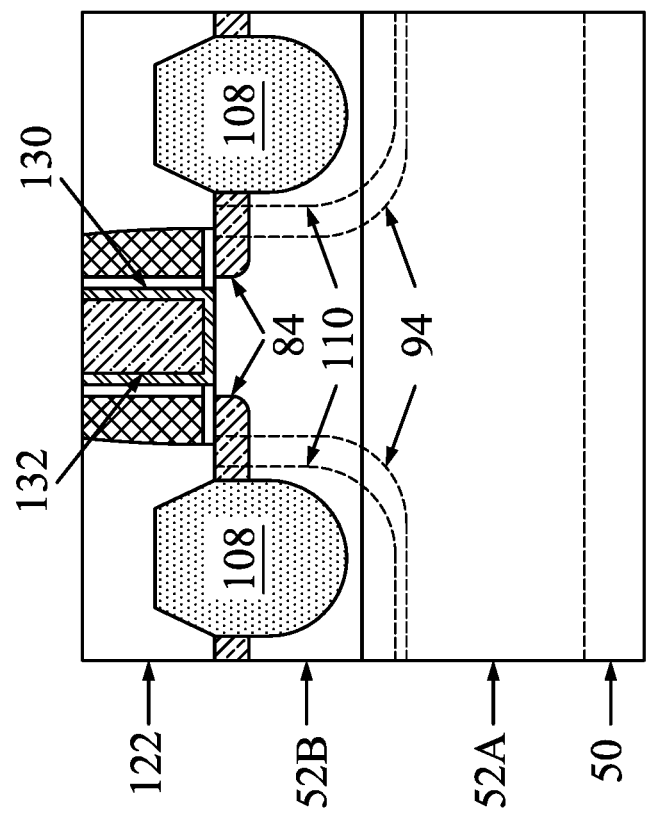

In FIGS. 27A through 27C, gate dielectric layers 130 and gate electrodes 132 are formed for replacement gates. The gate dielectric layers 130 are deposited conformally in the recesses 124, such as on the top surfaces and the sidewalls of the fins 52, and on a top surface of the ILD 122. In accordance with some embodiments, gate dielectric layers 130 comprise silicon oxide, silicon nitride, or multilayers thereof. In other embodiments, gate dielectric layers 130 include a high-k dielectric material, and in these embodiments, gate dielectric layers 130 may have a k value greater than about 7.0, and may include a metal oxide or a silicate of Hf, Al, Zr, La, Mg, Ba, Ti, Pb, and combinations thereof. The formation methods of gate dielectric layers 130 may include Molecular-Beam Deposition (MBD), Atomic Layer Deposition (ALD), PECVD, and the like.

Next, gate electrodes 132 are deposited over gate dielectric layers 130, respectively, and fill the remaining portions of the recesses 124. Gate electrodes 132 may be made of a metal-containing material such as TiN, TaN, TaC, Co, Ru, Al, W, combinations thereof, or multi-layers thereof. After the filling of gate electrodes 132, a planarization process, such as a CMP, may be performed to remove the excess portions of gate dielectric layers 130 and the material of gate electrodes 132, which excess portions are over the top surface of ILD 122. The resulting remaining portions of material of gate electrodes 132 and gate dielectric layers 130 thus form replacement gates of the resulting FinFETs, and may be collectively referred to as gate stacks.

Figure 28A:
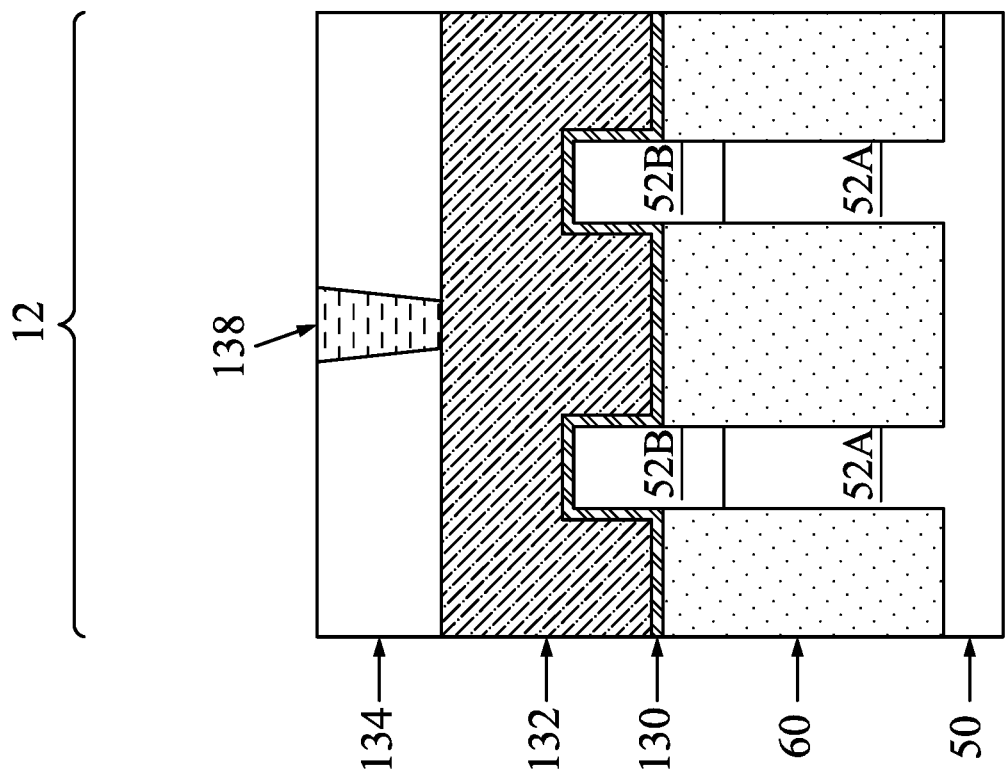
Figure 28C:
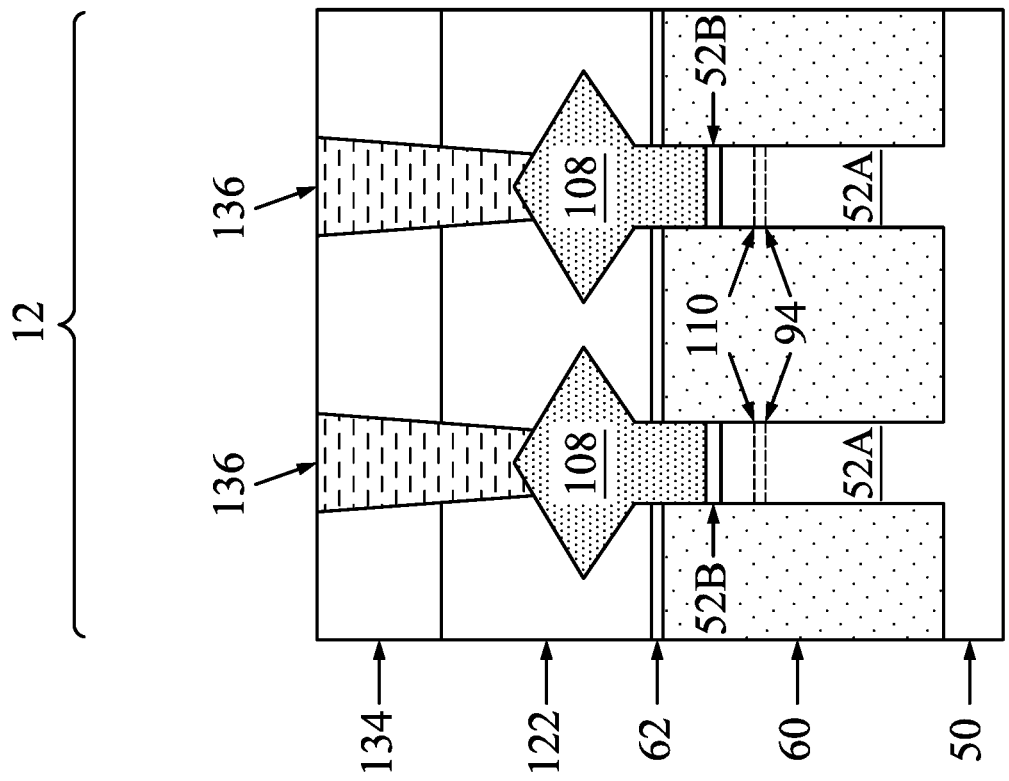
Figure 28B:
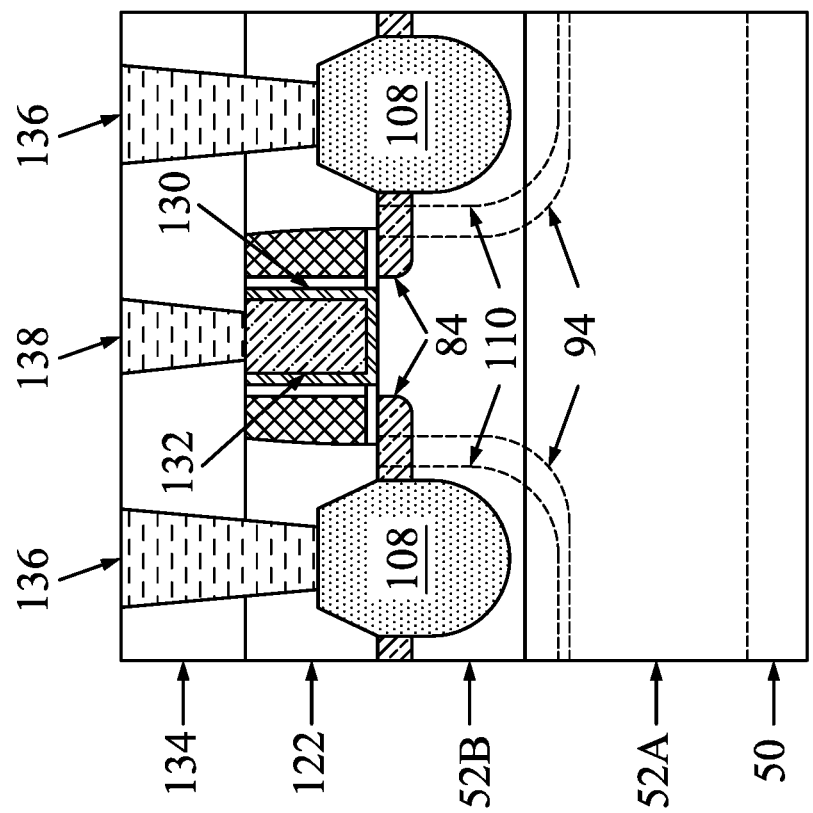

In FIGS. 28A through 28C, an ILD 134 is formed over the gate stacks and ILD 122. In an embodiment, the ILD 134 is a flowable film formed by a flowable CVD method. In some embodiments, the ILD 134 is formed of a dielectric material such as PSG, BSG, BPSG, USG, or the like, and may be deposited by any suitable method, such as CVD and PECVD.

Source/drain contacts 136 and gate contacts 138 are formed through the ILDs 122 and 134. Openings for the source/drain contacts 136 are formed through the ILDs 122 and 134, and openings for the gate contacts 138 are formed through the ILD 134. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 134. The remaining liner and conductive material form the source/drain contacts 136 and gate contacts 138 in the openings. An anneal process may be performed to form a silicide at the interface between the epitaxial source/drain regions 108 and the source/drain contacts 136. The source/drain contacts 136 are physically and electrically coupled to the epitaxial source/drain regions 108, and the gate contacts 138 are physically and electrically coupled to the gate electrodes 132. The source/drain contacts 136 and gate contacts 138 may be formed in different processes, or may be formed in the same process. Although shown as being formed in the same cross-sections, it should be appreciated that each of the source/drain contacts 136 and gate contacts 138 may be formed in different cross-sections, which may avoid shorting of the contacts.

Figure 29:
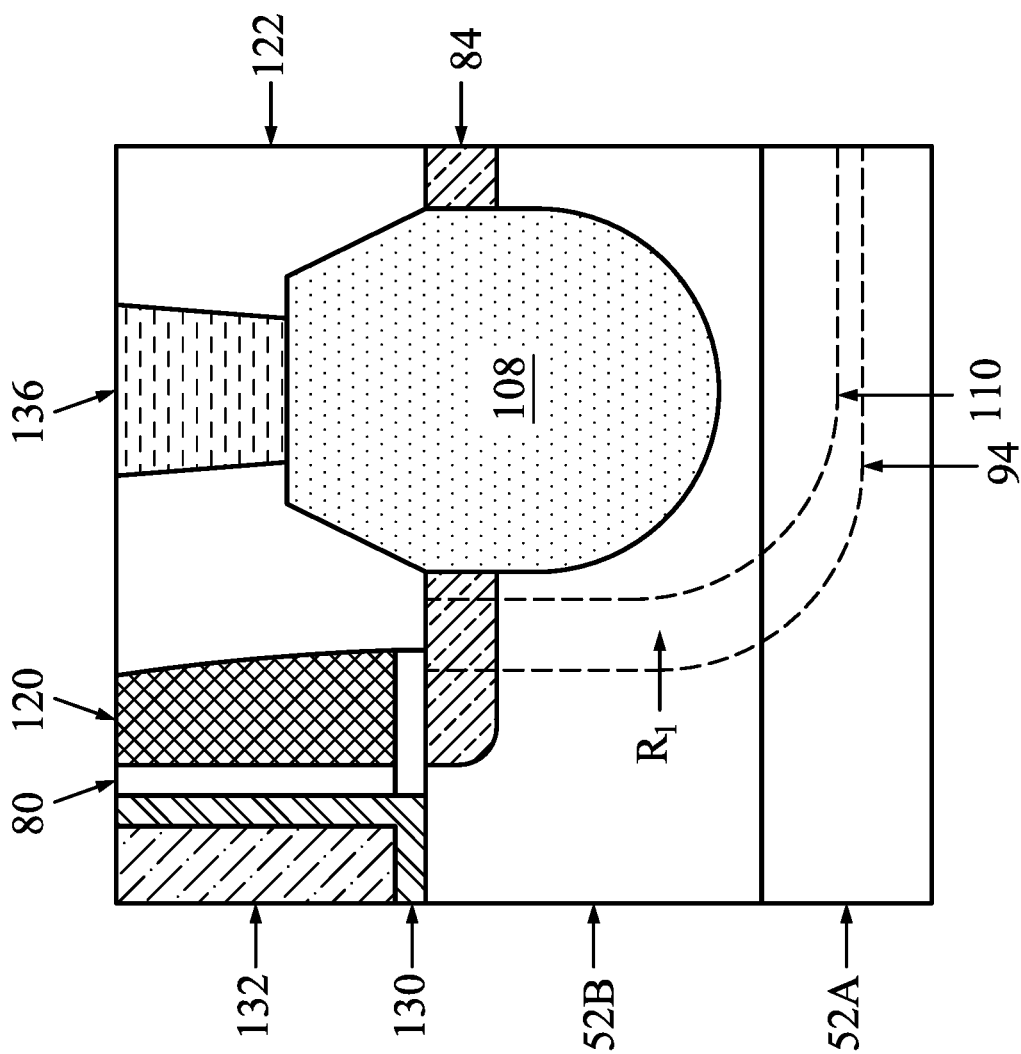
FIG. 29 is a detailed view of a FinFET, in accordance with some embodiments.

FIG. 29 is a detailed view of the first and second doped regions 94 and 110. Due to the processes used for formation, portions of the first doped region 94 outside of the second doped region 110 (labeled $R_1$) have a uniform distribution of the dopants. Such regions may be located at least partially under the gate spacers 120. Forming a uniform distribution of the dopants in this region may reduce the junction leakage of the resulting FinFETs by up to fourfold. Further, the second doped region 110 has graded distribution of the dopants. Forming a graded distribution of the dopants in this region may reduce the power consumption of the resulting FinFETs.

In an embodiment, a method includes: forming a fin on a substrate, fin having a Si portion proximate the substrate and a SiGe portion distal the substrate; forming a gate stack over the fin; depositing a gate spacer layer over the fin and the gate stack; depositing a mask layer over the gate spacer layer; etching a recess extending through the mask layer, through the gate spacer layer, and into the SiGe portion of the fin; implanting a dopant into the mask layer and the SiGe portion of the fin exposed by the recess; and performing a first epitaxy process to simultaneously grow a source/drain region in the recess and drive the dopant into the SiGe portion and the Si portion of the fin.

In some embodiments of the method, implanting the dopant includes: forming a first layer of the dopant on the mask layer and in the recess during a first pulse of a first plasma doping process; and implanting the dopant in the mask layer the SiGe portion of the fin during a second pulse of the first plasma doping process. In some embodiments, the method further includes: after the first plasma doping process, removing the first layer of the dopant in a wet etch process. In some embodiments of the method, the wet etch process is performed using a Sulfuric Peroxide Mixture (SPM) solution for a time interval of from about 30 seconds to about 120 seconds at a temperature of from about 90° C. to about 180° C. In some embodiments, the method further includes: removing the mask layer; and patterning the gate spacer layer to form gate spacers adjacent the gate stack. In some embodiments, the method further includes: forming a lightly doped source/drain (LDD) region adjacent the gate stack in the SiGe portion of the fin; after forming the LDD region, implanting the dopant into the gate spacer layer; and performing an anneal process to drive the dopant from the gate spacer layer into the SiGe portion and the Si portion of the fin. In some embodiments of the method, after the first epitaxy process, a first region of the SiGe portion of the fin has a graded concentration of the dopant increasing in a direction extending from a top of the fin to a bottom of the fin, the first region being disposed between the substrate and the source/drain region.

In an embodiment, a method includes: forming a fin on a substrate, fin including a first semiconductor material; recessing a first portion of the fin to form a first recess, a second portion of the fin remaining on the substrate; epitaxially growing a second semiconductor material in the first recess to reform the first portion of the fin; forming a gate stack over the fin; depositing a gate spacer layer over the fin and the gate stack; forming a lightly doped source/drain (LDD) region adjacent the gate stack in the first portion of the fin; after forming the LDD region, implanting a dopant into the gate spacer layer; performing an anneal process to drive the dopant from the gate spacer layer into the first portion and the second portion of the fin; patterning the gate spacer layer to form gate spacers adjacent the gate stack; and epitaxially growing a source/drain region in the first portion of the fin.

In some embodiments of the method, implanting the dopant into the gate spacer layer includes: forming a first layer of the dopant on the gate spacer layer during a first pulse of a first plasma doping process; and implanting the dopant in the gate spacer layer during a second pulse of the first plasma doping process. In some embodiments, the method further includes: after the first plasma doping process, removing the first layer of the dopant in a wet etch process. In some embodiments of the method, the wet etch process is performed using a Sulfuric Peroxide Mixture (SPM) solution. In some embodiments of the method, the wet etch process is performed for a time interval of from about 30 seconds to about 120 seconds at a temperature of from about 90° C. to about 180° C. In some embodiments of the method, epitaxially growing the source/drain region includes: etching a second recess extending through the gate spacer layer and into the first portion of the fin; implanting the dopant into the first portion of the fin exposed by the second recess; and epitaxially growing SiGeB in the second recess. In some embodiments of the method, implanting the dopant into the first portion of the fin exposed by the second recess includes: forming a second layer of the dopant in the second recess during a first pulse of a second plasma doping process; and implanting the dopant in the first portion of the fin during a second pulse of the second plasma doping process. In some embodiments, the method further includes: after the second plasma doping process, removing the second layer of the dopant in a wet etch process using a Sulfuric Peroxide Mixture (SPM) solution. In some embodiments of the method, after the anneal process, a first region of the first portion of the fin has a uniform concentration of the dopant, the first region being disposed between the gate stack and the source/drain region.

In an embodiment, a device includes: a fin on a substrate, fin having a Si portion proximate the substrate and a SiGe portion distal the substrate; a gate stack over a channel region of the fin; a source/drain region adjacent the gate stack; a first doped region in the SiGe portion of the fin, the first doped region disposed between the channel region and the source/drain region, the first doped region having a uniform concentration of a dopant; and a second doped region in the SiGe portion of the fin, the second doped region disposed under the source/drain region, the second doped region having a graded concentration of the dopant increasing in a direction extending from a top of the fin to a bottom of the fin.

In some embodiments, the device further includes: a lightly doped source/drain (LDD) region adjacent the gate stack in the SiGe portion of the fin, the LDD region being different from the first doped region; and a gate spacer over the LDD region, the gate spacer disposed partially over the first doped region. In some embodiments of the device, the first doped region and the second doped region are further disposed in the Si portion of the fin. In some embodiments of the device, the first doped region and the second doped region are substantially confined to the SiGe portion of the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a fin on a substrate, the fin having a Si portion proximate the substrate and a SiGe portion distal the substrate;
    forming a gate stack over the fin;
    depositing a gate spacer layer over the fin and the gate stack;
    depositing a mask layer over the gate spacer layer;
    etching a recess extending through the mask layer, through the gate spacer layer, and into the SiGe portion of the fin;
    implanting a dopant into the mask layer and the SiGe portion of the fin exposed by the recess, wherein implanting the dopant comprises:
        forming a first layer of the dopant on the mask layer and in the recess during a first pulse of a first plasma doping process; and
        implanting the dopant in the mask layer and the SiGe portion of the fin during a second pulse of the first plasma doping process; and
    performing a first epitaxy process to simultaneously grow a source/drain region in the recess and drive the dopant into the SiGe portion and the Si portion of the fin.

2. The method of claim 1, further comprising:
    after the first plasma doping process, removing the first layer of the dopant in a wet etch process.

3. The method of claim 2, wherein the wet etch process is performed using a Sulfuric Peroxide Mixture (SPM) solution for a time interval of from about 30 seconds to about 120 seconds at a temperature of from about 90° C. to about 180° C.

4. The method of claim 1, further comprising:
    removing the mask layer; and
    patterning the gate spacer layer to form gate spacers adjacent the gate stack.

5. The method of claim 1, further comprising:
    forming a lightly doped source/drain (LDD) region adjacent the gate stack in the SiGe portion of the fin;
    after forming the LDD region, implanting the dopant into the gate spacer layer; and
    performing an anneal process to drive the dopant from the gate spacer layer into the SiGe portion and the Si portion of the fin.

6. The method of claim 1, wherein after the first epitaxy process, a first region of the SiGe portion of the fin has a graded concentration of the dopant decreasing in a direction extending from a top of the fin to a bottom of the fin, the first region being disposed between the substrate and the source/drain region.

7. A method comprising:
    forming a fin on a substrate, the fin comprising a first semiconductor material;
    recessing a first portion of the fin to form a first recess, a second portion of the fin remaining on the substrate;
    epitaxially growing a second semiconductor material in the first recess to reform the first portion of the fin;
    forming a gate stack over the fin;
    depositing a gate spacer layer over the fin and the gate stack;
    forming a lightly doped source/drain (LDD) region adjacent the gate stack in the first portion of the fin;
    after forming the LDD region, implanting a dopant into the gate spacer layer;
    performing an anneal process to drive the dopant from the gate spacer layer into the first portion and the second portion of the fin;
    patterning the gate spacer layer to form gate spacers adjacent the gate stack; and
    epitaxially growing a source/drain region in the first portion of the fin.

8. The method of claim 7, wherein implanting the dopant into the gate spacer layer comprises:
    forming a first layer of the dopant on the gate spacer layer during a first pulse of a first plasma doping process; and
    implanting the dopant in the gate spacer layer during a second pulse of the first plasma doping process.

9. The method of claim 8, further comprising:
    after the first plasma doping process, removing the first layer of the dopant in a wet etch process.

10. The method of claim 9, wherein the wet etch process is performed using a Sulfuric Peroxide Mixture (SPM) solution.

11. The method of claim 10, wherein the wet etch process is performed for a time interval of from about 30 seconds to about 120 seconds at a temperature of from about 90° C. to about 180° C.

12. The method of claim 7, where epitaxially growing the source/drain region comprises:
  etching a second recess extending through the gate spacer layer and into the first portion of the fin;
  implanting the dopant into the first portion of the fin exposed by the second recess; and
  epitaxially growing SiGeB in the second recess.

13. The method of claim 12, wherein implanting the dopant into the first portion of the fin exposed by the second recess comprises:
  forming a second layer of the dopant in the second recess during a first pulse of a second plasma doping process; and
  implanting the dopant in the first portion of the fin during a second pulse of the second plasma doping process.

14. The method of claim 13, further comprising:
  after the second plasma doping process, removing the second layer of the dopant in a wet etch process using a Sulfuric Peroxide Mixture (SPM) solution.

15. The method of claim 7, wherein after the anneal process, a first region of the first portion of the fin has a uniform concentration of the dopant, the first region being disposed between the gate stack and the source/drain region.

16. A method comprising:
  forming a semiconductor fin extending from a semiconductor substrate;
  forming a gate stack over a channel region of the semiconductor fin;
  forming a lightly doped source/drain (LDD) region in the semiconductor fin adjacent the channel region, the LDD region being doped with a first dopant;
  depositing a gate spacer layer over the LDD region and around the gate stack;
  doping the gate spacer layer with the first dopant;
  annealing the gate spacer layer, the first dopant being driven from the gate spacer layer into a first region of the semiconductor fin during the annealing, the first region having a uniform concentration of the first dopant;
  etching a recess extending through the gate spacer layer and into the semiconductor fin;
  doping sidewalls of the recess with the first dopant; and
  growing an epitaxial source/drain region in the recess, the first dopant being driven from the sidewalls of the recess into a second region of the semiconductor fin during the growing, the second region having a graded concentration of the first dopant,
  wherein the first region is horizontally disposed between the channel region and the second region, and wherein the first region is vertically disposed between the LDD region and the semiconductor substrate.

17. The method of claim 16, wherein the graded concentration of the first dopant in the second region decreases in a direction extending from the LDD region towards the semiconductor substrate.

18. The method of claim 16 further comprising:
  after annealing the gate spacer layer and after growing the epitaxial source/drain region, patterning the gate spacer layer to form a gate spacer between the gate stack and the epitaxial source/drain region.

19. The method of claim 16, wherein doping the gate spacer layer with the first dopant comprises:
  performing a plasma doping process comprising implanting the first dopant in the gate spacer layer and depositing a layer of the first dopant on the gate spacer layer in alternating repeating steps, the plasma doping process being performed with a plasma generator, wherein the implanting the first dopant in the gate spacer layer comprises generating a bias voltage for the plasma generator during the implanting.

20. The method of claim 12, wherein after the anneal process, a first region of the first portion of the fin has a uniform concentration of the dopant, the first region being disposed between the gate stack and the source/drain region, and wherein after epitaxially growing SiGeB, a second region of the first portion of the fin has a graded concentration of the dopant decreasing in a direction extending from a top of the fin to a bottom of the fin, the second region being disposed between the source/drain region and the first region.

* * * * *